(12) United States Patent
Kadota et al.

(10) Patent No.: US 7,956,511 B2
(45) Date of Patent: Jun. 7, 2011

(54) SURFACE ACOUSTIC WAVE DEVICE INCLUDING AN IDT FORMED BY A METAL FILLED IN GROOVES ON A PIEZOELECTRIC SUBSTRATE

(75) Inventors: Michio Kadota, Kyoto (JP); Tetsuya Kimura, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/825,517

(22) Filed: Jun. 29, 2010

(65) Prior Publication Data
US 2010/0259128 A1   Oct. 14, 2010

Related U.S. Application Data

(63) Continuation of application No. PCT/JP2008/003884, filed on Dec. 22, 2008.

(30) Foreign Application Priority Data

Jan. 17, 2008   (JP) .................. 2008-008350
Aug. 12, 2008   (JP) .................. 2008-207765
Oct. 30, 2008   (JP) .................. 2008-279939

(51) Int. Cl.
*H01L 41/04*   (2006.01)
*H03H 9/25*   (2006.01)

(52) U.S. Cl. .................. 310/313 B

(58) Field of Classification Search ............... 310/313 R, 310/313 A, 313
See application file for complete search history.

(56) References Cited

U.S. PATENT DOCUMENTS

| | | | |
|---|---|---|---|
| 4,978,879 A | 12/1990 | Satoh et al. | |
| 7,310,027 B2 * | 12/2007 | Kando | 333/133 |
| 7,323,803 B2 * | 1/2008 | Kando | 310/313 A |
| 7,327,071 B2 * | 2/2008 | Nishiyama et al. | 310/313 A |
| 7,339,304 B2 * | 3/2008 | Kadota et al. | 310/313 A |
| 7,345,400 B2 * | 3/2008 | Nakao et al. | 310/313 A |
| 7,355,319 B2 * | 4/2008 | Kando | 310/313 A |
| 7,425,788 B2 * | 9/2008 | Kadota et al. | 310/313 B |
| 7,471,027 B2 * | 12/2008 | Kando | 310/313 A |
| 7,489,065 B2 * | 2/2009 | Kando | 310/313 R |
| 2007/0120439 A1 | 5/2007 | Kadota et al. | |

(Continued)

FOREIGN PATENT DOCUMENTS

EP   1 391 988 A2   2/2004

(Continued)

OTHER PUBLICATIONS

Official Communication issued in International Patent Application No. PCT/JP2008/003884, mailed on Feb. 10, 2009.

(Continued)

*Primary Examiner* — J. SanMartin
(74) *Attorney, Agent, or Firm* — Keating & Bennett, LLP

(57) ABSTRACT

A surface acoustic wave device includes a $LiNbO_3$ substrate and is constructed such that a reflection coefficient of an IDT is not only high but the electromechanical coupling coefficient $K^2$ is also high, and the range of Euler angles of the $LiNbO_3$ substrate which obtains a wide range of the electromechanical coupling coefficient $K^2$ is increased. A plurality of grooves are provided in the upper surface of the $LiNbO_3$ substrate, and an IDT including a plurality of electrode fingers is provided and defined by a metal material filled in the plurality of grooves, and the metal material is made of Ag, Ni, or Cr or an alloy primarily including at least one Ag, Ni, or Cr.

3 Claims, 31 Drawing Sheets

U.S. PATENT DOCUMENTS

| | | |
|---|---|---|
| 2008/0160178 A1* | 7/2008 | Nishiyama et al. ............ 427/100 |
| 2009/0085429 A1* | 4/2009 | Nishiyama et al. ....... 310/313 A |
| 2009/0189483 A1* | 7/2009 | Kadota et al. ............. 310/313 B |
| 2010/0072856 A1* | 3/2010 | Kadota et al. ............. 310/313 B |

FOREIGN PATENT DOCUMENTS

| | | |
|---|---|---|
| JP | 2-37815 A | 2/1990 |
| JP | 9-83030 A | 3/1997 |
| JP | 52-48375 U | 4/1997 |
| JP | 2004-112748 A | 4/2004 |
| WO | 2006/011417 A1 | 2/2006 |

OTHER PUBLICATIONS

Kadota et al.; "Surface Acoustic Wave Device"; U.S. Appl. No. 12/825,520, filed Jun. 29, 2010.

* cited by examiner

θ (°) OF EULER ANGLES (0, θ, 0)

θ (°) OF EULER ANGLES (0, θ, 0)

SURFACE ACOUSTIC WAVE DEVICE INCLUDING AN IDT FORMED BY A METAL FILLED IN GROOVES ON A PIEZOELECTRIC SUBSTRATE

BACKGROUND OF THE INVENTION

1. Field of the Invention

The present invention relates to a surface acoustic wave device which is used, for example, as a resonator or a band pass filter, and more particularly, to a surface acoustic wave device including an IDT that is defined by a metal filled in grooves on a piezoelectric substrate.

2. Description of the Related Art

Heretofore, as a resonator and/or a band pass filter, a surface acoustic wave device has been widely used. For example, in WO2006/011417A1, a surface acoustic wave device 1001 having a cross-sectional structure schematically shown in FIG. 36 is disclosed.

In the surface acoustic wave device 1001, a plurality of grooves 1002b are provided in an upper surface 1002a of a LiTaO$_3$ substrate 1002. A metal is filled in the plurality of grooves 1002b, and thereby an IDT 1003 including a plurality of electrode fingers made of the metal is formed. A SiO$_2$ film 1004 is laminated so as to cover the upper surface 1002a of the LiTaO$_3$ substrate 1002. Since the LiTaO$_3$ substrate 1002 has a negative temperature coefficient of frequency TCF, the SiO$_2$ film 1004 having a positive temperature coefficient of frequency TCF is laminated, so that the absolute value of the temperature coefficient of frequency TCF of the surface acoustic wave device 1001 can be decreased.

In addition, it is believed that since the IDT is defined by the metal filled in the plurality of grooves 1002b, a high reflection coefficient is obtained in the IDT. In particular, when the wavelength of a surface acoustic wave is represented by $\lambda$, and the thickness of Al filled in the grooves 1002b, that is, the thickness of the IDT made of Al, is set to 0.04$\lambda$, the reflection coefficient per one electrode finger is 0.05, and it has been shown that as the thickness of the electrode is increased, the reflection coefficient can be increased.

In addition, in Japanese Unexamined Patent Application Publication No. 2004-112748, a surface acoustic wave device shown in FIG. 37 is disclosed. In a surface acoustic wave device 1101, an IDT 1103 is provided on a piezoelectric substrate 1102 made of LiTaO$_3$ or LiNbO$_3$. In addition, a protective film 1104 is arranged so as to cover the IDT 1103. On the other hand, in a region other than that in which the IDT 1103 and the protective film 1104 are provided, a first insulating layer 1105 made of SiO$_2$ is provided which has a thickness equal to that of a laminated metal film made of the IDT 1103 and the protective film 1104 laminated to each other. In addition, a second insulating layer 1106 made of SiO$_2$ is laminated so as to cover the first insulating layer 1105. In this case, it has been shown that since a metal having a density greater than that of Al is used for the IDT 1103, the absolute value of the reflection coefficient can be increased, and undesirable ripples can be prevented.

In the surface acoustic wave device 1001 disclosed in WO2006/011417A1, it has been shown that as the thickness of the IDT made of Al is increased, the absolute value of the reflection coefficient can be increased. However, the inventors of the present invention discovered that when the absolute value of the reflection coefficient is simply increased, superior resonant characteristics cannot be obtained. That is, in the surface acoustic wave device disclosed in WO2006/011417A1, although the absolute value of the reflection coefficient can be increased by increasing the thickness of the electrode made of Al, it was found that since the sign of the reflection coefficient is negative, many ripples are generated in a pass band, and thus, superior resonant characteristics cannot be obtained.

In WO2006/011417A1, the relationship between the thickness of the IDT and the reflection coefficient is disclosed only for the case in which an IDT is made of Al and is provided on a LiTaO$_3$ substrate. In addition, in paragraph [0129] of WO2006/011417A1, it has been suggested that the IDT may be made using another metal, such as Au, however, only an IDT made of Au is disclosed.

In addition, according to Japanese Unexamined Patent Application Publication No. 2004-112748, when the IDT made of a metal having a density greater than that of Al is used, the absolute value of the reflection coefficient can be increased. However, an increase in the electromechanical coupling coefficient of a surface acoustic wave device is not particularly described.

In addition, in the structure in which the IDT is defined by filling Au in the grooves provided in the above LiNbO$_3$ substrate, there has been a problem in that the range of the Euler angles of a LiNbO$_3$ substrate which can be used to obtain a sufficiently high electromechanical coupling coefficient K$^2$ is small.

SUMMARY OF THE INVENTION

To overcome the problems described above, preferred embodiments of the present invention provide a surface acoustic wave device in which a LiNbO$_3$ substrate is used as a piezoelectric substrate, the reflection coefficient of an IDT is not only sufficiently high but the electromechanical coupling coefficient K$^2$ is also high, the range of the Euler angles of a LiNbO$_3$ substrate which can be used is relatively wide, and the degree of design freedom is increased.

According to a preferred embodiment of the present invention, a surface acoustic wave device includes a piezoelectric substrate including a plurality of grooves provided in an upper surface thereof and which is made of a LiNbO$_3$ substrate, and an IDT having a plurality of electrode fingers made of a metal material which is filled in the plurality of grooves in the upper surface of the piezoelectric substrate, and the metal material is preferably selected from the group consisting of Ag, Ni, and Cr or an alloy primarily including at least one of Ag, Ni, or Cr, for example.

In the surface acoustic wave device according to this preferred embodiment, when the wavelength of a surface acoustic wave is represented by $\lambda$, an electrode thickness of the IDT and $\theta$ of Euler angles (0°±10°, $\theta$, 0°±10°) of the LiNbO$_3$ substrate are one of combinations shown in Table 1. In this case, the range of the Euler angle of the LiNbO$_3$ substrate which can obtain a high electromechanical coupling coefficient K$^2$ can be further increased.

TABLE 1

| ELECTRODE MATERIAL | ELECTRODE THICKNESS | EULER ANGLE $\theta$ |
|---|---|---|
| Ag | 0.02$\lambda$ ≦ Ag ≦ 0.04$\lambda$ | 70° ≦ $\theta$ ≦ 145° |
| Ag | 0.04$\lambda$ < Ag ≦ 0.08$\lambda$ | 70° ≦ $\theta$ ≦ 142° |
| Ni | 0.04$\lambda$ ≦ Ni ≦ 0.08$\lambda$ | 70° ≦ $\theta$ ≦ 153° |
| Cr | 0.02$\lambda$ ≦ Cr ≦ 0.04$\lambda$ | 70° ≦ $\theta$ ≦ 145° |
| Cr | 0.04$\lambda$ < Cr ≦ 0.08$\lambda$ | 70° ≦ $\theta$ ≦ 152° |

In addition, the surface acoustic wave device preferably further includes a dielectric film which is made of SiO$_2$ or an inorganic material primarily including $SiO_2$ and which covers the IDT and the piezoelectric substrate. In this case, since the temperature coefficient of frequency of the dielectric film made of $SiO_2$ or an inorganic material primarily including $SiO_2$ is a positive value, and the temperature coefficient of frequency TCF of $LiNbO_3$ is a negative value, a surface acoustic wave device having a small absolute value of the temperature coefficient of frequency TCF is provided.

In a surface acoustic wave device according to another preferred embodiment of the present invention, when the wavelength of a surface acoustic wave is represented by $\lambda$, a normalized film thickness of the IDT normalized by $\lambda$, a normalized film thickness of an $SiO_2$ film used as the dielectric film normalized by $\lambda$, and $\theta$ of Euler angles ($0°\pm10°$, $\theta$, $0°\pm10°$) of the $LiNbO_3$ substrate are one of the combinations shown in the following Tables 2 to 4, Tables 5 to 7, or Tables 8 to 10.

TABLE 2

| | RANGE OF EULER ANGLE TO SATISFY $0.2 \geq K^2$ | |
|---|---|---|
| $4 \leq$ FILM THICKNESS OF Ag $\leq 8$ | LOWER LIMIT OF EULER ANGLE $\theta$ | UPPER LIMIT OF EULER ANGLE $\theta$ |
| $0 \leq$ FILM THICKNESS OF $SiO_2 \leq 5$ | 72 | 139 |
| $5 <$ FILM THICKNESS OF $SiO_2 \leq 10$ | 75 | 136 |
| $10 <$ FILM THICKNESS OF $SiO_2 \leq 15$ | 78 | 128 |
| $15 <$ FILM THICKNESS OF $SiO_2 \leq 20$ | 82 | 122 |
| $20 <$ FILM THICKNESS OF $SiO_2 \leq 25$ | 91 | 115 |
| $25 <$ FILM THICKNESS OF $SiO_2 \leq 30$ | 97 | 101 |
| $30 <$ FILM THICKNESS OF $SiO_2 \leq 35$ | — | — |

(The film thickness of Ag and the film thickness of $SiO_2$ in the table each indicate the value of the normalized film thickness $\times 10^2$.)

TABLE 3

| | RANGE OF EULER ANGLE TO SATISFY $0.2 \geq K^2$ | |
|---|---|---|
| $8 <$ FILM THICKNESS OF Ag $\leq 12$ | LOWER LIMIT OF EULER ANGLE $\theta$ | UPPER LIMIT OF EULER ANGLE $\theta$ |
| $0 \leq$ FILM THICKNESS OF $SiO_2 \leq 5$ | 72 | 139 |
| $5 <$ FILM THICKNESS OF $SiO_2 \leq 10$ | 75 | 136 |
| $10 <$ FILM THICKNESS OF $SiO_2 \leq 15$ | 78 | 126 |
| $15 <$ FILM THICKNESS OF $SiO_2 \leq 20$ | 80 | 122 |
| $20 <$ FILM THICKNESS OF $SiO_2 \leq 25$ | 81 | 122 |
| $25 <$ FILM THICKNESS OF $SiO_2 \leq 30$ | 81 | 123 |
| $30 <$ FILM THICKNESS OF $SiO_2 \leq 35$ | — | — |

(The film thickness of Ag and the film thickness of $SiO_2$ in the table each indicate the value of the normalized film thickness $\times 10^2$.)

TABLE 4

| | RANGE OF EULER ANGLE TO SATISFY $0.2 \geq K^2$ | |
|---|---|---|
| $12 <$ FILM THICKNESS OF Ag $\leq 16$ | LOWER LIMIT OF EULER ANGLE $\theta$ | UPPER LIMIT OF EULER ANGLE $\theta$ |
| $0 \leq$ FILM THICKNESS OF $SiO_2 \leq 5$ | 70 | 140 |
| $5 <$ FILM THICKNESS OF $SiO_2 \leq 10$ | 70 | 136 |
| $10 <$ FILM THICKNESS OF $SiO_2 \leq 15$ | 70 | 126 |

TABLE 4-continued

| | RANGE OF EULER ANGLE TO SATISFY $0.2 \geq K^2$ | |
|---|---|---|
| $12 <$ FILM THICKNESS OF Ag $\leq 16$ | LOWER LIMIT OF EULER ANGLE $\theta$ | UPPER LIMIT OF EULER ANGLE $\theta$ |
| $15 <$ FILM THICKNESS OF $SiO_2 \leq 20$ | 70 | 122 |
| $20 <$ FILM THICKNESS OF $SiO_2 \leq 25$ | 73 | 122 |
| $25 <$ FILM THICKNESS OF $SiO_2 \leq 30$ | 73 | 123 |
| $30 <$ FILM THICKNESS OF $SiO_2 \leq 35$ | 73 | 122 |

(The film thickness of Ag and the film thickness of $SiO_2$ in the table each indicate the value of the normalized film thickness $\times 10^2$.)

TABLE 5

| | RANGE OF EULER ANGLE TO SATISFY $0.2 \geq K^2$ | |
|---|---|---|
| $4 \leq$ FILM THICKNESS OF Ni $\leq 8$ | LOWER LIMIT OF EULER ANGLE $\theta$ | UPPER LIMIT OF EULER ANGLE $\theta$ |
| $0 \leq$ FILM THICKNESS OF $SiO_2 \leq 5$ | 70 | 150 |
| $5 <$ FILM THICKNESS OF $SiO_2 \leq 10$ | 70 | 147 |
| $10 <$ FILM THICKNESS OF $SiO_2 \leq 15$ | 70 | 145 |
| $15 <$ FILM THICKNESS OF $SiO_2 \leq 20$ | 70 | 138 |
| $20 <$ FILM THICKNESS OF $SiO_2 \leq 25$ | 79 | 134 |
| $25 <$ FILM THICKNESS OF $SiO_2 \leq 30$ | 93 | 117 |
| $30 <$ FILM THICKNESS OF $SiO_2 \leq 35$ | — | — |

(The film thickness of Ni and the film thickness of $SiO_2$ in the table each indicate the value of the normalized film thickness $\times 10^2$.)

TABLE 6

| | RANGE OF EULER ANGLE TO SATISFY $0.2 \geq K^2$ | |
|---|---|---|
| $8 <$ FILM THICKNESS OF Ni $\leq 12$ | LOWER LIMIT OF EULER ANGLE $\theta$ | UPPER LIMIT OF EULER ANGLE $\theta$ |
| $0 \leq$ FILM THICKNESS OF $SiO_2 \leq 5$ | 70 | 157 |
| $5 <$ FILM THICKNESS OF $SiO_2 \leq 10$ | 70 | 148 |
| $10 <$ FILM THICKNESS OF $SiO_2 \leq 15$ | 70 | 145 |
| $15 <$ FILM THICKNESS OF $SiO_2 \leq 20$ | 72 | 138 |
| $20 <$ FILM THICKNESS OF $SiO_2 \leq 25$ | 79 | 134 |
| $25 <$ FILM THICKNESS OF $SiO_2 \leq 30$ | 87 | 129 |
| $30 <$ FILM THICKNESS OF $SiO_2 \leq 35$ | — | — |

(The film thickness of Ni and the film thickness of $SiO_2$ in the table each indicate the value of the normalized film thickness $\times 10^2$.)

TABLE 7

| | RANGE OF EULER ANGLE TO SATISFY $0.2 \geq K^2$ | |
|---|---|---|
| $12 <$ FILM THICKNESS OF Ni $\leq 16$ | LOWER LIMIT OF EULER ANGLE $\theta$ | UPPER LIMIT OF EULER ANGLE $\theta$ |
| $0 \leq$ FILM THICKNESS OF $SiO_2 \leq 5$ | 73 | 151 |
| $5 <$ FILM THICKNESS OF $SiO_2 \leq 10$ | 72 | 151 |
| $10 <$ FILM THICKNESS OF $SiO_2 \leq 15$ | 70 | 146 |
| $15 <$ FILM THICKNESS OF $SiO_2 \leq 20$ | 72 | 140 |
| $20 <$ FILM THICKNESS OF $SiO_2 \leq 25$ | 76 | 134 |

TABLE 7-continued

| | RANGE OF EULER ANGLE TO SATISFY $0.2 \geq K^2$ | |
|---|---|---|
| 12 < FILM THICKNESS OF Ni ≦ 16 | LOWER LIMIT OF EULER ANGLE θ | UPPER LIMIT OF EULER ANGLE θ |
| 25 < FILM THICKNESS OF $SiO_2$ ≦ 30 | 81 | 131 |
| 30 < FILM THICKNESS OF $SiO_2$ ≦ 35 | 83 | 129 |

(The film thickness of Ni and the film thickness of $SiO_2$ in the table each indicate the value of the normalized film thickness × $10^2$.)

TABLE 8

| | RANGE OF EULER ANGLE TO SATISFY $0.2 \geq K^2$ | |
|---|---|---|
| 4 ≦ FILM THICKNESS OF Cr ≦ 8 | LOWER LIMIT OF EULER ANGLE θ | UPPER LIMIT OF EULER ANGLE θ |
| 0 ≦ FILM THICKNESS OF $SiO_2$ ≦ 5 | 70 | 150 |
| 5 < FILM THICKNESS OF $SiO_2$ ≦ 10 | 70 | 147 |
| 10 < FILM THICKNESS OF $SiO_2$ ≦ 15 | 70 | 145 |
| 15 < FILM THICKNESS OF $SiO_2$ ≦ 20 | 73 | 138 |
| 20 < FILM THICKNESS OF $SiO_2$ ≦ 25 | 80 | 128 |
| 25 < FILM THICKNESS OF $SiO_2$ ≦ 30 | 87 | 114 |
| 30 < FILM THICKNESS OF $SiO_2$ ≦ 35 | — | — |

(The film thickness of Cr and the film thickness of $SiO_2$ in the table each indicate the value of the normalized film thickness × $10^2$.)

TABLE 9

| | RANGE OF EULER ANGLE TO SATISFY $0.2 \geq K^2$ | |
|---|---|---|
| 8 < FILM THICKNESS OF Cr ≦ 12 | LOWER LIMIT OF EULER ANGLE θ | UPPER LIMIT OF EULER ANGLE θ |
| 0 ≦ FILM THICKNESS OF $SiO_2$ ≦ 5 | — | — |
| 5 < FILM THICKNESS OF $SiO_2$ ≦ 10 | — | — |
| 10 < FILM THICKNESS OF $SiO_2$ ≦ 15 | — | — |
| 15 < FILM THICKNESS OF $SiO_2$ ≦ 20 | — | — |
| 20 < FILM THICKNESS OF $SiO_2$ ≦ 25 | — | — |
| 25 < FILM THICKNESS OF $SiO_2$ ≦ 30 | — | — |
| 30 < FILM THICKNESS OF $SiO_2$ ≦ 35 | — | — |

(The film thickness of Cr and the film thickness of $SiO_2$ in the table each indicate the value of the normalized film thickness × $10^2$.)

TABLE 10

| | RANGE OF EULER ANGLE TO SATISFY $0.2 \geq K^2$ | |
|---|---|---|
| 12 < FILM THICKNESS OF Cr ≦ 16 | LOWER LIMIT OF EULER ANGLE θ | UPPER LIMIT OF EULER ANGLE θ |
| 0 ≦ FILM THICKNESS OF $SiO_2$ ≦ 5 | — | — |
| 5 < FILM THICKNESS OF $SiO_2$ ≦ 10 | — | — |
| 10 < FILM THICKNESS OF $SiO_2$ ≦ 15 | — | — |
| 15 < FILM THICKNESS OF $SiO_2$ ≦ 20 | — | — |
| 20 < FILM THICKNESS OF $SiO_2$ ≦ 25 | — | — |
| 25 < FILM THICKNESS OF $SiO_2$ ≦ 30 | — | — |
| 30 < FILM THICKNESS OF $SiO_2$ ≦ 35 | — | — |

(The film thickness of Cr and the film thickness of $SiO_2$ in the table each indicate the value of the normalized film thickness × $10^2$.)

According various to preferred embodiments of the present invention, in an IDT including a plurality of electrode fingers made of a metal material which is filled in grooves in an upper surface of a $LiNbO_3$ substrate, since the metal material is made of a metal of Ag, Ni, or Cr or an alloy primarily including at least one of Ag, Ni, or Cr, for example, the reflection coefficient of the IDT is not only high but a high electromechanical coupling coefficient $K^2$ is also obtained. Furthermore, in order to achieve a range of the high electromechanical coupling coefficient $K^2$, the Euler angles of the $LiNbO_3$ substrate can be selected from a wide range of angles. Thus, the characteristics of the surface acoustic wave device are improved, and the degree of design freedom thereof is increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, with reference to the drawings, preferred embodiments of the present invention will be described to provide a clear understanding of the present invention.

Figure 1A:
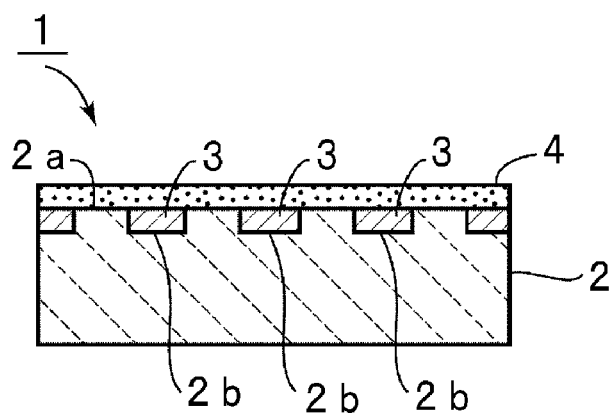
FIG. 1A is a partial schematic front cross-sectional view showing an important portion of a surface acoustic wave device according to a preferred embodiment of the present invention.
Figure 1B:
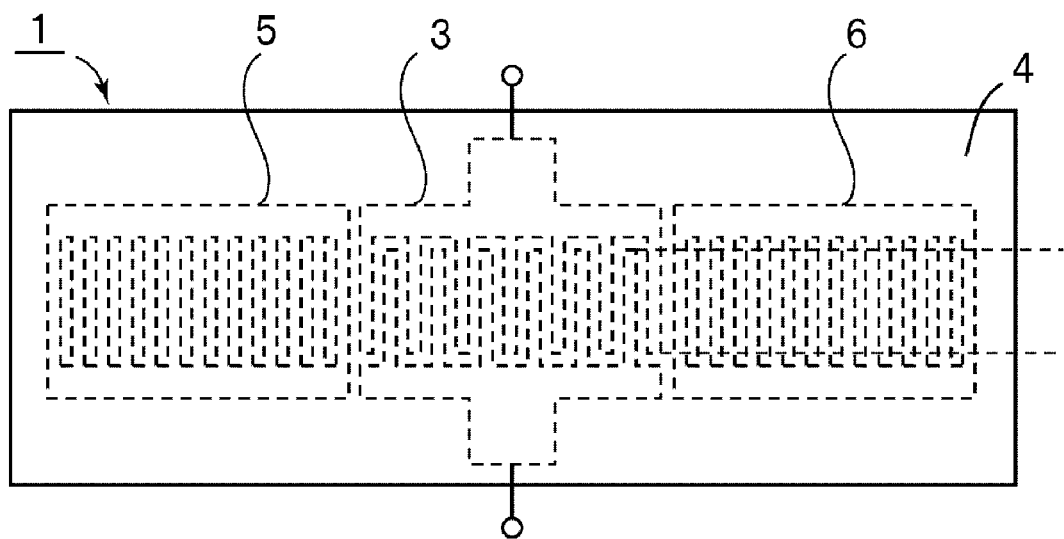
FIG. 1B is a schematic plan view of the surface acoustic wave device.

FIG. 1A is a partially schematic front cross-sectional view showing a portion in which an IDT of a surface acoustic wave device according to a first preferred embodiment of the present invention is provided, and FIG. 1B is a schematic plan view of the above surface acoustic wave device.

As shown in FIG. 1A, a surface acoustic wave device 1 includes a $LiNbO_3$ substrate 2. A plurality of grooves 2b are provided in an upper surface 2a of the $LiNbO_3$ substrate 2. A metal is filled in the plurality of grooves 2b, so that an IDT 3 including a plurality of electrode fingers is provided. An upper surface of this IDT 3 and the upper surface 2a of the $LiNbO_3$ substrate 2 are flush or substantially flush with each other.

A $SiO_2$ film 4 is preferably arranged so as to cover the upper surface 2a and the IDT 3. However, in preferred embodiments of the present invention, the $SiO_2$ film 4 may not be provided.

As shown in FIG. 1B, the surface acoustic wave device 1 preferably is a one-port type surface acoustic wave resonator which includes the IDT 3 and first and second reflectors 5 and 6 disposed at both sides of the IDT 3 in a surface acoustic wave propagation direction. In addition, the reflectors 5 and 6 are each a grating reflector in which both ends of electrode fingers are short-circuited to each other.

Similar to the IDT 3, the reflectors 5 and 6 are formed by filling the same metal as that described above for the IDT 3 in grooves provided in the upper surface 2a of the LiNbO$_3$ substrate 2. Accordingly, the reflectors 5 and 6 are also flush or substantially flush with the electrode surface and the upper surface 2a of the LiNbO$_3$ substrate 2. Thus, the upper surface of the SiO$_2$ film 4 is substantially planar over the entire surface acoustic wave device 1.

Although the temperature coefficient of frequency TCF of the LiNbO$_3$ substrate 2 is a negative value, since the temperature coefficient of frequency TCF of the SiO$_2$ film 4 is a positive value, the overall absolute value of the temperature coefficient of frequency TCF is decreased. Thus, in the surface acoustic wave device 1, the change in frequency characteristics caused by changes in temperature is small.

The surface acoustic wave device 1 of this preferred embodiment preferably is a surface acoustic wave device which utilizes an SH wave, and one of the unique features of this device is that the metal material used for the IDT 3 is preferably Ag, Ni, or Cr or an alloy primarily including at least one of Ag, Ni, or Cr, for example. A metal layer made of another metal material, such as an adhesion layer or a diffusion prevention layer, may also be included in the IDT 3, or the IDT 3 may have a laminated structure including another metal layer.

Accordingly, in the surface acoustic wave device 1 of this preferred embodiment, the absolute value of the reflection coefficient of the IDT 3 is not only increased but a high electromechanical coupling coefficient $K^2$ is also obtained. In addition, as shown in the following experimental examples, when a surface acoustic wave device 1 having a high electromechanical coupling coefficient $K^2$ is obtained, the range of the Euler angles of a LiNbO$_3$ substrate which can be used is significantly increased. Thus, the degree of design freedom is increased. This will be described with reference to FIGS. 2 to 11.

Figure 8:
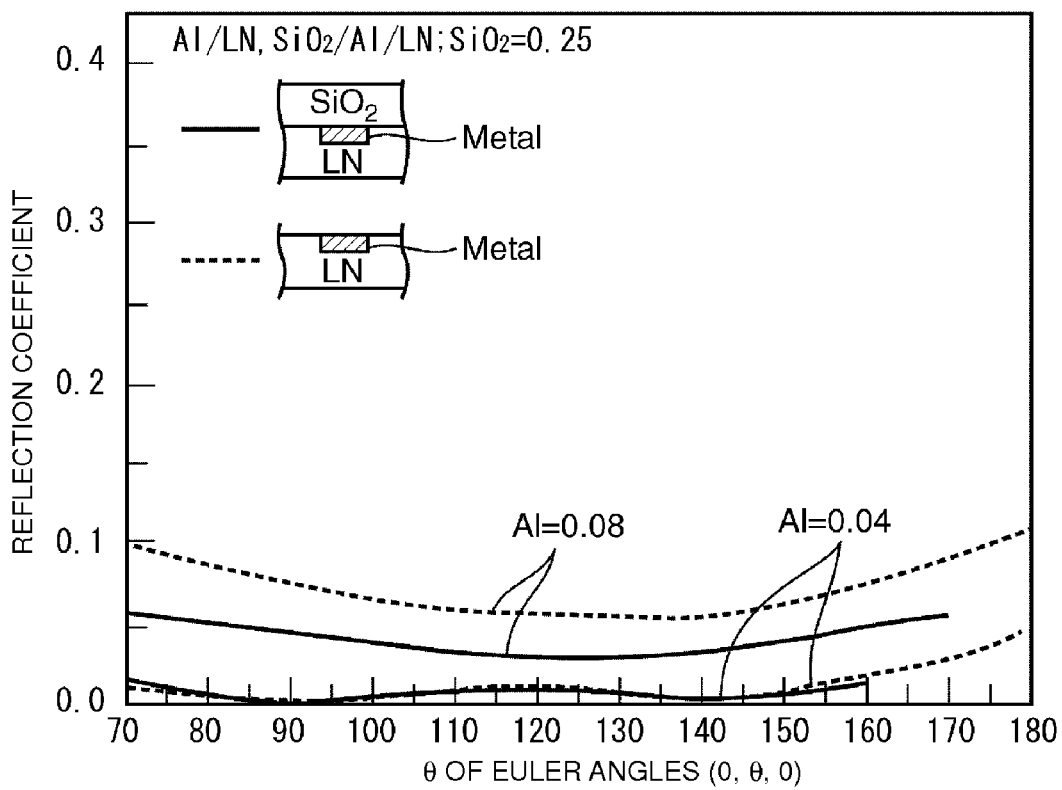
FIG. 8 is a view showing the relationship between the reflection coefficient and the Euler angle θ according to a related example which is obtained when Al is used as a metal material for an IDT, in which a solid line indicates results of a structure in which an SiO$_2$ film is laminated and a dotted line indicates results of a structure in which no SiO$_2$ film is laminated.
Figure 9:
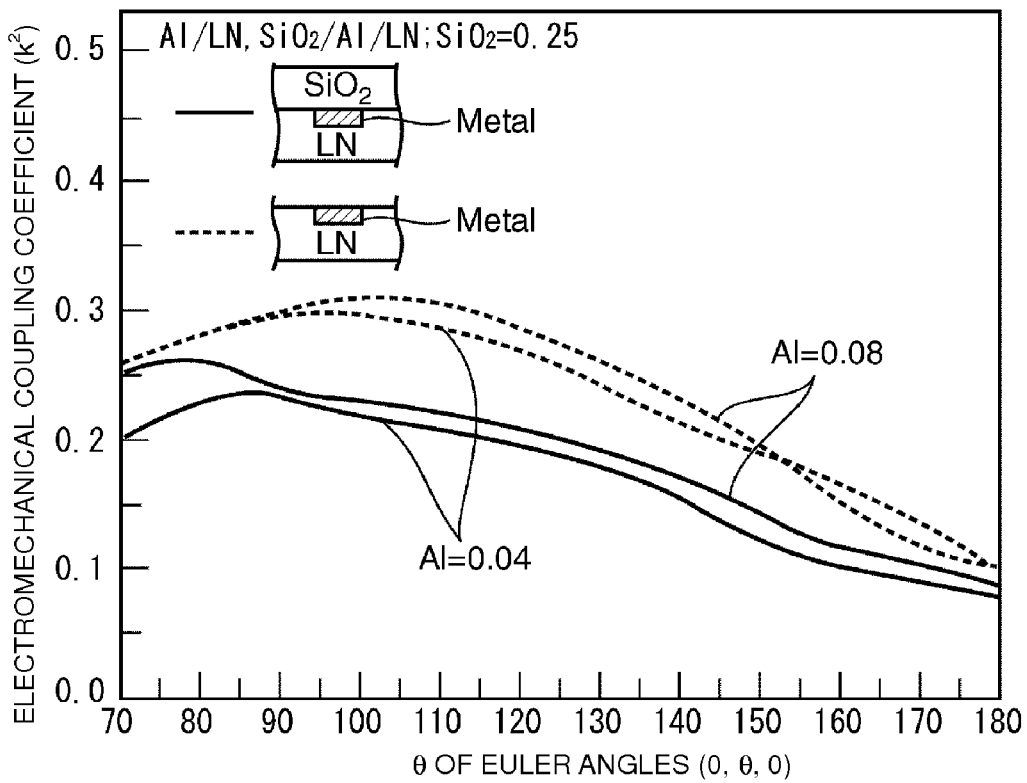
FIG. 9 is a view showing the relationship between the electromechanical coupling coefficient K$^2$ and the Euler angle θ according to a related example which is obtained when Al is used as a metal material for an IDT, in which a solid line indicates results of a structure in which an SiO$_2$ film is laminated and a dotted line indicates results of a structure in which no SiO$_2$ film is laminated.

FIGS. 8 and 9 are views showing the relationship of θ of Euler angles (0°, θ, 0°) of an LiNbO$_3$ substrate with the reflection coefficient or the electromechanical coupling coefficient $K^2$ of a surface acoustic wave device in which although the structure thereof is similar to that of the surface acoustic wave device 1 of the above-described preferred embodiment, an IDT electrode and reflectors are formed of Al, and a leakage surface acoustic wave is utilized.

In FIGS. 8 and 9, the results are shown of a case in which a normalized film thickness of the IDT 3 made of Al normalized by a wavelength λ of a surface acoustic wave is set to about 0.04 or about 0.08. In addition, the results of a structure in which a SiO$_2$ film 4 having a normalized film thickness of about 0.25 is provided are shown by a solid line, and the results of a structure in which no SiO$_2$ film 4 is provided are shown by a dotted line.

As shown in FIG. 8, it was discovered that when Al is used as an electrode material, the reflection coefficient is not significantly increased.

In addition, as shown in FIG. 9, it was discovered that when the Euler angle θ is changed, the electromechanical coupling coefficient $K^2$ can be set to about 0.2 or greater. However, as shown in FIG. 8, when no SiO$_2$ film 4 is provided, it was discovered that regardless of the value of the Euler angle θ and the film thickness of the IDT made of Al, the reflection coefficient is relatively low, such as about 0.1 or less.

Figure 10:
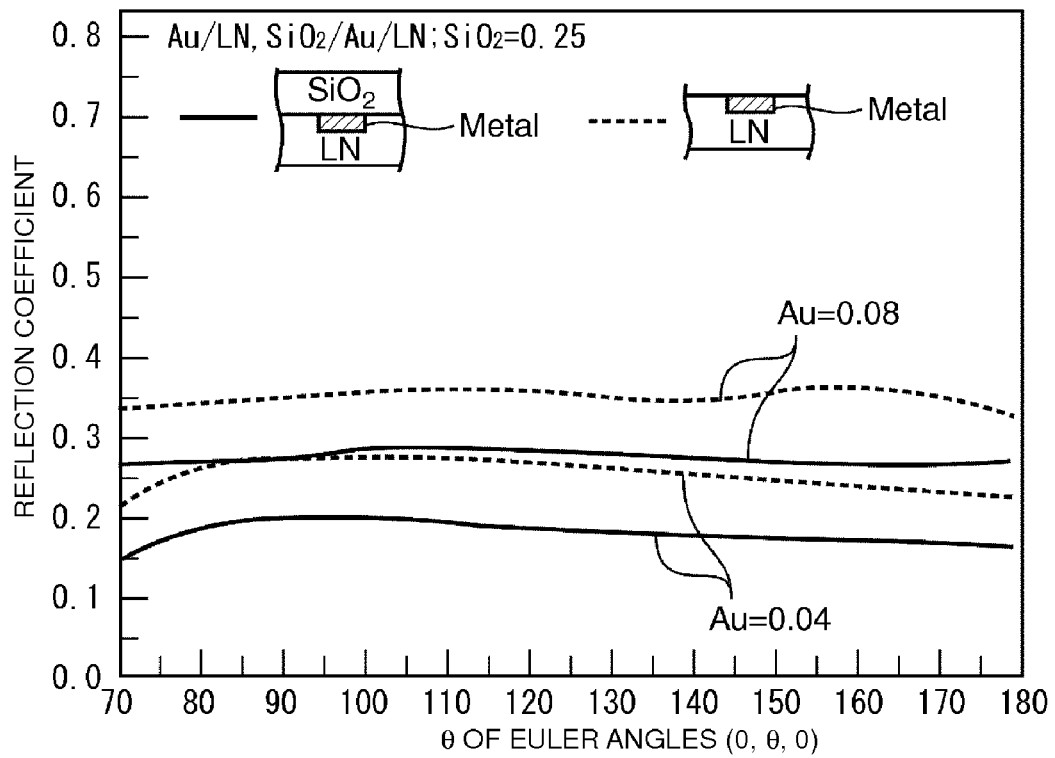
FIG. 10 is a view showing the relationship between the reflection coefficient and the Euler angle θ according to a related example which is obtained when Au is used as a metal material for an IDT, in which a solid line indicates results of a structure in which an SiO$_2$ film is laminated and a dotted line indicates results of a structure in which no SiO$_2$ film is laminated.
Figure 11:
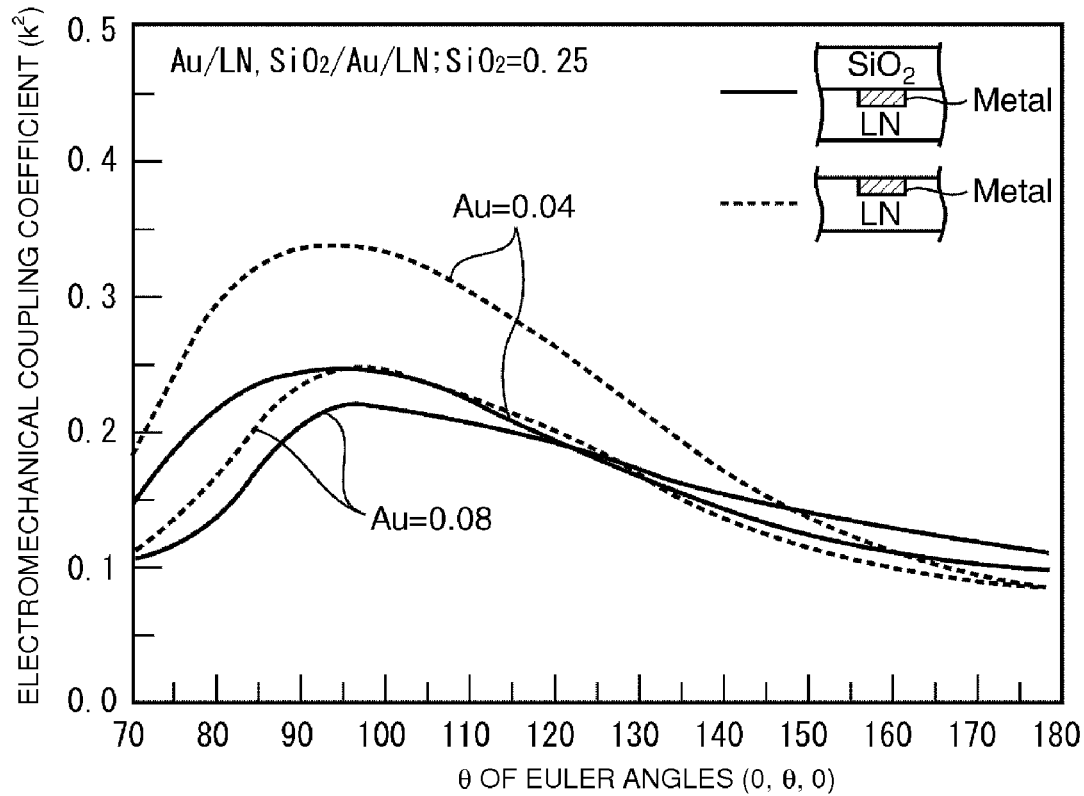
FIG. 11 is a view showing the relationship between the electromechanical coupling coefficient K$^2$ and the Euler angle θ according to a related example which is obtained when Au is used as a metal material for an IDT, in which a solid line indicates results of a structure in which an SiO$_2$ film is laminated and a dotted line indicates results of a structure in which no SiO$_2$ film is laminated.

On the other hand, in FIGS. 10 and 11, the results are shown of the case in which Au having a normalized film thickness of about 0.04 or about 0.08 is used as the electrode material, the normalized film thickness being normalized by a wavelength λ of a surface acoustic wave. That is, results are shown which are obtained when the IDT electrode 3 and the reflectors 5 and 6 shown in FIG. 1 are made of Au. FIG. 10 shows the relationship between the Euler angle θ and the reflection coefficient, and FIG. 11 shows the relationship between the Euler angle θ and the electromechanical coupling coefficient $K^2$.

In addition, also in FIGS. 10 and 11, the results are shown by a solid line which are obtained when an SiO$_2$ film 4 having a normalized film thickness 4 of about 0.25 is provided, and the results are shown by a dotted line which are obtained when no SiO$_2$ film 4 is provided.

As shown in FIG. 10, it was discovered that as compared to the case in which Al is used as the electrode material shown in FIG. 8, when Au is used as the electrode material, the reflection coefficient can be increased regardless of the Euler angle θ.

However, as shown in FIG. 11, in the structure in which no SiO$_2$ film 4 is provided, a region having a high electromechanical coupling coefficient $K^2$, that is, a region in which the electromechanical coupling coefficient $K^2$ is about 0.2 or greater, is in the range of about 72° to about 131° when the normalized film thickness of the electrode made of Au is about 0.04, and when the normalized film thickness of the electrode made of Au is about 0.08, the above region is in the range of about 85° to about 119°. Thus, when the normalized film thickness is changed in the range of about 0.04 to about 0.08, it was discovered that when the Euler angle θ is not selected in the range of about 85° to about 119°, the electromechanical coupling coefficient $K^2$ cannot be set to about 0.2 or greater.

In the structure in which the IDT 3 and the reflectors 5 and 6 are made of Au and in which the SiO$_2$ film 4 is further provided, it was discovered that in order to obtain an electromechanical coupling coefficient $K^2$ of about 0.2 or greater, the Euler angle θ must be set in the range of about 77° to about 117° when the normalized film thickness of the Au film is about 0.04, and that when the normalized film thickness thereof is about 0.08, the Euler angle θ must be set in the range of about 90° to about 114°. Thus, it was discovered that when the normalized film thickness of the Au film is in the range of about 0.04 to about 0.08, the Euler angle θ must be set in the range of about 90° to about 114°.

On the other hand, as described below, when Ag, Ni, or Cr or an alloy primarily made of at least one of Ag, Ni, or Cr is used as the metal material forming the IDT 3, the range of an Euler angle θ at which an electromechanical coupling coefficient $K^2$ of about 0.2 or greater can be obtained is increased. Thus, the degree of design freedom of the surface acoustic wave device is increased.

In addition, the reason that superior characteristics are obtained when the electromechanical coupling coefficient $K^2$ is about 0.2 or greater is that in a surface acoustic wave device used as a resonator or a band pass filter, in order to obtain a bandwidth which is typically required, the electromechanical coupling coefficient $K^2$ is preferably approximately 0.2 or greater.

Figure 2:
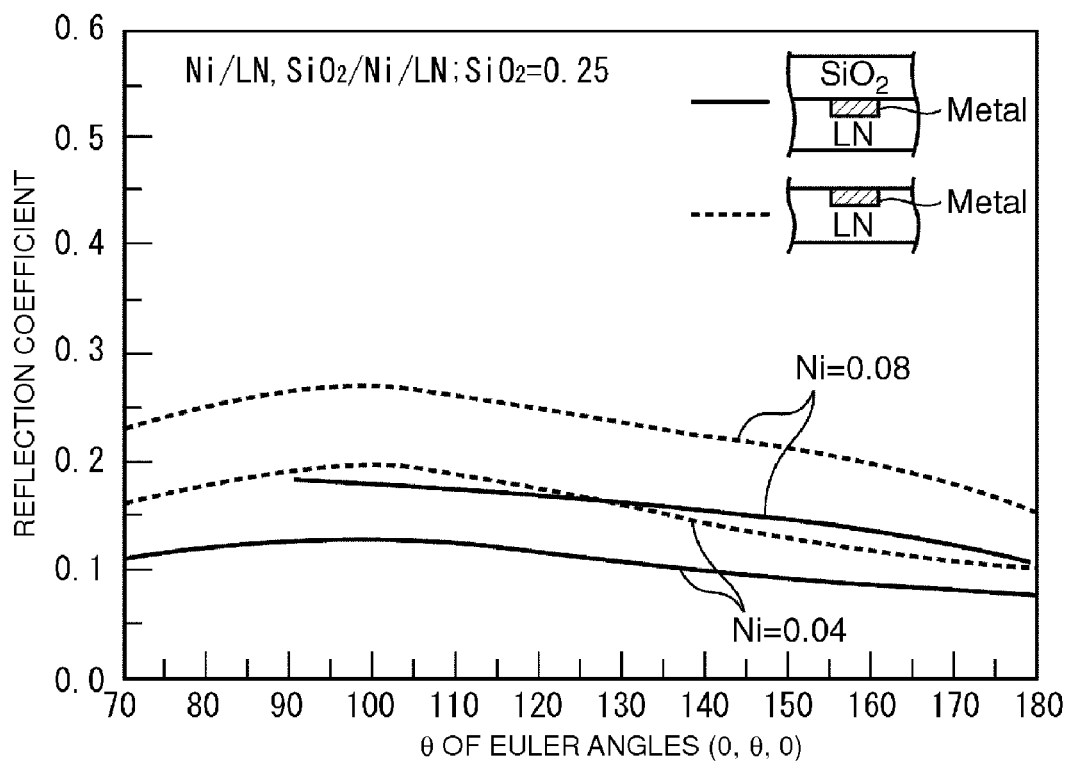
FIG. 2 is a view showing the relationship between the reflection coefficient and the Euler angle θ according to a preferred embodiment of the present invention which is obtained when Ni is used as a metal material for an IDT, in which a solid line indicates results of a structure in which an $SiO_2$ film is laminated and a dotted line indicates results of a structure in which no $SiO_2$ film is laminated.
Figure 3:
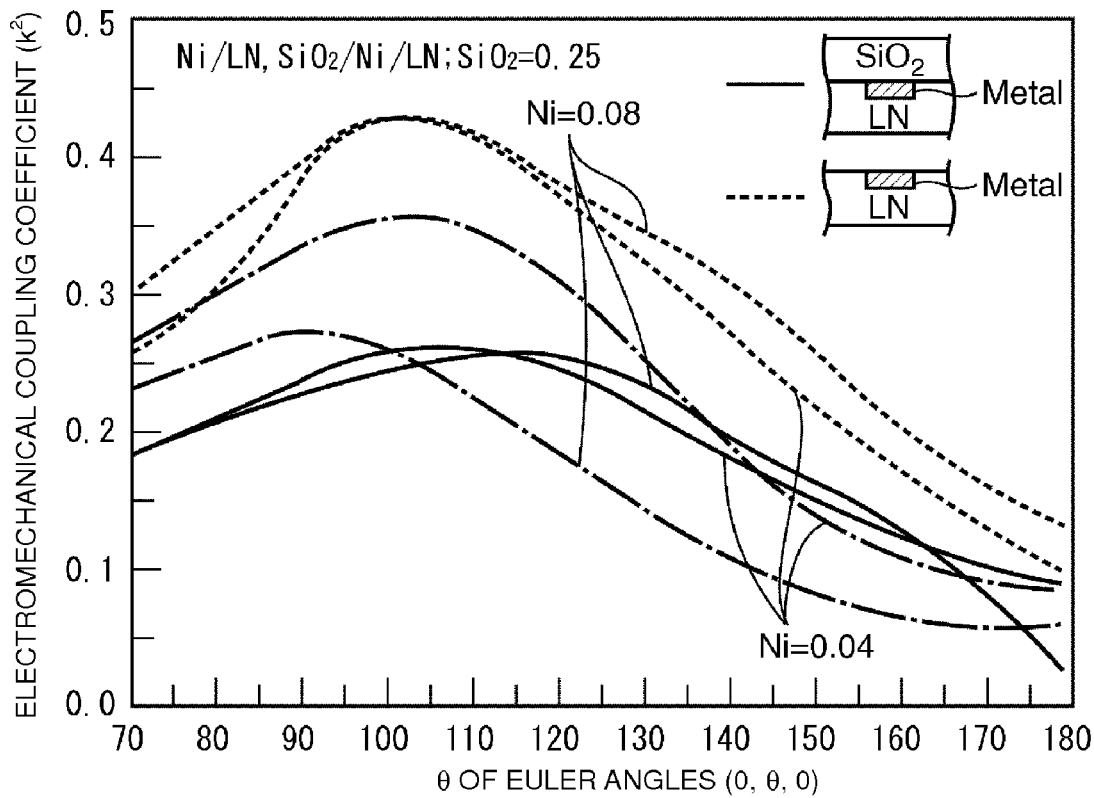
FIG. 3 is a view showing the relationship between the electromechanical coupling coefficient $K^2$ and the Euler angle θ according to a preferred embodiment of the present invention which is obtained when Ni is used as a metal material for an IDT, in which a solid line indicates results of a structure in which an $SiO_2$ film is laminated and a dotted line indicates results of a structure in which no $SiO_2$ film is laminated.

FIGS. 2 and 3 are views showing the relationship of the Euler angle θ of a LiNbO$_3$ substrate with the reflection coefficient or the electromechanical coupling coefficient $K^2$ in the case in which Ni is used as the metal material for the IDT electrode 3 and the reflectors 5 and 6. In FIGS. 2 and 3, the normalized film thickness of Ni used as the metal material for the IDT 3 and the reflectors 5 and 6 is also set to about 0.04 or about 0.08. Furthermore, also in FIGS. 2 and 3, the results obtained when the SiO$_2$ film 4 is provided are shown by a solid line, and results obtained when no SiO$_2$ film 4 is provided are shown by a dotted line. In addition, in FIGS. 2 and 3, the results obtained when the IDT 3 and the reflectors 5 and 6 are provided on an upper surface of a LiNbO$_3$ substrate from Ni having a normalized film thickness of about 0.08 are also shown by a chain line.

As shown in FIG. 2, as in the case in which Ni is used as the metal material, it was discovered that as compared to the case in which Al is used, a high reflection coefficient can be obtained regardless of the range of the Euler angle θ.

In addition, as apparent from FIG. 3, according to a comparative example shown by the chain line, the range of an Euler angle θ which can realize an electromechanical coupling coefficient K$^2$ of about 0.2 or greater is about 70° to about 138° when the normalized film thickness of Ni is about 0.04, and when the normalized film thickness thereof is about 0.08, the range is about 70° to about 117°.

On the other hand, in the structure in which no SiO$_2$ film 4 is provided according to various preferred embodiments of the present invention, it was discovered that when the film thickness of the Ni film is about 0.04λ, the range of an Euler angle which can obtain an electromechanical coupling coefficient K$^2$ of about 0.2 or greater may be set to about 70° to about 153°, and that when the film thickness is about 0.08λ, the above range may be set to about 70° to about 160°. Thus, it was discovered that when Ni is used as the metal material, and when the thickness thereof is in the range of about 0.04λ to about 0.08λ, the Euler angle θ may be set in the range of about 70° to about 153°. Accordingly, as compared to the range of about 85° to about 119° obtained when Au is used, the range of the Euler angle θ is significantly increased.

As in the case described above, in the structure in which the SiO$_2$ film 4 is provided, it was discovered from FIG. 3 that when the film thickness of Ni is about 0.04λ, the range of an Euler angle θ which increases the electromechanical coupling coefficient K$^2$ to about 0.2 or greater may be set to about 78° to about 134°, and that when the film thickness is about 0.08λ, the range may be set to about 79° to about 138°. That is, it was discovered that when the thickness of Ni is in the range of about 0.04λ to about 0.08λ, the Euler angle θ may be set in the range of about 79° to about 134°. Accordingly, it was discovered that as compared to the range of about 90° to about 114° obtained when the Au film is used, the range of the Euler angle θ is significantly increased.

Figure 4:
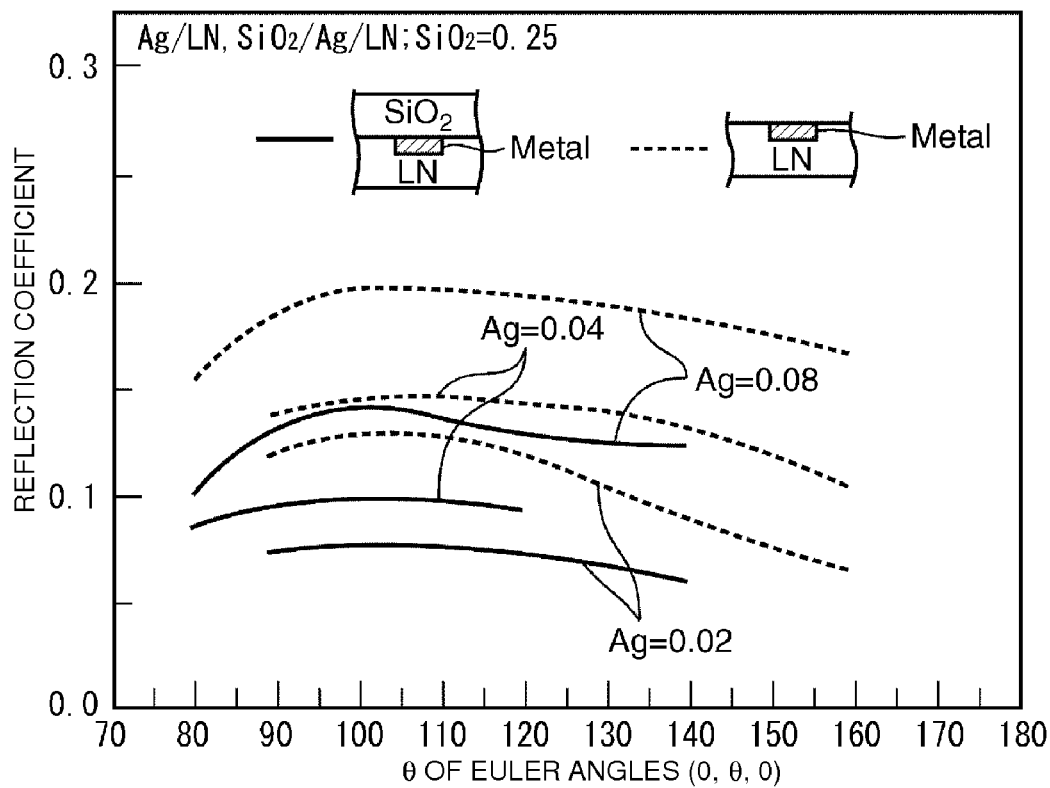
FIG. 4 is a view showing the relationship between the reflection coefficient and the Euler angle θ according to a preferred embodiment of the present invention which is obtained when Ag is used as a metal material for an IDT, in which a solid line indicates results of a structure in which an $SiO_2$ film is laminated and a dotted line indicates results of a structure in which no $SiO_2$ film is laminated.
Figure 5:
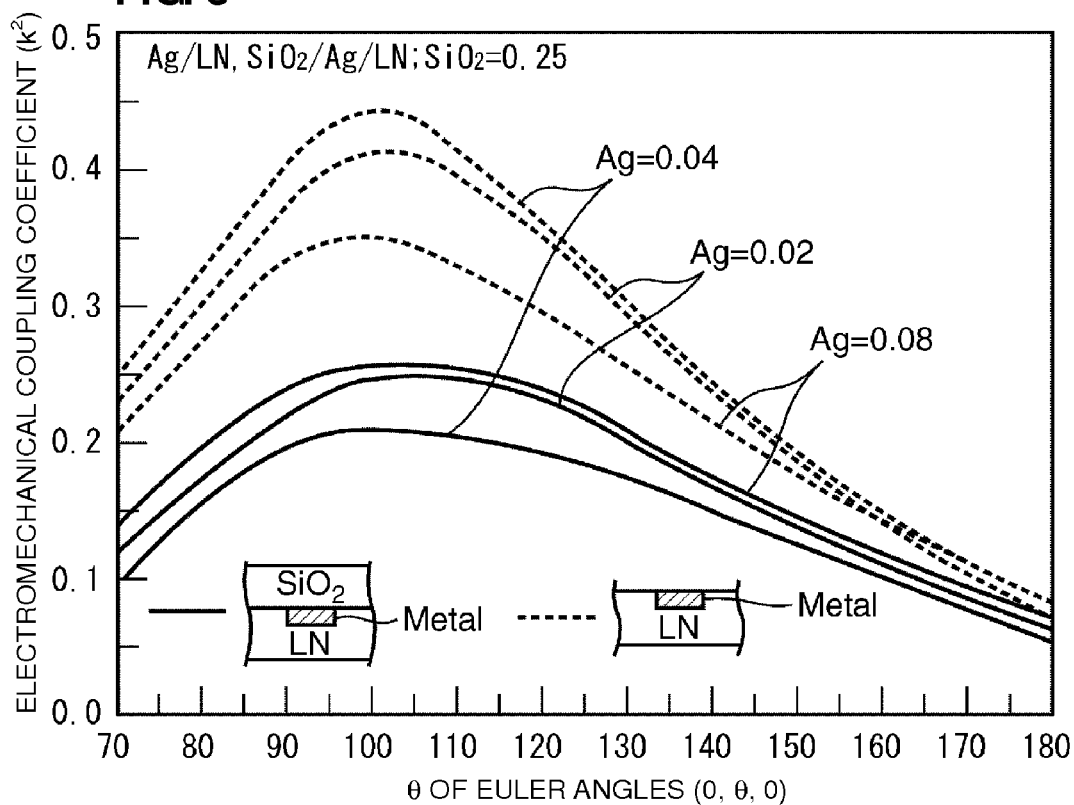
FIG. 5 is a view showing the relationship between the electromechanical coupling coefficient $K^2$ and the Euler angle θ according to a preferred embodiment of the present invention which is obtained when Ag is used as a metal material for an IDT, in which a solid line indicates results of a structure in which an SiO$_2$ film is laminated and a dotted line indicates results of a structure in which no SiO$_2$ film is laminated.

As FIGS. 2 and 3 show, FIGS. 4 and 5 are views showing the relationship of the Euler angle θ with the reflection coefficient or the electromechanical coupling coefficient K$^2$. In FIGS. 4 and 5, the normalized film thickness of Ag used as the metal material for the IDT 3 and the reflectors 5 and 6 is set to about 0.02, about 0.04, or about 0.08. Furthermore, in FIGS. 4 and 5, the results obtained when the SiO$_2$ film 4 is provided are shown by a solid line, and results obtained when no SiO$_2$ film 4 is provided are shown by a dotted line.

As shown in FIG. 4, in the case in which Ag is used as the metal material, it was discovered that as compared to the case in which Al is used, a high reflection coefficient can be obtained regardless of the range of the Euler angle θ.

In addition, as shown in FIG. 5, in the structure in which no SiO$_2$ film 4 is provided, it was discovered that the range of an Euler angle which can obtain an electromechanical coupling coefficient K$^2$ of about 0.2 or greater may be set to about 70° to about 145° when the normalized film thickness of the Ag film is about 0.02, that the range may be set to about 70° to about 148° when the normalized film thickness is about 0.04, and that the range may be set to about 70° to about 142° when the normalized film thickness is about 0.08.

Accordingly, when Ag is used as the metal material, it was discovered that when the film thickness thereof is in the range of about 0.02λ to about 0.04λ, the Euler angle θ may be set in the range of about 70° to about 145°, and that when the film thickness is in the range of about 0.04λ to about 0.08λ, the Euler angle θ may be set in the range of about 70° to about 142°. Thus, as compared to the range of about 85° to about 119° obtained when Au is used, the range of the Euler angle θ is significantly increased.

As in the case described above, in the structure in which the SiO$_2$ film 4 is provided, it was discovered from FIG. 5 that when the film thickness of Ag is about 0.02λ, the range of an Euler angle θ which obtain the electromechanical coupling coefficient K$^2$ to about 0.2 or greater may be set to about 87° to about 130°, that when the film thickness is about 0.04λ, the range may be set to about 91° to about 115°, and that when the film thickness is about 0.08λ, the range may be set to about 81° to about 131°. That is, it was discovered that when the thickness of Ag is in the range of about 0.02λ to about 0.04λ, the Euler angle θ may be set in the range of about 91° to about 115°, and that when the thickness of Ag is in the range of about 0.04λ to about 0.08λ, the Euler angle θ may be set in the range of about 91° to about 115°. Accordingly, it was discovered that as compared to the range of about 90° to about 114° obtained when the Au film is used, the range of the Euler angle θ can be increased.

Figure 6:
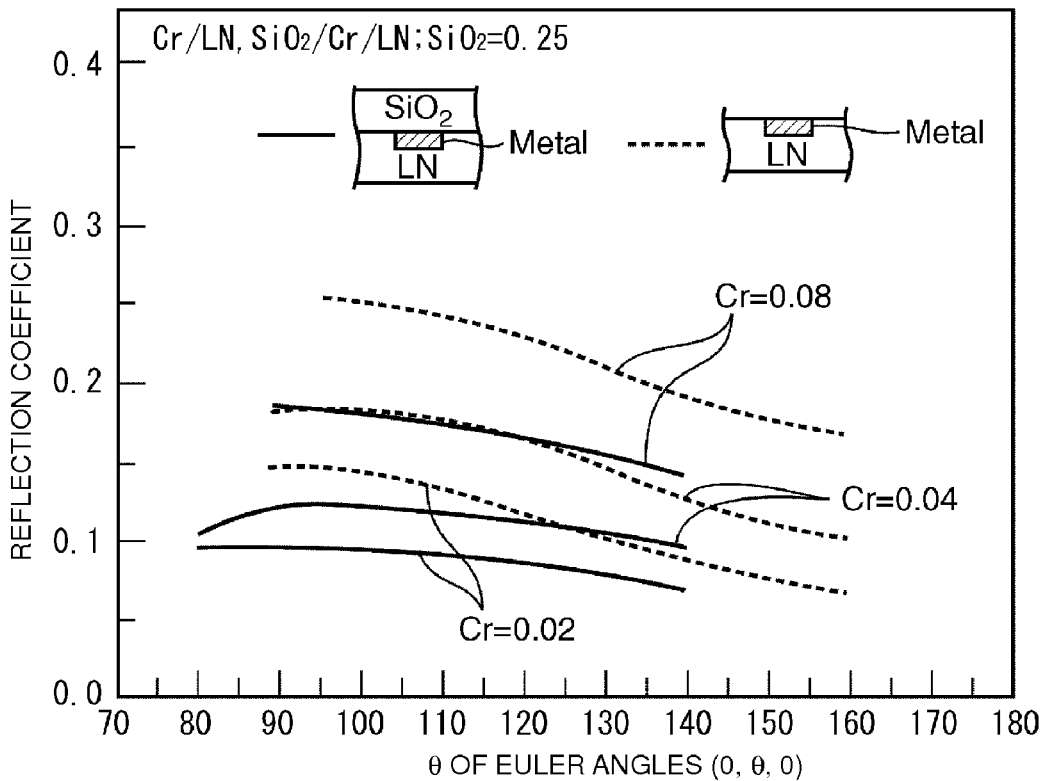
FIG. 6 is a view showing the relationship between the reflection coefficient and the Euler angle θ according to a preferred embodiment of the present invention which is obtained when Cr is used as a metal material for an IDT, in which a solid line indicates results of a structure in which an SiO$_2$ film is laminated and a dotted line indicates results of a structure in which no SiO$_2$ film is laminated.
Figure 7:
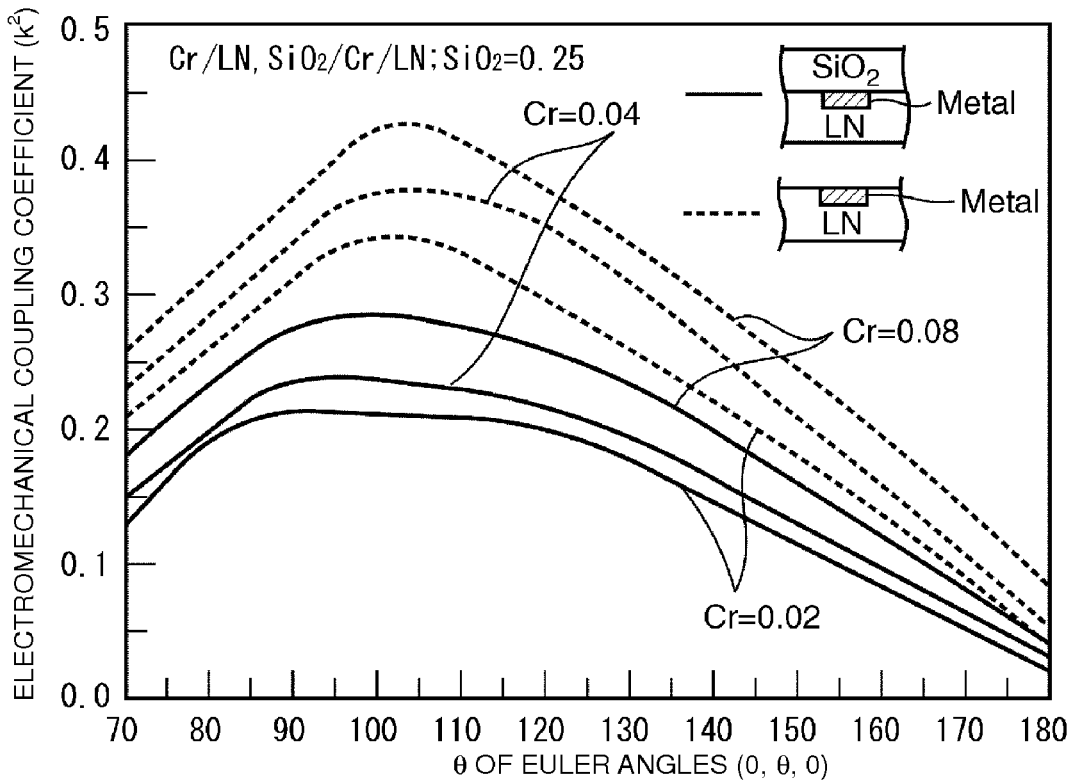
FIG. 7 is a view showing the relationship between the electromechanical coupling coefficient K$^2$ and the Euler angle θ according to a preferred embodiment of the present invention which is obtained when Cr is used as a metal material for an IDT, in which a solid line indicates results of a structure in which an SiO$_2$ film is laminated and a dotted line indicates results of a structure in which no SiO$_2$ film is laminated.

As FIGS. 2 and 3 show, FIGS. 6 and 7 are views showing the relationship of the Euler angle θ with the reflection coefficient or the electromechanical coupling coefficient K$^2$. In FIGS. 6 and 7, the normalized film thickness of Cr used as the metal material for the IDT 3 and the reflectors 5 and 6 is set to about 0.02, about 0.04, and about 0.08. Furthermore, in FIGS. 6 and 7, the results obtained when the SiO$_2$ film 4 is provided are shown by a solid line, and results obtained when no SiO$_2$ film 4 is provided are shown by a dotted line.

As shown in FIG. 6, in the case in which Cr is used as the metal material, it was discovered that as compared to when Al is used, a high reflection coefficient can be obtained regardless of the range of the Euler angle θ.

In addition, as shown in FIG. 7, in the structure in which no SiO$_2$ film 4 is provided, it was discovered that the range of an Euler angle which can obtain an electromechanical coupling coefficient K$^2$ of about 0.2 or greater may be set to about 70° to about 145° when the normalized film thickness of the Cr film is about 0.02, that the range may be set to about 70° to about 152° when the normalized film thickness is about 0.04, and that the range may be set to about 70° to about 59° when the normalized film thickness is about 0.08.

Accordingly, when Cr is used as the metal material, it was discovered that when the film thickness thereof is in the range of about 0.02λ to about 0.04λ, the Euler angle θ may be set in the range of about 70° to about 145°, and that when the film thickness is in the range of about 0.04λ to about 0.08λ, the Euler angle θ may be set in the range of about 70° to about 152°. Thus, as compared to the range of about 85° to about 119° obtained when Au is used, the range of the Euler angle θ is significantly increased.

As in the case described above, when the SiO$_2$ film 4 is laminated, it was discovered from FIG. 7 that when the film thickness of Cr is about 0.02λ, the range of an Euler angle θ which can increase the electromechanical coupling coefficient K$^2$ to about 0.2 or greater may be set to about 82° to about 121°, that when the film thickness is about 0.04λ, the above range may be set to about 80° to about 128°, and that when the film thickness is about 0.08λ, the above range may be set to about 73° to about 140°. That is, it was discovered that when the thickness of Cr is in the range of about 0.02λ to about 0.04λ, the Euler angle θ may be set in the range of about 82° to about 121°, and that when the thickness of Cr is in the range of about 0.04λ to about 0.08λ, the Euler angle θ may be set in the range of about 80° to about 128°. Accordingly, it was discovered that as compared to the range of about 90° to about 114° obtained when the Au film is used, the range of the Euler angle θ is increased.

When the results described with reference to FIGS. 2 to 7 are summarized, a combination among the metal material used for an electrode, the electrode thickness made of the above metal material, and the Euler angle θ, which achieves an electromechanical coupling coefficient $K^2$ of about 0.2 or greater, corresponds to one of combinations shown in Table 11 below. Table 11 shows the results of the structure in which no $SiO_2$ film is provided.

TABLE 11

| ELECTRODE MATERIAL | ELECTRODE THICKNESS | EULER ANGLE θ |
|---|---|---|
| Ag | 0.02λ ≦ Ag ≦ 0.04λ | 70° ≦ θ ≦ 145° |
| Ag | 0.04λ < Ag ≦ 0.08λ | 70° ≦ θ ≦ 142° |
| Ni | 0.04λ ≦ Ni ≦ 0.08λ | 70° ≦ θ ≦ 153° |
| Cr | 0.02λ ≦ Cr ≦ 0.04λ | 70° ≦ θ ≦ 145° |
| Cr | 0.04λ < Cr ≦ 0.08λ | 70° ≦ θ ≦ 152° |
| Au | 0.04λ ≦ Au ≦ 0.08λ | 85° ≦ θ ≦ 119° |

In Table 11, for comparison purpose, the case in which Au is used as the metal material is also shown.

In the above Table 11, when no $SiO_2$ film is provided, the range of the electrode thickness and the range of the Euler angle θ in which the electromechanical coupling coefficient $K^2$ is about 0.2 or greater are shown for each electrode material.

In the structure in which the $SiO_2$ film is provided as a dielectric film to cover the IDT electrode, the inventors of the present invention also took the normalized film thickness of the $SiO_2$ film into consideration in addition to the electrode material and the electrode thickness, and the range of an Euler angle θ at which the electromechanical coupling coefficient $K^2$ is about 0.2 or greater was investigated. The results will be described below for each metal material.

FIGS. 12A and 12B to FIGS. 19A and 19B are views showing the relationship of the reflection coefficient with the Euler angle θ and the relationship of the electromechanical coupling coefficient $K^2$ therewith, respectively, each of which is obtained when Ag is used as the metal material and $SiO_2$ films having various normalized film thicknesses are provided.

Figure 12A:
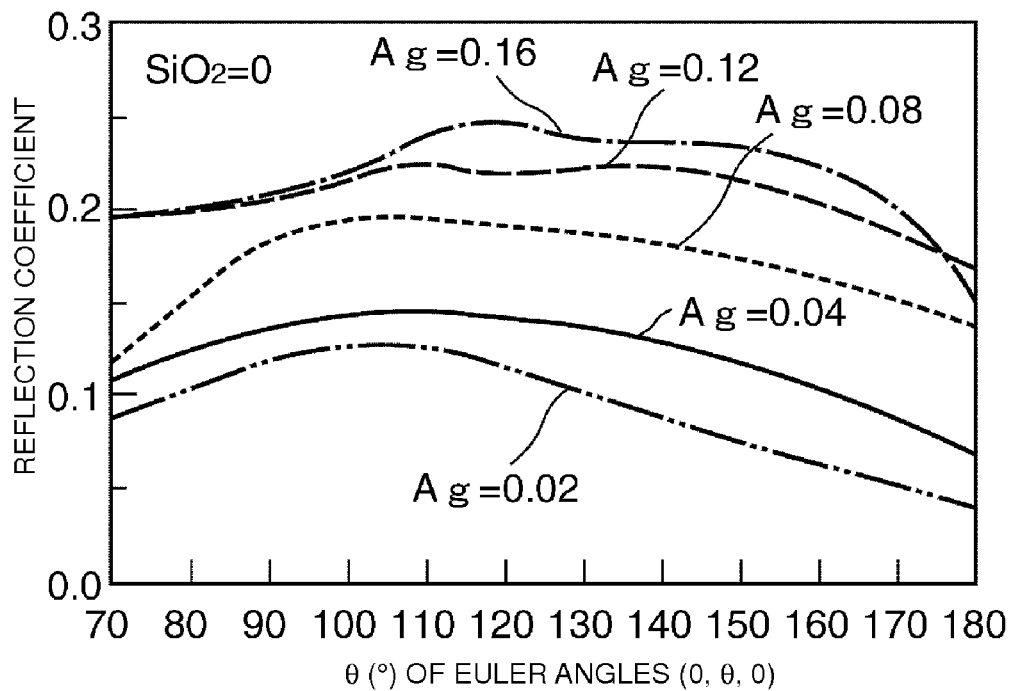
FIGS. 12A and 12B are views showing the relationship of the reflection coefficient with a normalized film thickness of a Ag film and the Euler angle θ and the relationship of the electromechanical coupling coefficient K$^2$ therewith, respectively, according to a preferred embodiment of the present invention, each of which is obtained when Ag is used as a metal material for an IDT and no SiO$_2$ film is formed.
Figure 12B:
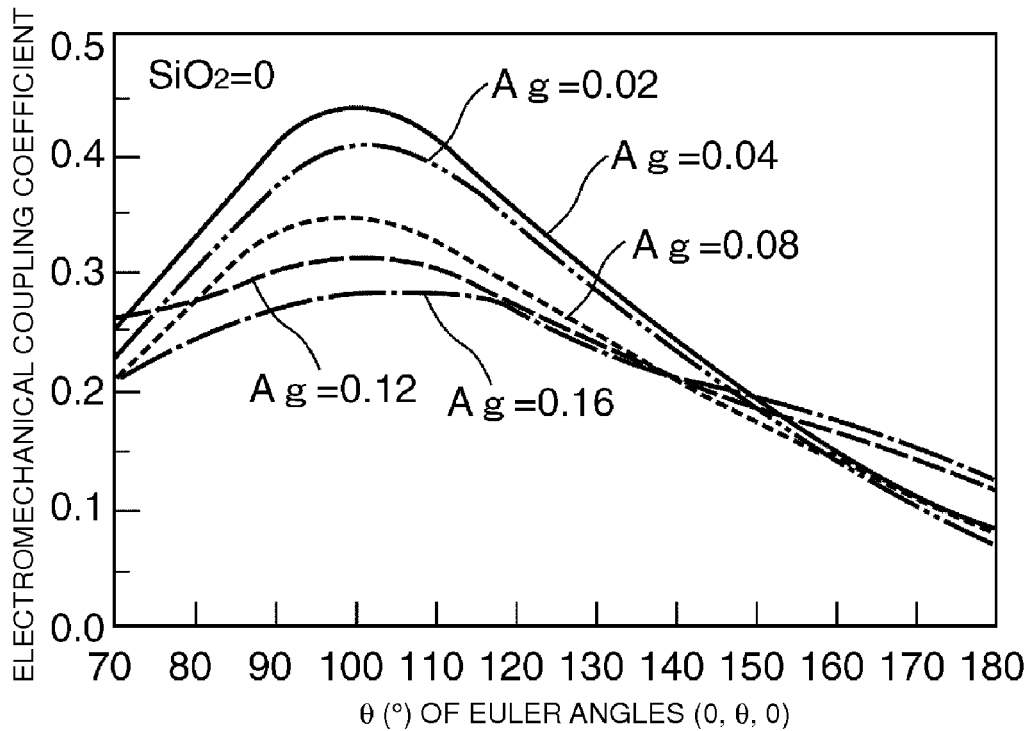
Figure 13A:
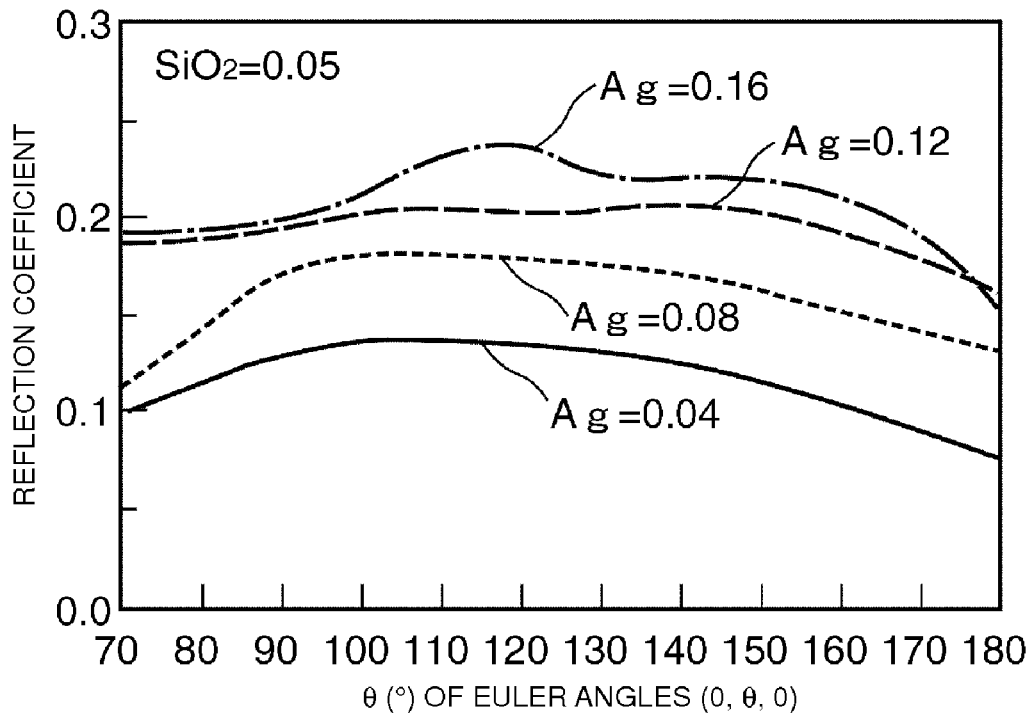
FIGS. 13A and 13B are views showing the relationship of the reflection coefficient with a normalized film thickness of a Ag film and the Euler angle θ and the relationship of the electromechanical coupling coefficient K$^2$ therewith, respectively, according to a preferred embodiment of the present invention, each of which is obtained when Ag is used as a metal material for an IDT and a normalized film thickness of an SiO$_2$ film is 0.05.
Figure 13B:
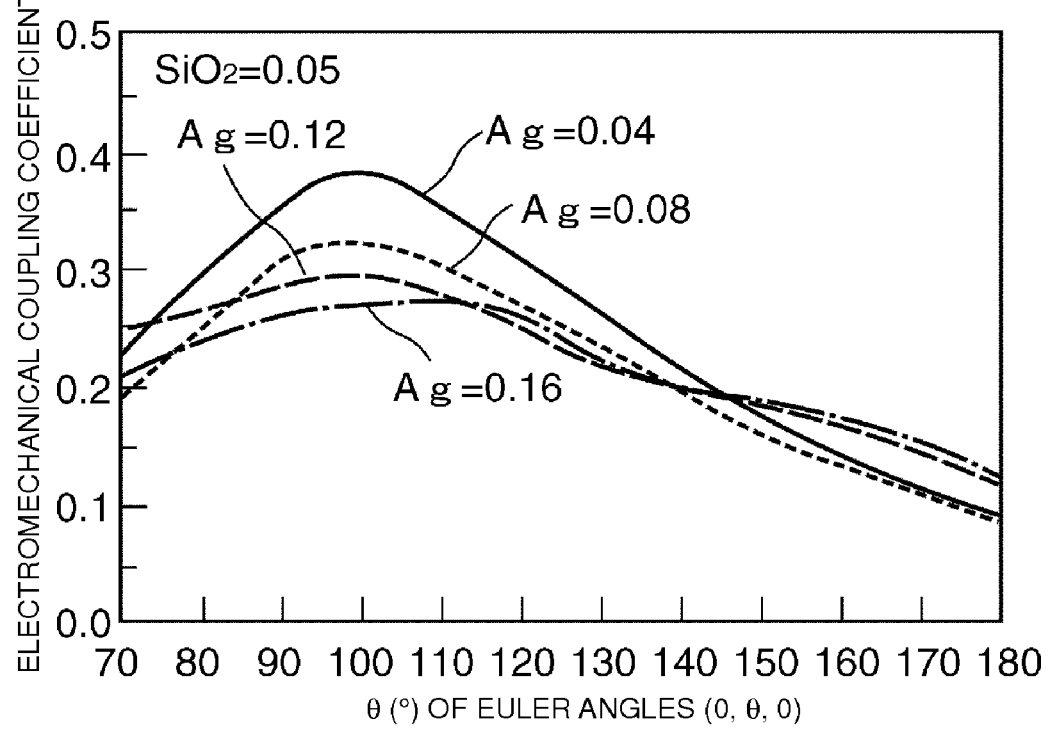
Figure 14A:
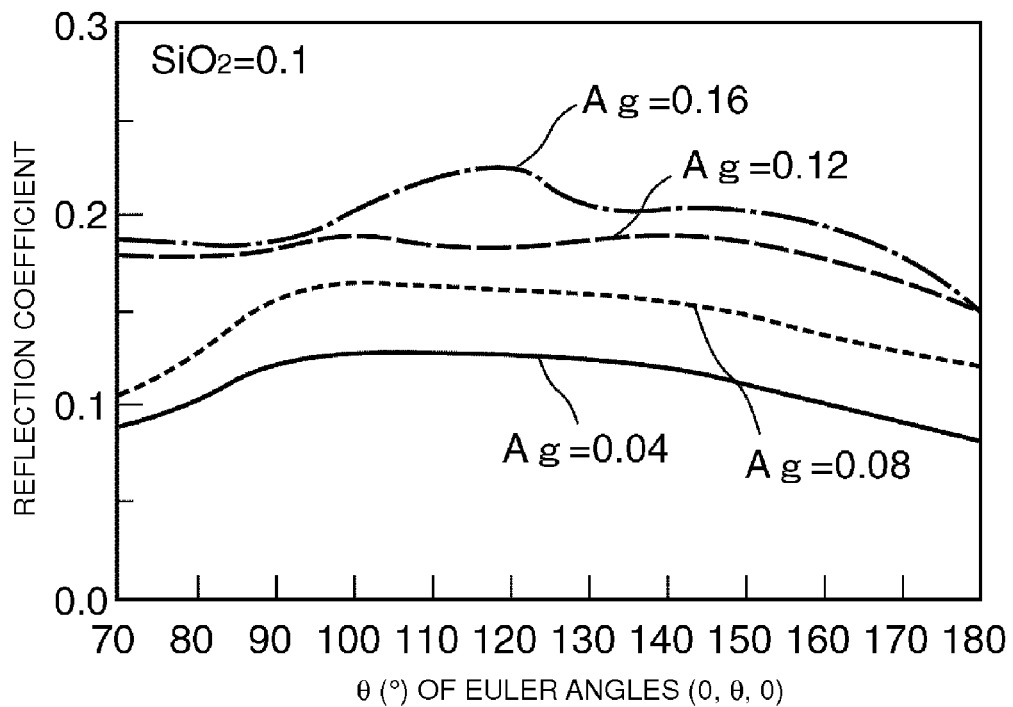
FIGS. 14A and 14B are views showing the relationship of the reflection coefficient with a normalized film thickness of a Ag film and the Euler angle θ and the relationship of the electromechanical coupling coefficient K$^2$ therewith, respectively, according to a preferred embodiment of the present invention, each of which is obtained when Ag is used as a metal material for an IDT and a normalized film thickness of an SiO$_2$ film is about 0.1.
Figure 14B:
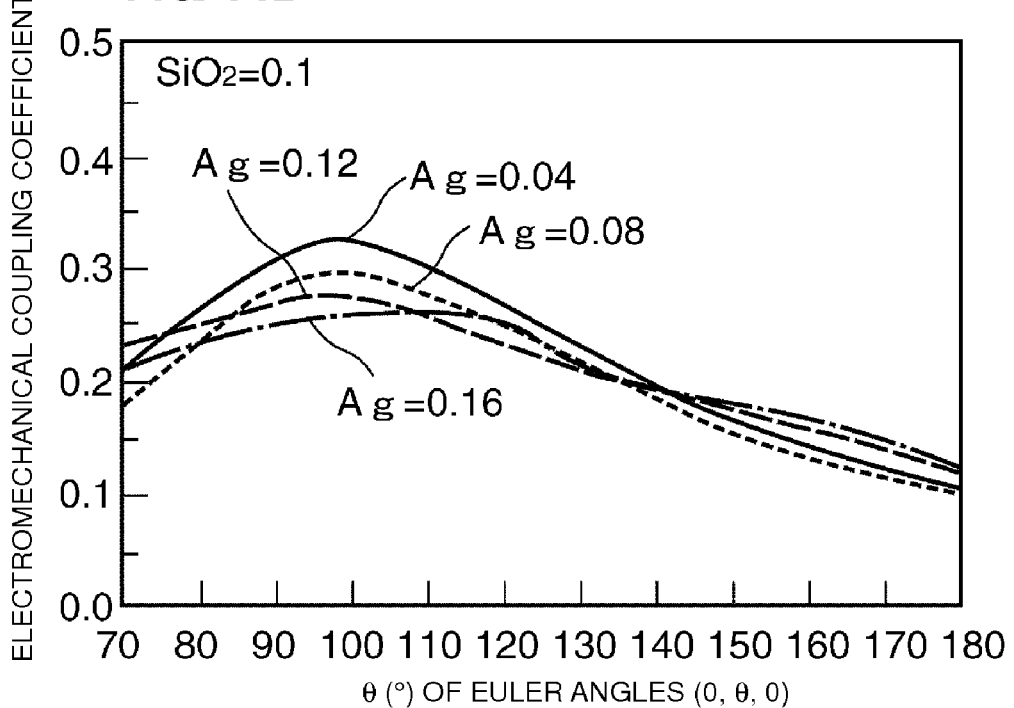
Figure 15A:
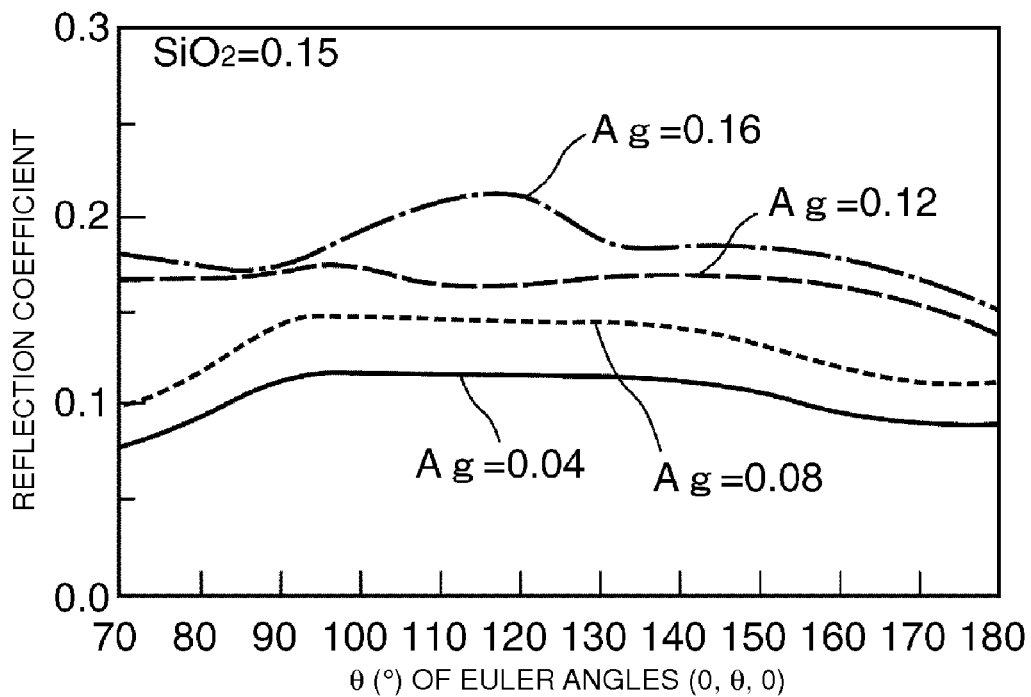
FIGS. 15A and 15B are views showing the relationship of the reflection coefficient with a normalized film thickness of a Ag film and the Euler angle θ and the relationship of the electromechanical coupling coefficient K$^2$ therewith, respectively, according to a preferred embodiment of the present invention, each of which is obtained when Ag is used as a metal material for an IDT and a normalized film thickness of an SiO$_2$ film is about 0.15.
Figure 15B:
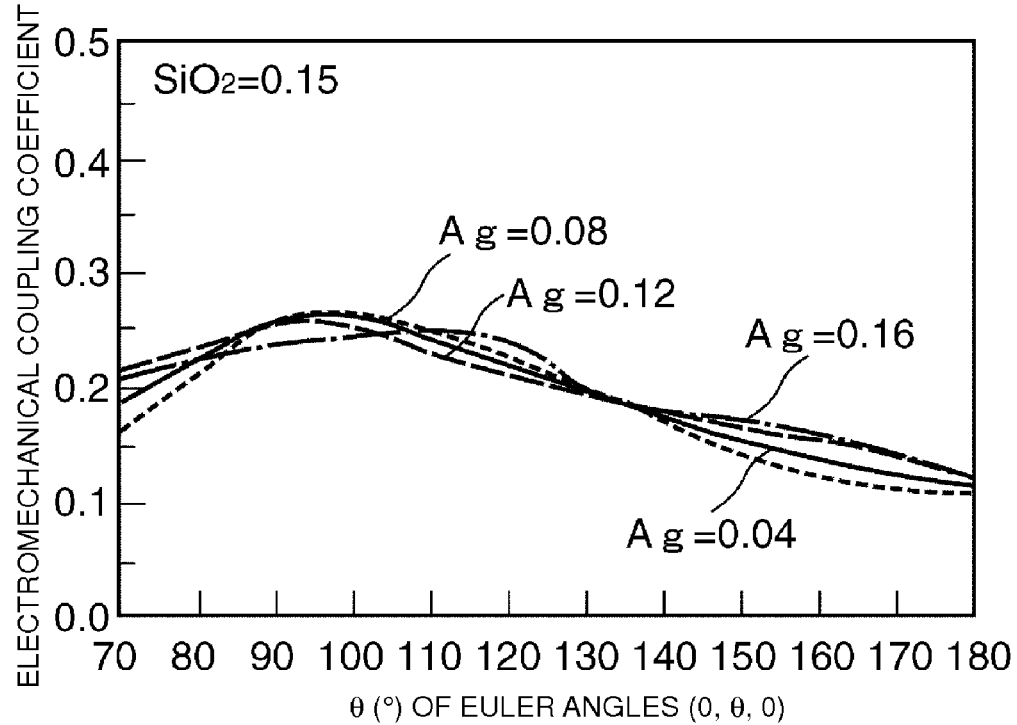
Figure 16A:
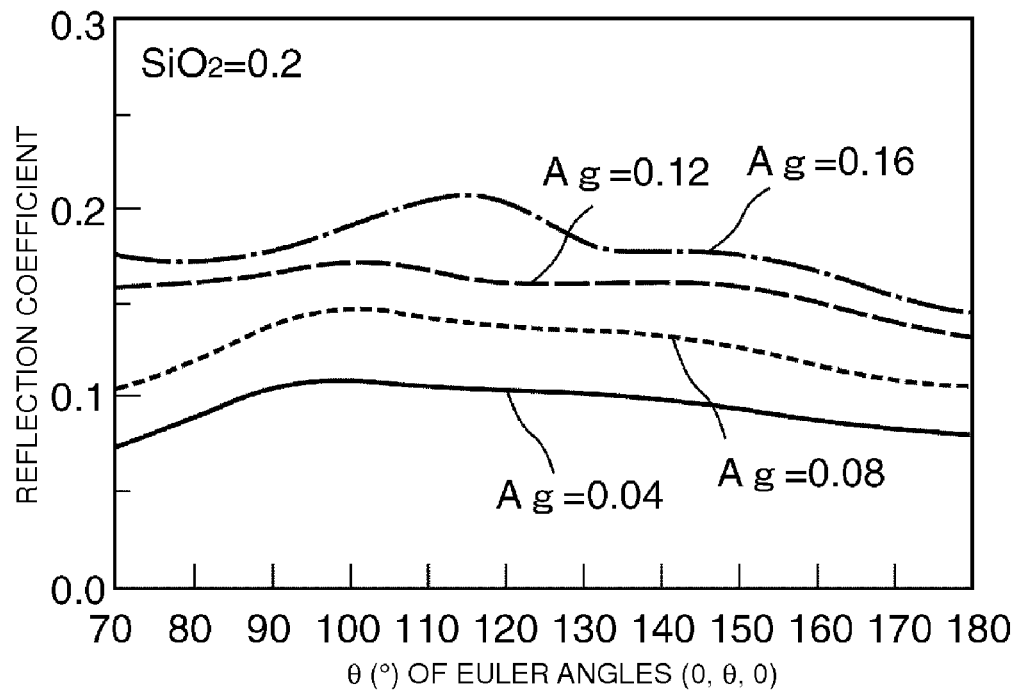
FIGS. 16A and 16B are views showing the relationship of the reflection coefficient with a normalized film thickness of a Ag film and the Euler angle θ and the relationship of the electromechanical coupling coefficient K$^2$ therewith, respectively, according to a preferred embodiment of the present invention, each of which is obtained when Ag is used as a metal material for an IDT and a normalized film thickness of an SiO$_2$ film is about 0.2.
Figure 16B:
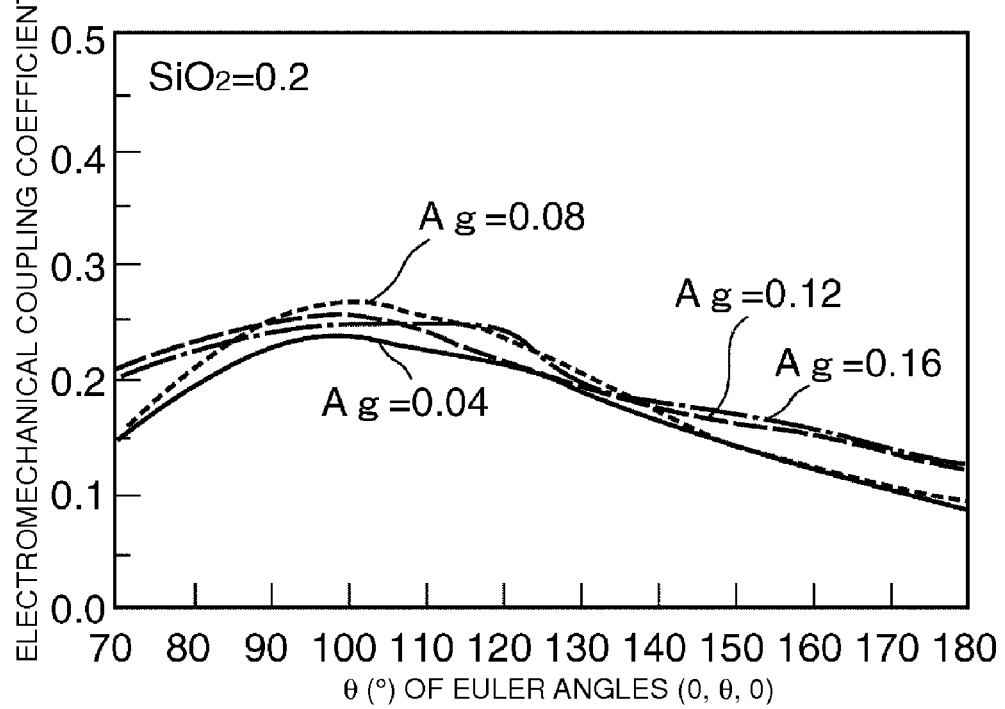
Figure 17A:
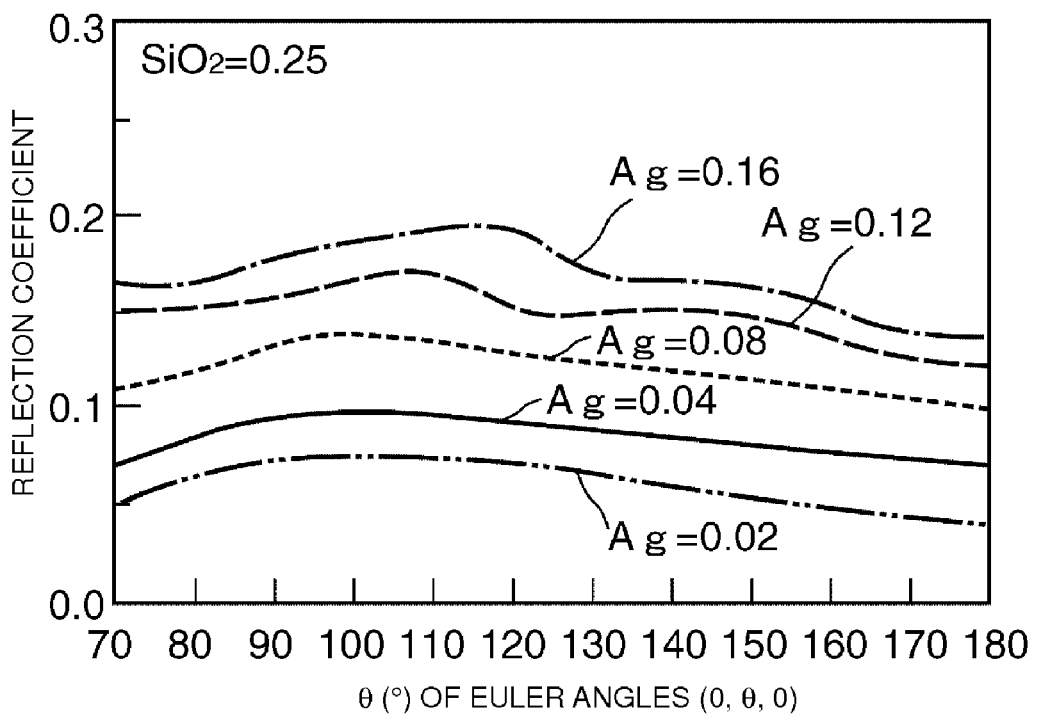
FIGS. 17A and 17B are views showing the relationship of the reflection coefficient with a normalized film thickness of a Ag film and the Euler angle θ and the relationship of the electromechanical coupling coefficient K$^2$ therewith, respectively, according to a preferred embodiment of the present invention, each of which is obtained when Ag is used as a metal material for an IDT and a normalized film thickness of an SiO$_2$ film is about 0.25.
Figure 17B:
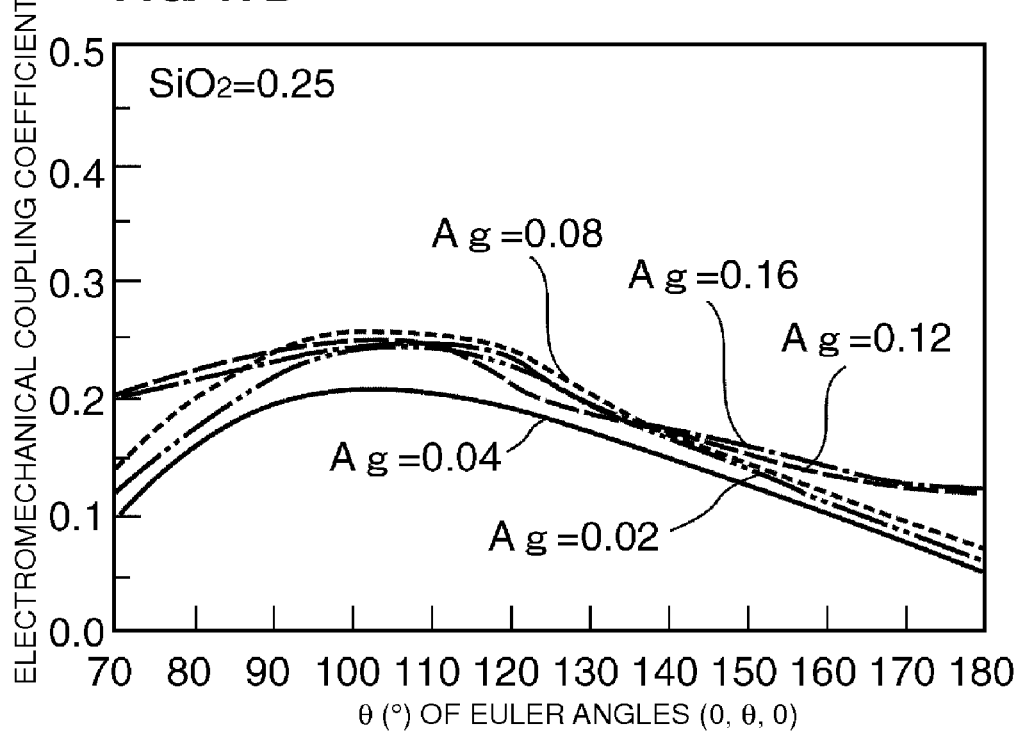
Figure 18A:
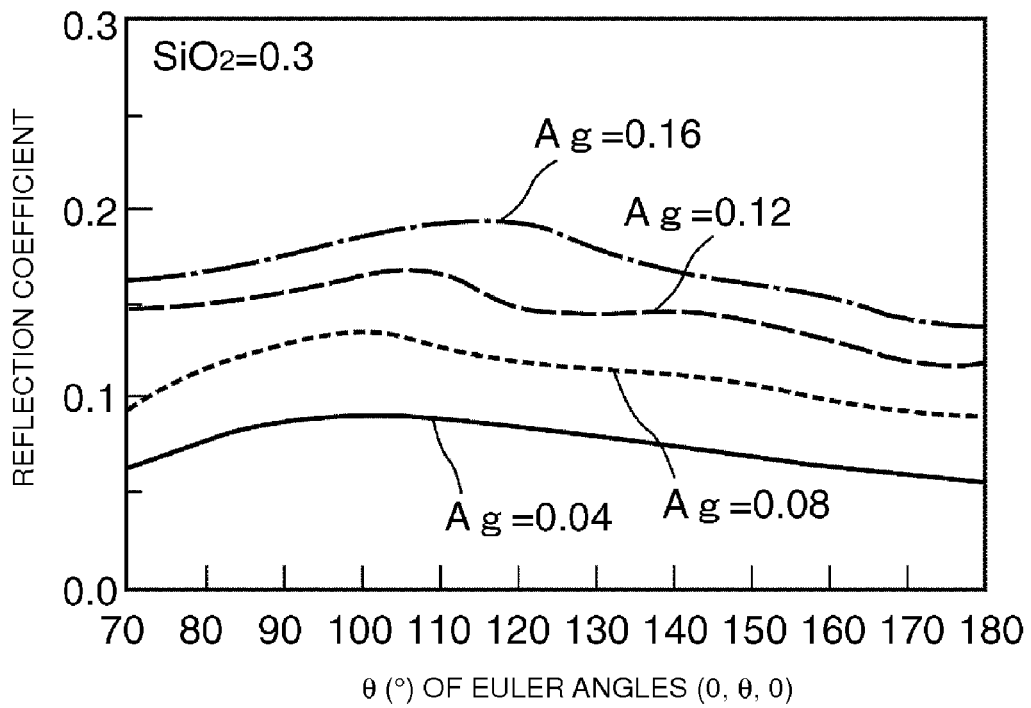
FIGS. 18A and 18B are views showing the relationship of the reflection coefficient with a normalized film thickness of a Ag film and the Euler angle θ and the relationship of the electromechanical coupling coefficient K$^2$ therewith, respectively, according to a preferred embodiment of the present invention, each of which is obtained when Ag is used as a metal material for an IDT and a normalized film thickness of an SiO$_2$ film is about 0.3.
Figure 18B:
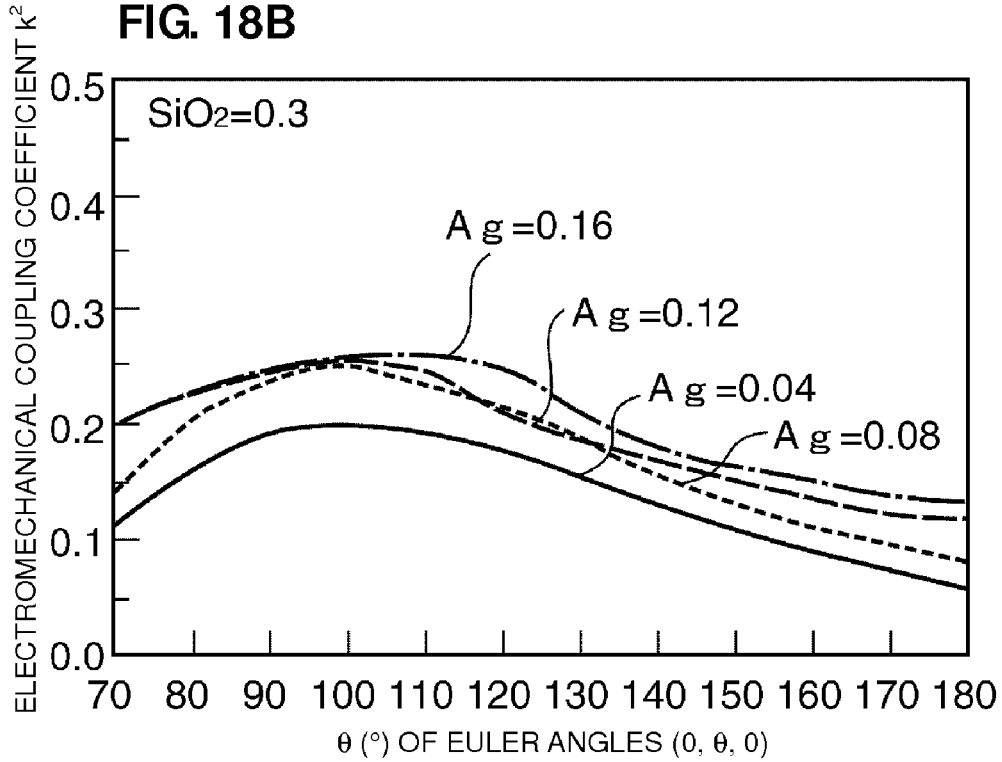
Figure 19A:
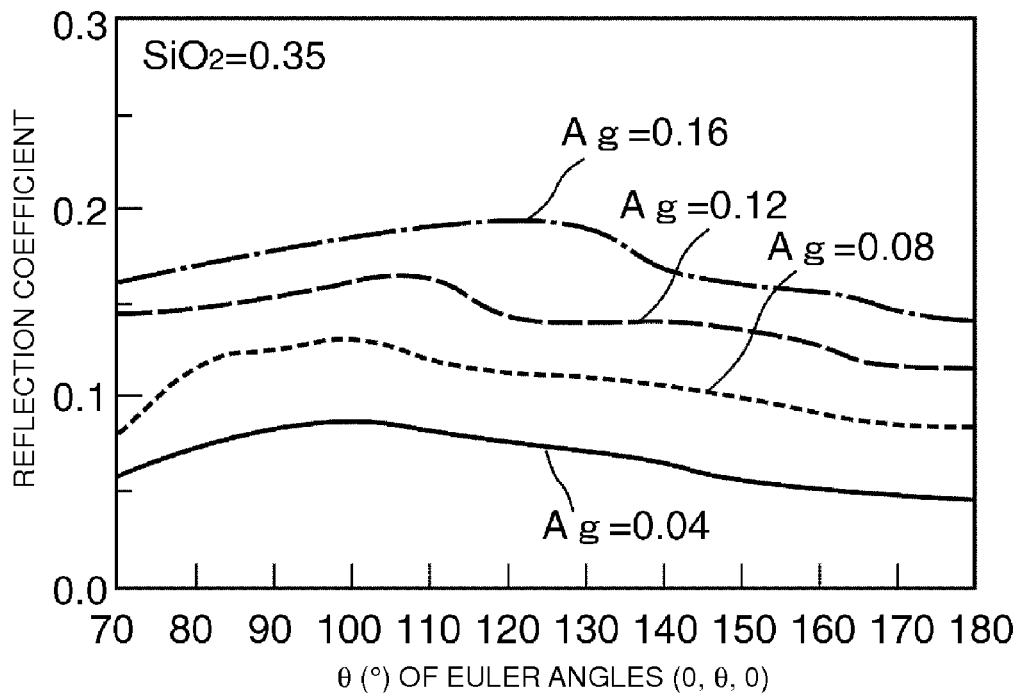
FIGS. 19A and 19B are views showing the relationship of the reflection coefficient with a normalized film thickness of a Ag film and the Euler angle θ and the relationship of the electromechanical coupling coefficient K$^2$ therewith, respectively, according to a preferred embodiment of the present invention, each of which is obtained when Ag is used as a metal material for an IDT and a normalized film thickness of an SiO$_2$ film is about 0.35.
Figure 19B:
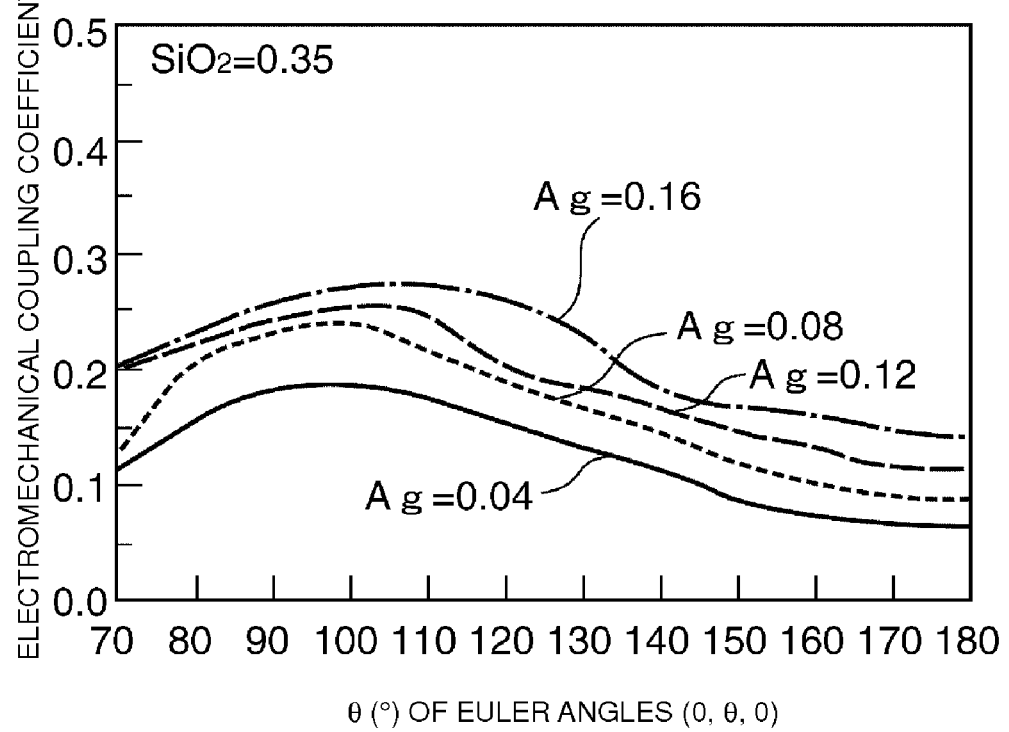

In addition, FIGS. 12A and 12B show the results obtained when the normalized film thickness of the $SiO_2$ film is 0, that is, when no $SiO_2$ film is provided, and FIGS. 13A to 19B show the results obtained when the normalized film thickness of the $SiO_2$ film is about 0.05, about 0.1, about 0.15, about 0.2, about 0.25, about 0.3, or about 0.35, for example. In addition, the film of Ag used as the metal material for the IDT 3 and the reflectors 5 and 6 has various normalized film thicknesses as shown in FIGS. 12A to 19B. As shown in FIG. 4 described above, when Ag is used as the metal material, as compared to the case in which Al is used, a high reflection coefficient can be obtained regardless of the range of the Euler angle θ. In FIG. 12A to FIG. 19A, it was also discovered that even when the normalized film thickness of the Ag film is variously changed, a high reflection coefficient can be obtained regardless of the value of the Euler angle θ.

On the other hand, as shown in FIG. 12B to FIG. 19B, it was discovered that when the normalized film thickness of Ag is in the range of about 0.04 to about 0.08, if the range of the normalized film thickness of the $SiO_2$ film and the range of the Euler angle θ correspond to one of combinations shown in Table 12 below, the electromechanical coupling coefficient $K^2$ can be made about 0.2 or greater. In addition, in Table 12 below, the lower limit and the upper limit of the range of the Euler angle θ are shown. For example, it indicates that when the film thickness of the $SiO_2$ film is about 0.05 or less, the Euler angle θ may be set in the range of about 72° to about 139°.

In addition, when the film thickness of the Ag film is in the range of about 0.08 to about 0.12, the range of the film thickness of the $SiO_2$ film and the range of the Euler angle θ may correspond to one of the combinations shown in Table 13 below, and when the normalized film thickness of the Ag film is in the range of about 0.12 to about 0.16, the range of the film thickness of the $SiO_2$ film and the range of the Euler angle θ may correspond to one of combinations shown in Table 14 below, so that the electromechanical coupling coefficient $K^2$ is about 0.2 or greater. Tables 12 to 14 are based on the results shown in FIGS. 12A to 19B described above.

TABLE 12

| | RANGE OF EULER ANGLE TO SATISFY 0.2 ≧ $K^2$ | |
|---|---|---|
| 4 ≦ FILM THICKNESS OF Ag ≦ 8 | LOWER LIMIT OF EULER ANGLE θ | UPPER LIMIT OF EULER ANGLE θ |
| 0 ≦ FILM THICKNESS OF $SiO_2$ ≦ 5 | 72 | 139 |
| 5 < FILM THICKNESS OF $SiO_2$ ≦ 10 | 75 | 136 |
| 10 < FILM THICKNESS OF $SiO_2$ ≦ 15 | 78 | 128 |
| 15 < FILM THICKNESS OF $SiO_2$ ≦ 20 | 82 | 122 |
| 20 < FILM THICKNESS OF $SiO_2$ ≦ 25 | 91 | 115 |
| 25 < FILM THICKNESS OF $SiO_2$ ≦ 30 | 97 | 101 |
| 30 < FILM THICKNESS OF $SiO_2$ ≦ 35 | — | — |

(The film thickness of Ag and the film thickness of $SiO_2$ in the table each indicate the value of the normalized film thickness × $10^2$.)

TABLE 13

| | RANGE OF EULER ANGLE TO SATISFY 0.2 ≧ $K^2$ | |
|---|---|---|
| 8 < FILM THICKNESS OF Ag ≦ 12 | LOWER LIMIT OF EULER ANGLE θ | UPPER LIMIT OF EULER ANGLE θ |
| 0 ≦ FILM THICKNESS OF $SiO_2$ ≦ 5 | 72 | 139 |
| 5 < FILM THICKNESS OF $SiO_2$ ≦ 10 | 75 | 136 |
| 10 < FILM THICKNESS OF $SiO_2$ ≦ 15 | 78 | 126 |
| 15 < FILM THICKNESS OF $SiO_2$ ≦ 20 | 80 | 122 |
| 20 < FILM THICKNESS OF $SiO_2$ ≦ 25 | 81 | 122 |
| 25 < FILM THICKNESS OF $SiO_2$ ≦ 30 | 81 | 123 |
| 30 < FILM THICKNESS OF $SiO_2$ ≦ 35 | — | — |

(The film thickness of Ag and the film thickness of $SiO_2$ in the table each indicate the value of the normalized film thickness × $10^2$.)

TABLE 14

| 12 < FILM THICKNESS OF Ag ≤ 16 | RANGE OF EULER ANGLE TO SATISFY 0.2 ≥ K² | |
|---|---|---|
| | LOWER LIMIT OF EULER ANGLE θ | UPPER LIMIT OF EULER ANGLE θ |
| 0 ≤ FILM THICKNESS OF SiO₂ ≤ 5 | 70 | 140 |
| 5 < FILM THICKNESS OF SiO₂ ≤ 10 | 70 | 136 |
| 10 < FILM THICKNESS OF SiO₂ ≤ 15 | 70 | 126 |
| 15 < FILM THICKNESS OF SiO₂ ≤ 20 | 70 | 122 |
| 20 < FILM THICKNESS OF SiO₂ ≤ 25 | 73 | 122 |
| 25 < FILM THICKNESS OF SiO₂ ≤ 30 | 73 | 123 |
| 30 < FILM THICKNESS OF SiO₂ ≤ 35 | 73 | 122 |

(The film thickness of Ag and the film thickness of SiO₂ in the table each indicate the value of the normalized film thickness × 10².)

FIGS. 20A and 20B to FIGS. 27A and 27B are views showing the relationship of the reflection coefficient with the Euler angle θ and the relationship of the electromechanical coupling coefficient $K^2$ therewith, respectively, each of which is obtained when Ni is used as the metal material and SiO₂ films having various normalized film thicknesses are formed.

Figure 20A:
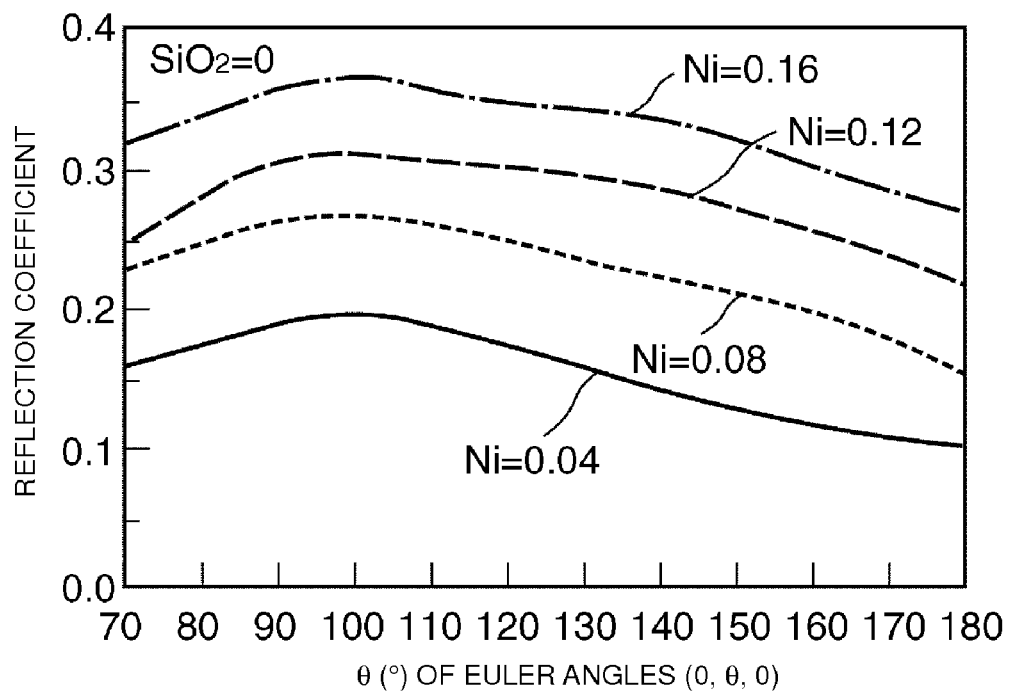
FIGS. 20A and 20B are views showing the relationship of the reflection coefficient with a normalized film thickness of a Ni film and the Euler angle θ and the relationship of the electromechanical coupling coefficient K$^2$ therewith, respectively, according to a preferred embodiment of the present invention, each of which is obtained when Ni is used as a metal material for an IDT and no SiO$_2$ film is provided.
Figure 20B:
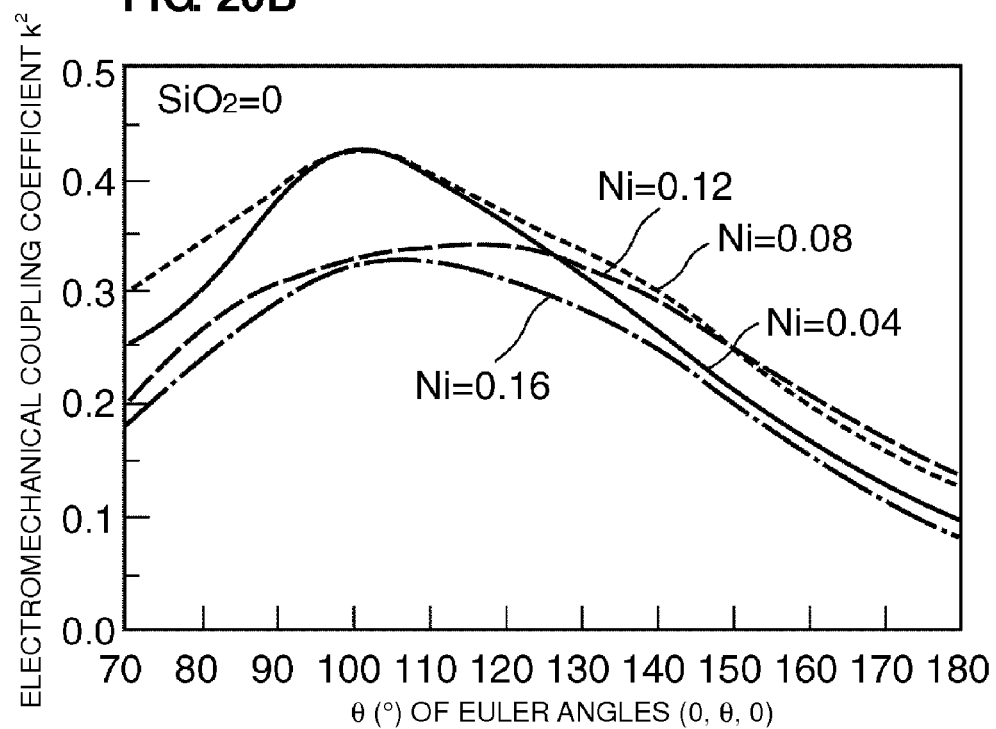
Figure 21A:
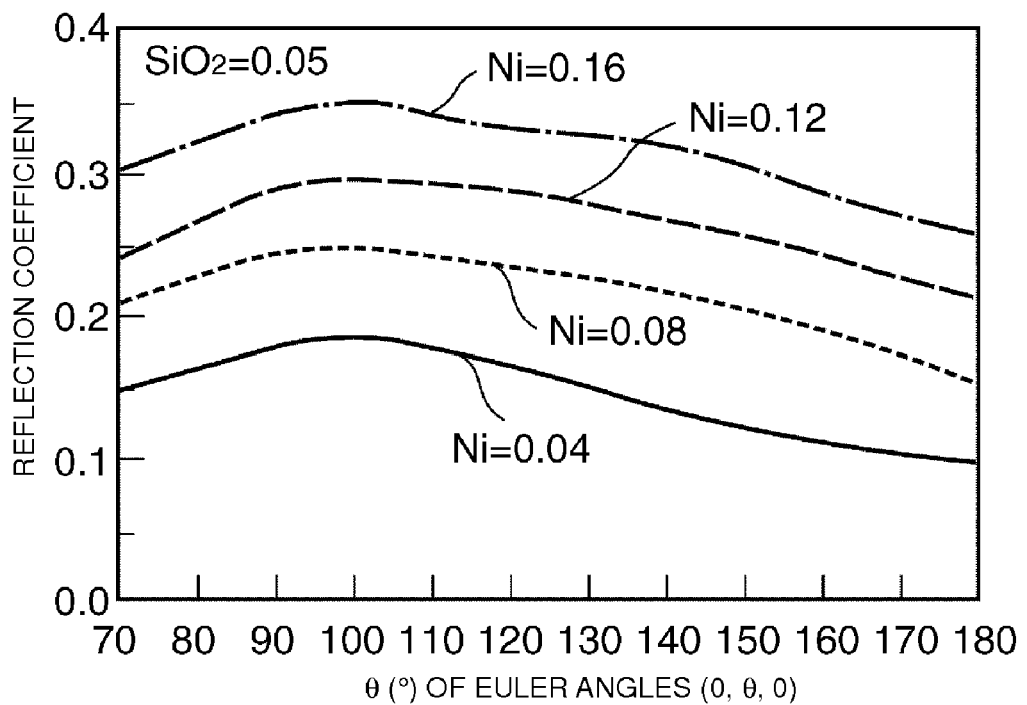
FIGS. 21A and 21B are views showing the relationship of the reflection coefficient with a normalized film thickness of a Ni film and the Euler angle θ and the relationship of the electromechanical coupling coefficient K$^2$ therewith, respectively, according to a preferred embodiment of the present invention, each of which is obtained when Ni is used as a metal material for an IDT and a normalized film thickness of an SiO$_2$ film is about 0.05.
Figure 21B:
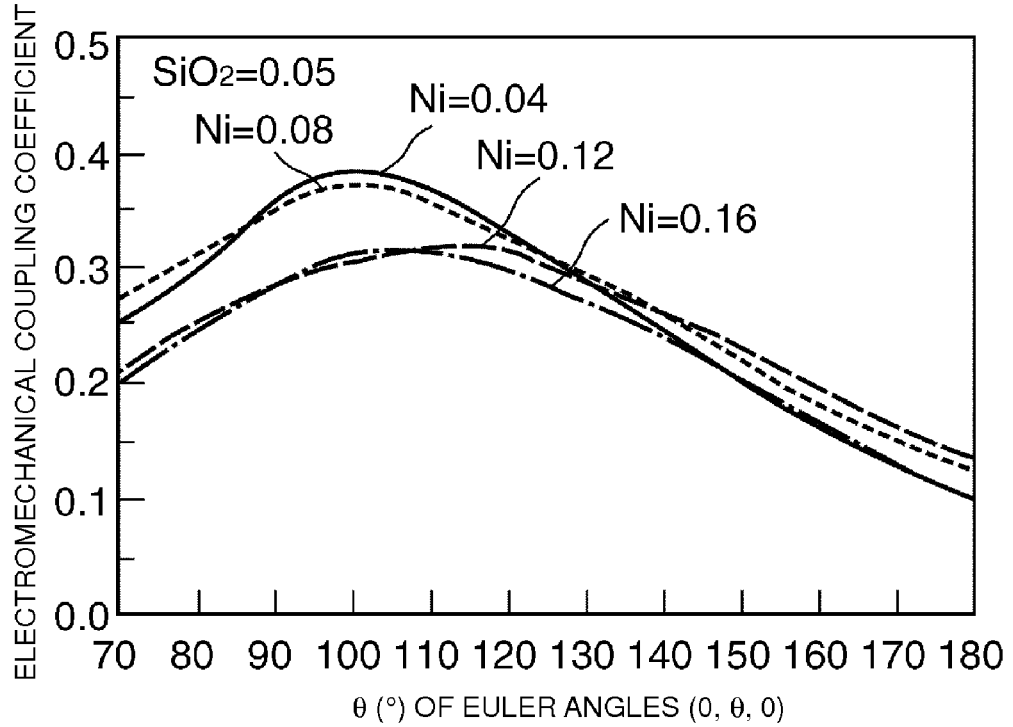
Figure 22A:
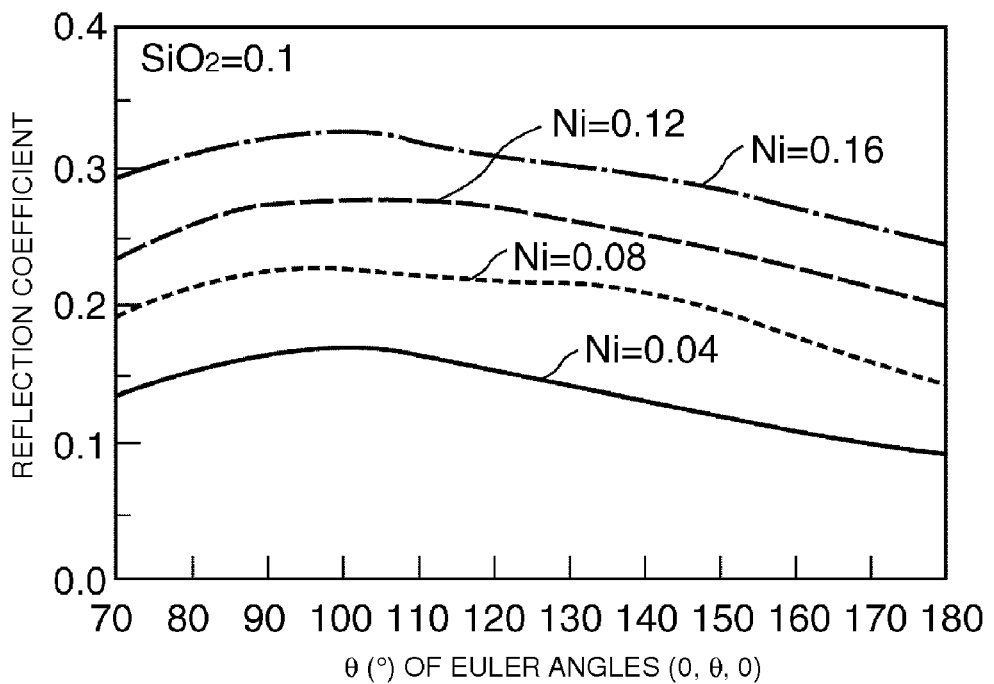
FIGS. 22A and 22B are views showing the relationship of the reflection coefficient with a normalized film thickness of a Ni film and the Euler angle θ and the relationship of the electromechanical coupling coefficient K$^2$ therewith, respectively, according to a preferred embodiment of the present invention, each of which is obtained when Ni is used as a metal material for an IDT and a normalized film thickness of an SiO$_2$ film is about 0.1.
Figure 22B:
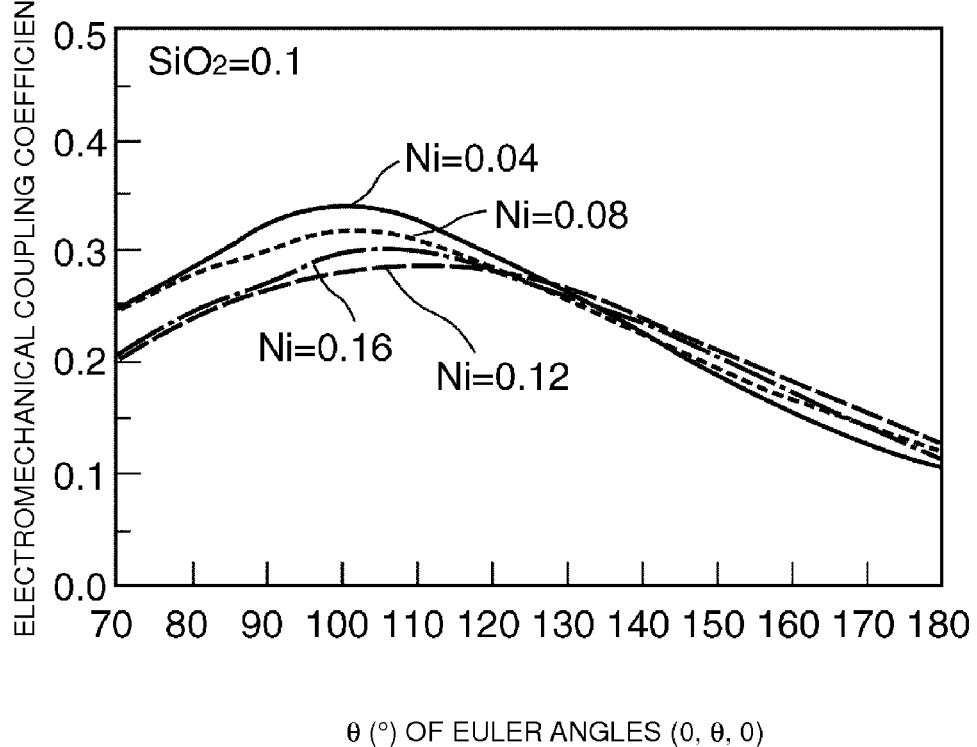
Figure 23A:
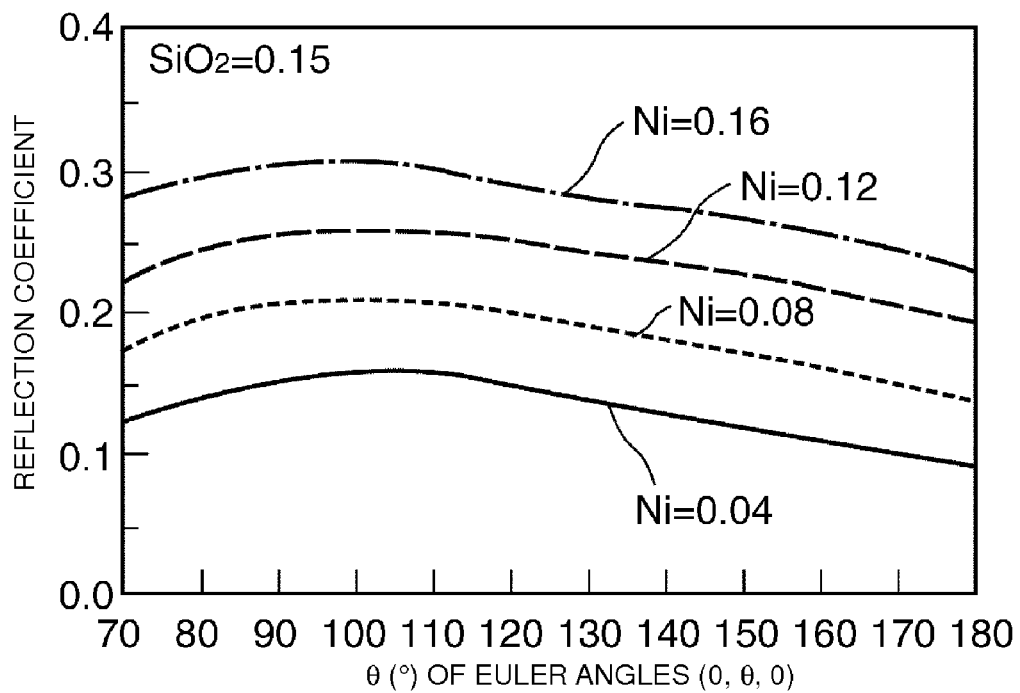
FIGS. 23A and 23B are views showing the relationship of the reflection coefficient with a normalized film thickness of a Ni film and the Euler angle θ and the relationship of the electromechanical coupling coefficient $K^2$ therewith, respectively, according to a preferred embodiment of the present invention, each of which is obtained when Ni is used as a metal material for an IDT and a normalized film thickness of an $SiO_2$ film is about 0.15.
Figure 23B:
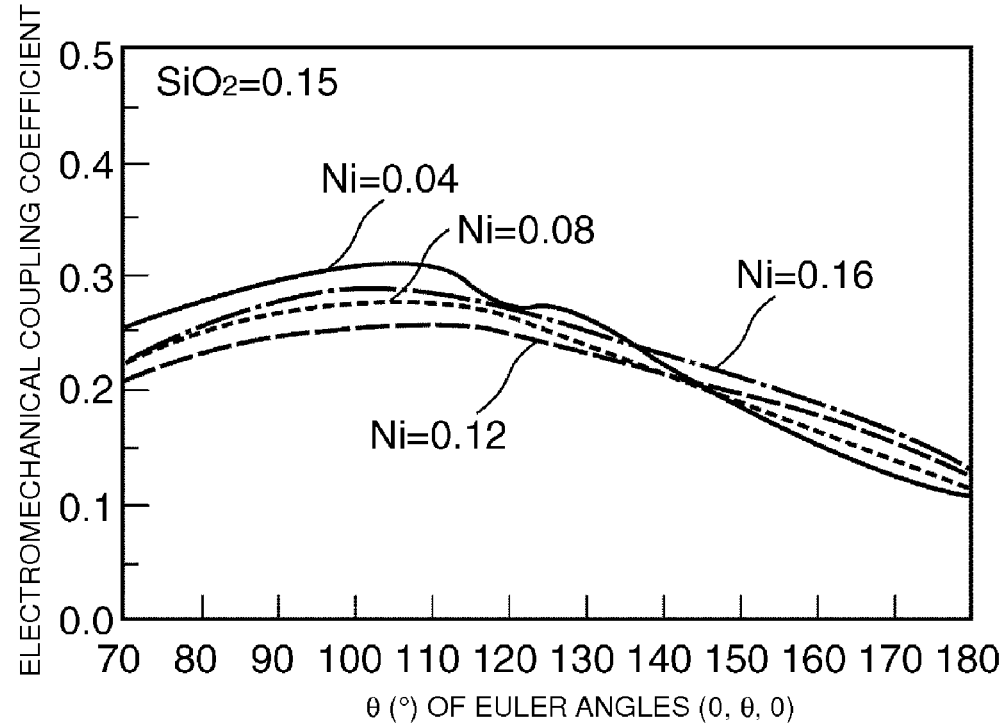
Figure 24A:
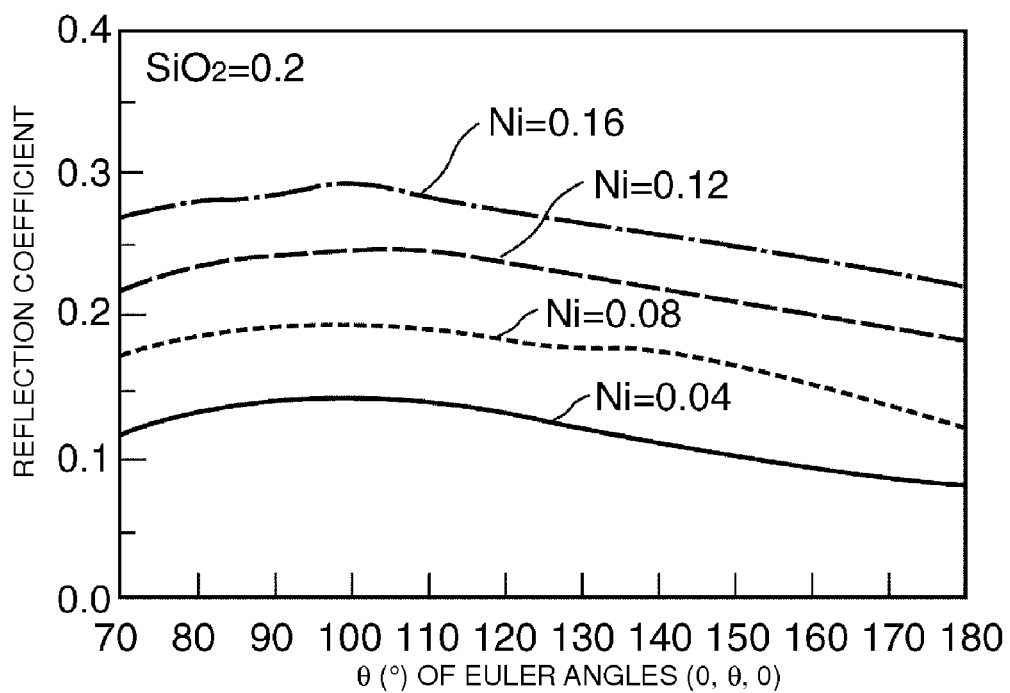
FIGS. 24A and 24B are views showing the relationship of the reflection coefficient with a normalized film thickness of a Ni film and the Euler angle θ and the relationship of the electromechanical coupling coefficient $K^2$ therewith, respectively, according to a preferred embodiment of the present invention, each of which is obtained when Ni is used as a metal material for an IDT and a normalized film thickness of an $SiO_2$ film is about 0.2.
Figure 24B:
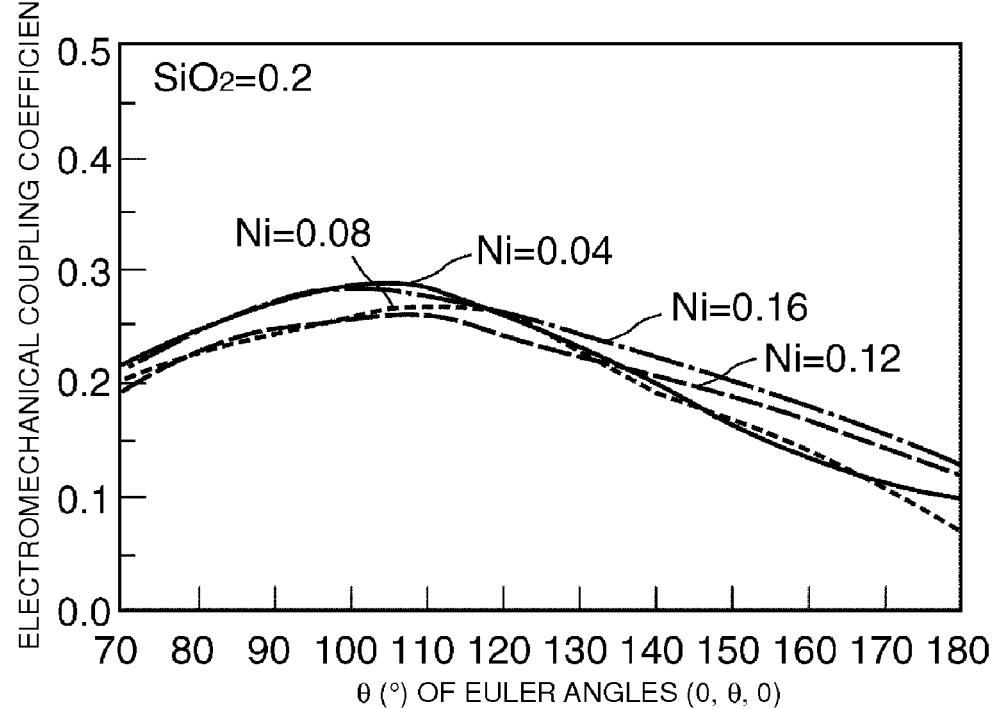
Figure 25A:
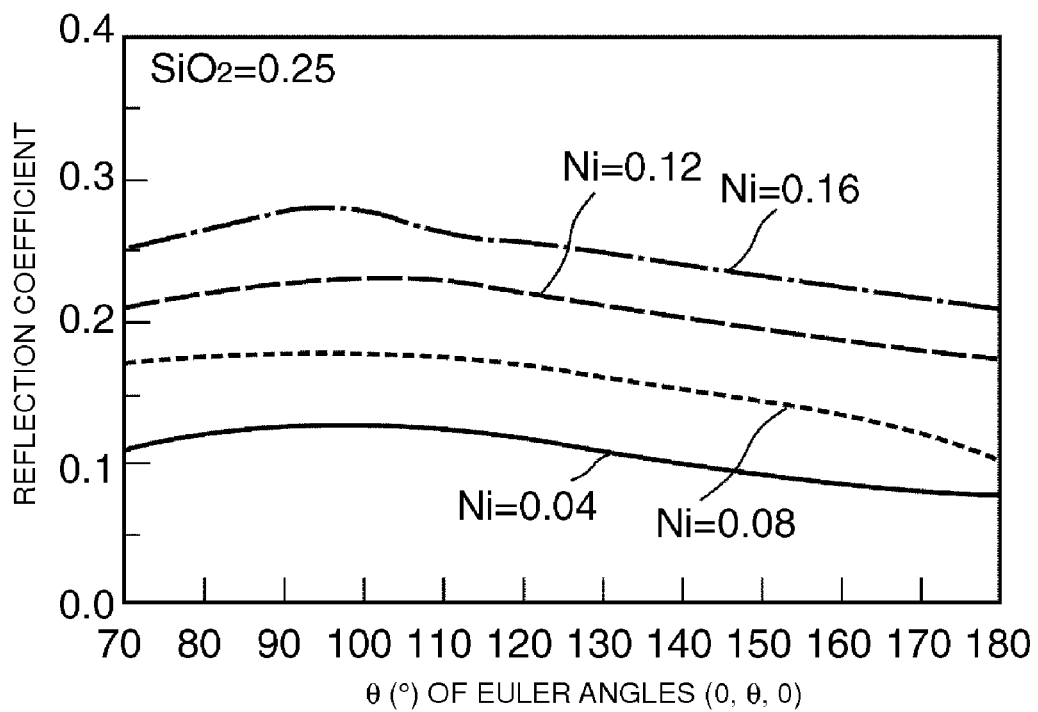
FIGS. 25A and 25B are views showing the relationship of the reflection coefficient with a normalized film thickness of a Ni film and the Euler angle θ and the relationship of the electromechanical coupling coefficient $K^2$ therewith, respectively, according to a preferred embodiment of the present invention, each of which is obtained when Ni is used as a metal material for an IDT and a normalized film thickness of an $SiO_2$ film is about 0.25.
Figure 25B:
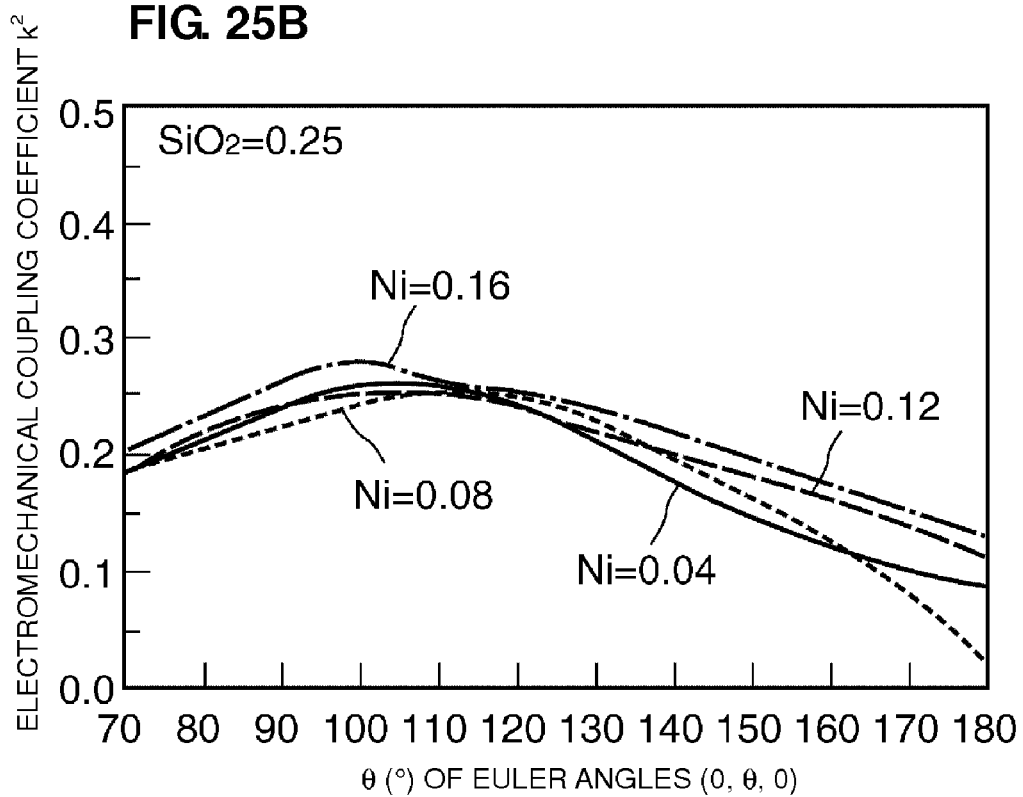
Figure 26A:
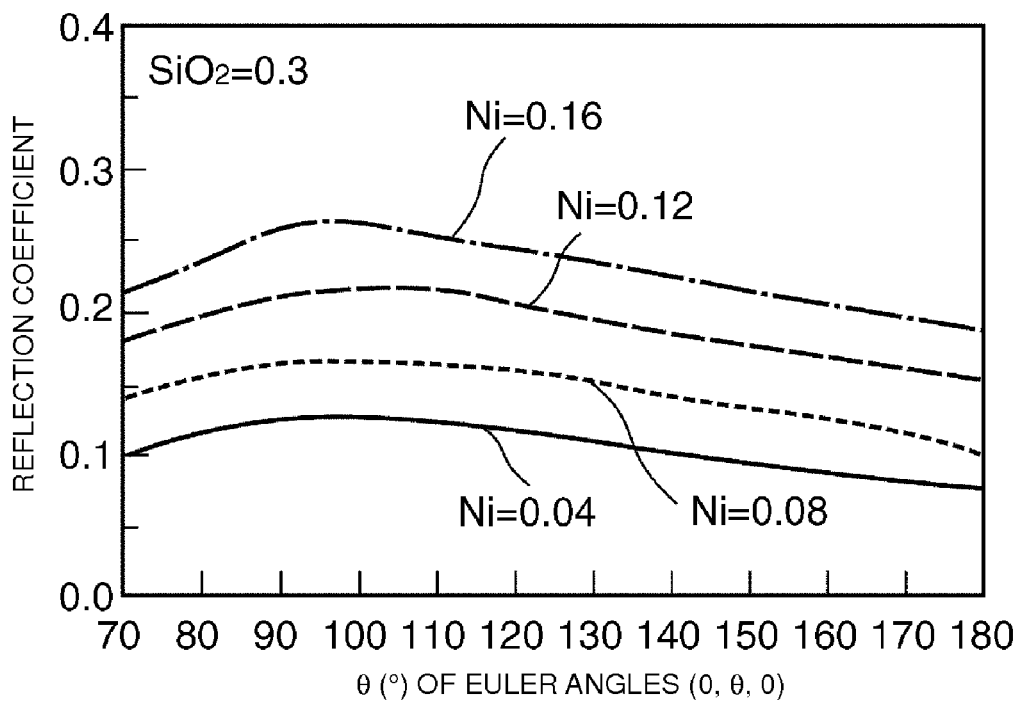
FIGS. 26A and 26B are views showing the relationship of the reflection coefficient with a normalized film thickness of a Ni film and the Euler angle θ and the relationship of the electromechanical coupling coefficient $K^2$ therewith, respectively, according to a preferred embodiment of the present invention, each of which is obtained when Ni is used as a metal material for an IDT and a normalized film thickness of an $SiO_2$ film is about 0.3.
Figure 26B:
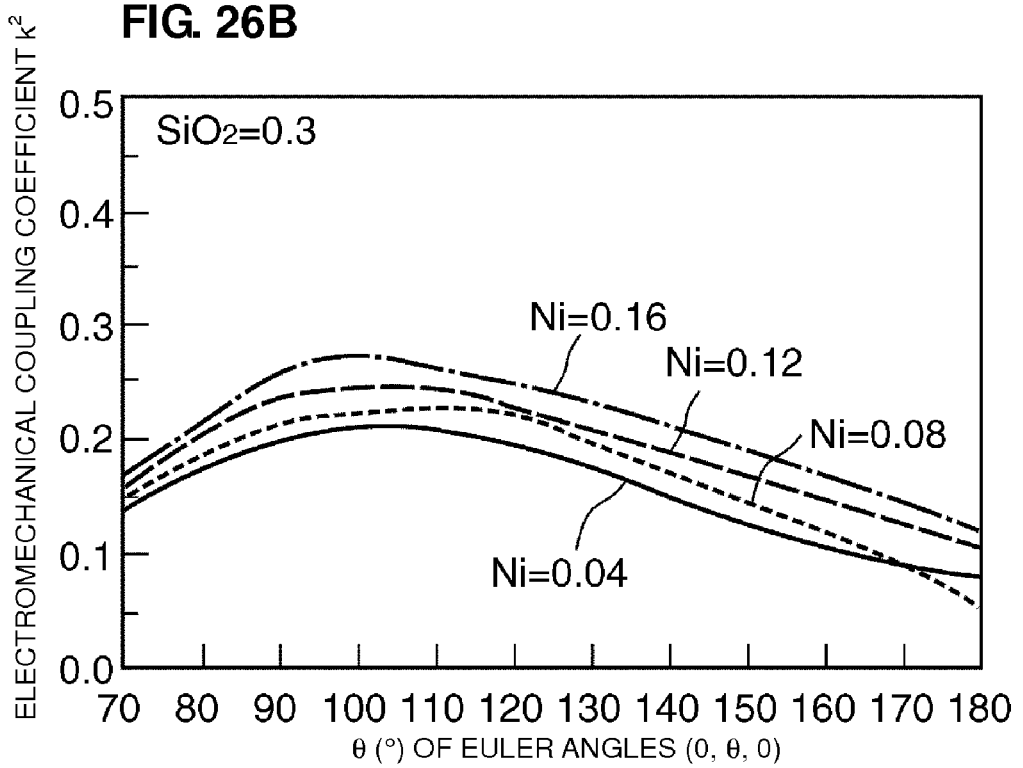
Figure 27A:
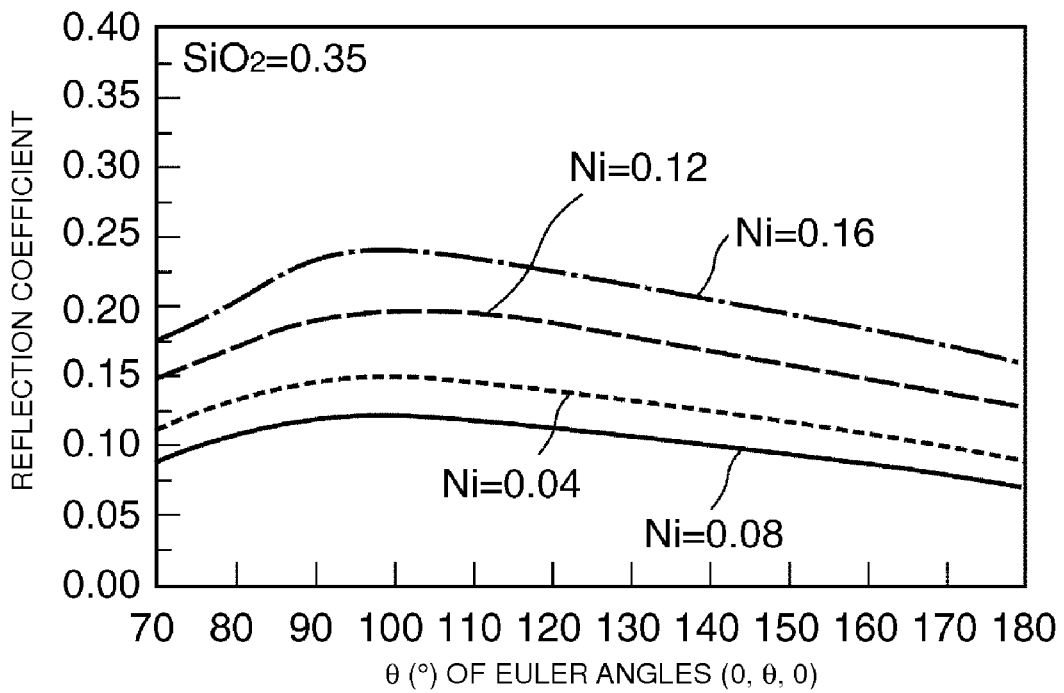
FIGS. 27A and 27B are views showing the relationship of the reflection coefficient with a normalized film thickness of a Ni film and the Euler angle θ and the relationship of the electromechanical coupling coefficient $K^2$ therewith, respectively, according to a preferred embodiment of the present invention, each of which is obtained when Ni is used as a metal material for an IDT and a normalized film thickness of an $SiO_2$ film is about 0.35.
Figure 27B:
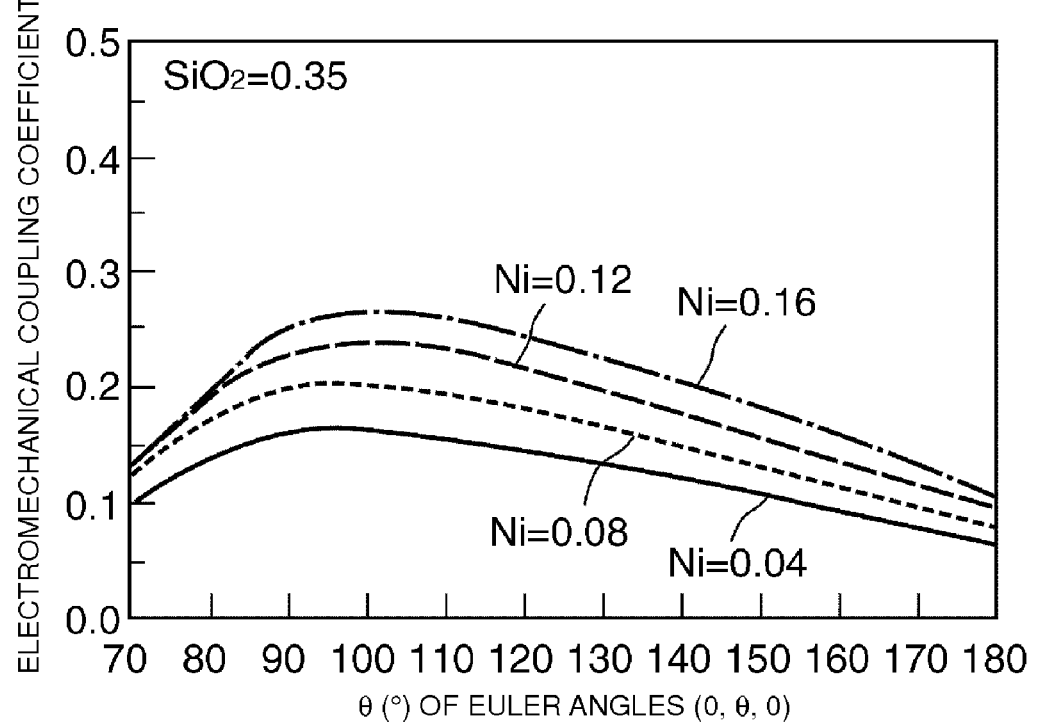

In addition, FIGS. 20A and 20B show results obtained when the normalized film thickness of the SiO₂ film is 0, that is, when no SiO₂ film is provided, and FIGS. 21A to 27B show results obtained when the normalized film thickness of the SiO₂ film is about 0.05, about 0.1, about 0.15, about 0.2, about 0.25, about 0.3, or about 0.35, for example. In addition, the film of Ni used as the metal material for the IDT 3 and the reflectors 5 and 6 has various normalized film thicknesses as shown in FIGS. 20A to 27B. As shown in FIG. 2 described above, when Ni is used as the metal material, as compared to the case in which Al is used, a high reflection coefficient can be obtained regardless of the range of the Euler angle θ. In FIG. 20A to FIG. 27A, it was also discovered that even when the normalized film thickness of the Ni film is variously changed, a high reflection coefficient can be obtained regardless of the value of the Euler angle θ.

On the other hand, as shown in FIG. 20B to FIG. 27B, it was discovered that when the normalized film thickness of Ni is in the range of about 0.04 to about 0.08, if the range of the normalized film thickness of the SiO₂ film and the range of the Euler angle θ correspond to one of combinations shown in Table 15 below, the electromechanical coupling coefficient $K^2$ is 0.2 or greater. In addition, in Table 15, the lower limit and the upper limit of the range of the Euler angle θ are shown. For example, Table 15 indicates that when the film thickness of the SiO₂ film is about 0.05 or less, the Euler angle θ may be set in the range of about 70° to about 150°.

In addition, when the film thickness of the Ni film is in the range of about 0.08 to about 0.12, the range of the film thickness of the SiO₂ film and the range of the Euler angle θ may correspond to one of combinations shown in Table 16 below, and when the normalized film thickness of the Ni film is in the range of about 0.12 to about 0.16, the range of the film thickness of the SiO₂ film and the range of the Euler angle θ may correspond to one of combinations shown in Table 17 below, so that the electromechanical coupling coefficient $K^2$ is about 0.2 or greater. Tables 15 to 17 are based on the results shown in FIGS. 20A to 27B described above.

TABLE 15

| 4 ≤ FILM THICKNESS OF Ni ≤ 8 | RANGE OF EULER ANGLE TO SATISFY 0.2 ≥ K² | |
|---|---|---|
| | LOWER LIMIT OF EULER ANGLE θ | UPPER LIMIT OF EULER ANGLE θ |
| 0 ≤ FILM THICKNESS OF SiO₂ ≤ 5 | 70 | 150 |
| 5 < FILM THICKNESS OF SiO₂ ≤ 10 | 70 | 147 |
| 10 < FILM THICKNESS OF SiO₂ ≤ 15 | 70 | 145 |
| 15 < FILM THICKNESS OF SiO₂ ≤ 20 | 70 | 138 |
| 20 < FILM THICKNESS OF SiO₂ ≤ 25 | 79 | 134 |
| 25 < FILM THICKNESS OF SiO₂ ≤ 30 | 93 | 117 |
| 30 < FILM THICKNESS OF SiO₂ ≤ 35 | — | — |

(The film thickness of Ni and the film thickness of SiO₂ in the table each indicate the value of the normalized film thickness × 10².)

TABLE 16

| 8 < FILM THICKNESS OF Ni ≤ 12 | RANGE OF EULER ANGLE TO SATISFY 0.2 ≥ K² | |
|---|---|---|
| | LOWER LIMIT OF EULER ANGLE θ | UPPER LIMIT OF EULER ANGLE θ |
| 0 ≤ FILM THICKNESS OF SiO₂ ≤ 5 | 70 | 157 |
| 5 < FILM THICKNESS OF SiO₂ ≤ 10 | 70 | 148 |
| 10 < FILM THICKNESS OF SiO₂ ≤ 15 | 70 | 145 |
| 15 < FILM THICKNESS OF SiO₂ ≤ 20 | 72 | 138 |
| 20 < FILM THICKNESS OF SiO₂ ≤ 25 | 79 | 134 |
| 25 < FILM THICKNESS OF SiO₂ ≤ 30 | 87 | 129 |
| 30 < FILM THICKNESS OF SiO₂ ≤ 35 | — | — |

(The film thickness of Ni and the film thickness of SiO₂ in the table each indicate the value of the normalized film thickness × 10².)

TABLE 17

| 12 < FILM THICKNESS OF Ni ≤ 16 | RANGE OF EULER ANGLE TO SATISFY 0.2 ≥ K² | |
|---|---|---|
| | LOWER LIMIT OF EULER ANGLE θ | UPPER LIMIT OF EULER ANGLE θ |
| 0 ≤ FILM THICKNESS OF SiO₂ ≤ 5 | 73 | 151 |
| 5 < FILM THICKNESS OF SiO₂ ≤ 10 | 72 | 151 |
| 10 < FILM THICKNESS OF SiO₂ ≤ 15 | 70 | 146 |
| 15 < FILM THICKNESS OF SiO₂ ≤ 20 | 72 | 140 |
| 20 < FILM THICKNESS OF SiO₂ ≤ 25 | 76 | 134 |
| 25 < FILM THICKNESS OF SiO₂ ≤ 30 | 81 | 131 |
| 30 < FILM THICKNESS OF SiO₂ ≤ 35 | 83 | 129 |

(The film thickness of Ni and the film thickness of SiO₂ in the table each indicate the value of the normalized film thickness × 10².)

FIGS. 28A and 28B to FIGS. 35A and 35B are views showing the relationship of the reflection coefficient with the Euler angle θ and the relationship of the electromechanical coupling coefficient $K^2$ therewith, respectively, each of which is obtained when Cr is used as the metal material and SiO₂ films having various normalized film thicknesses are provided.

Figure 28A:
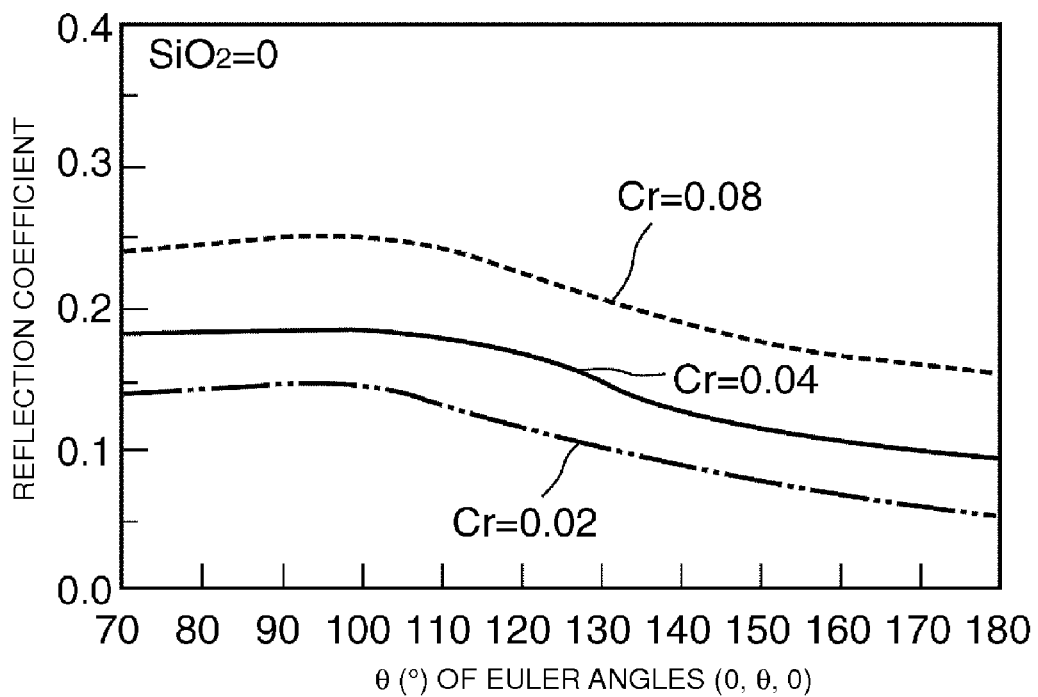
FIGS. 28A and 28B are views showing the relationship of the reflection coefficient with a normalized film thickness of a Cr film and the Euler angle θ and the relationship of the electromechanical coupling coefficient $K^2$ therewith, respectively, according to a preferred embodiment of the present invention, each of which is obtained when Cr is used as a metal material for an IDT and no $SiO_2$ film is provided.
Figure 28B:
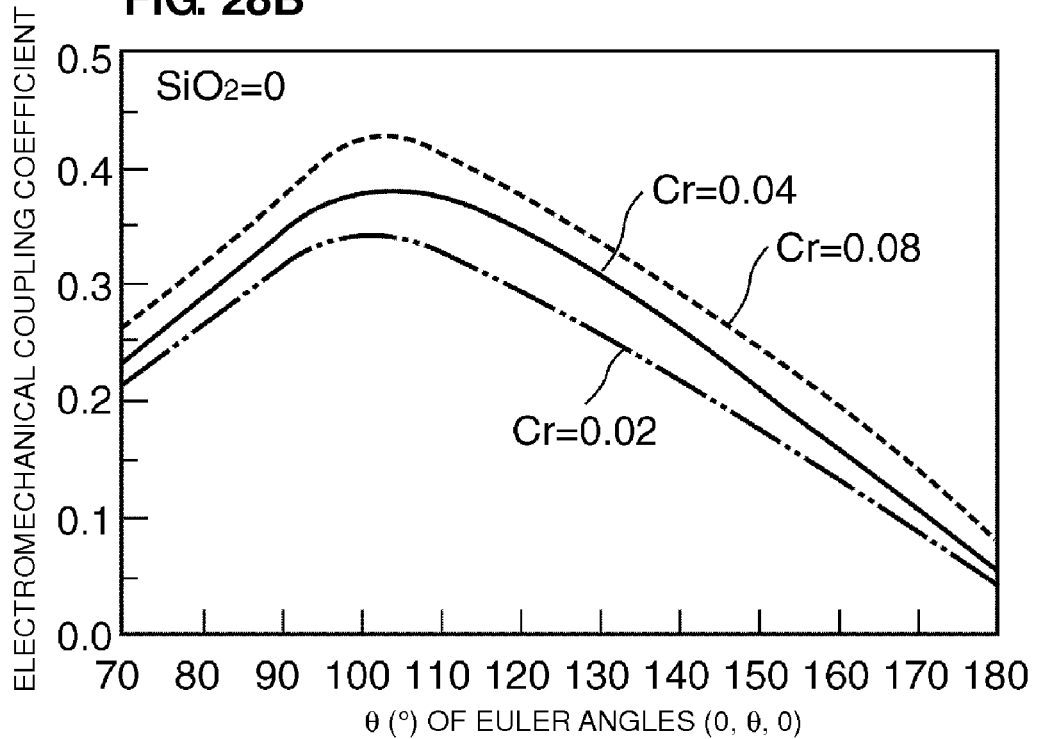
Figure 29A:
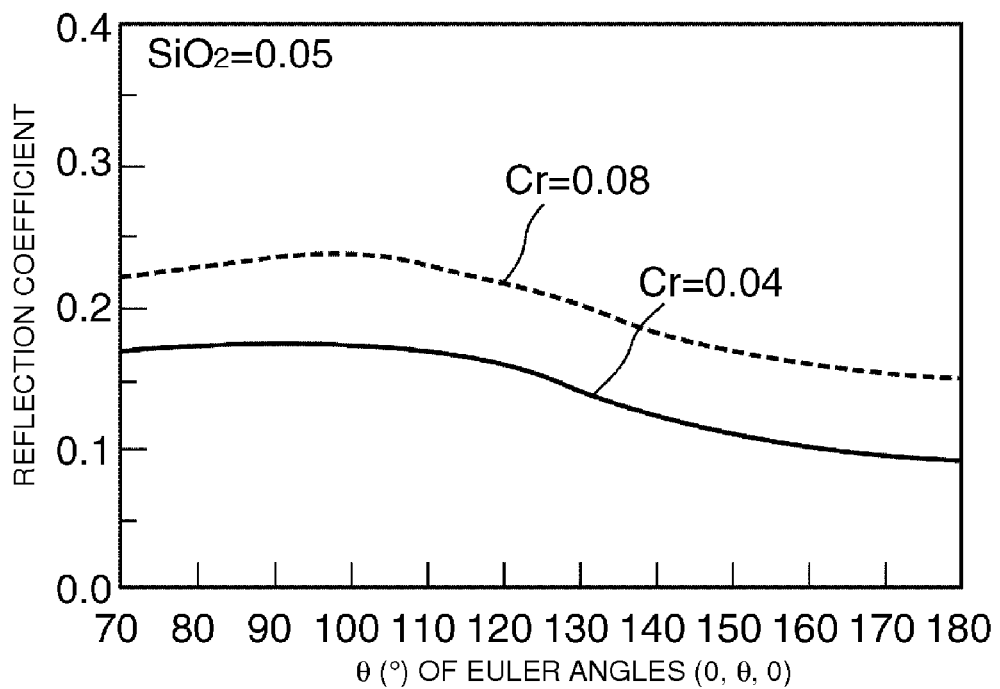
FIGS. 29A and 29B are views showing the relationship of the reflection coefficient with a normalized film thickness of a Cr film and the Euler angle θ and the relationship of the electromechanical coupling coefficient $K^2$ therewith, respectively, according to a preferred embodiment of the present invention, each of which is obtained when Cr is used as a metal material for an IDT and a normalized film thickness of an $SiO_2$ film is about 0.05.
Figure 29B:
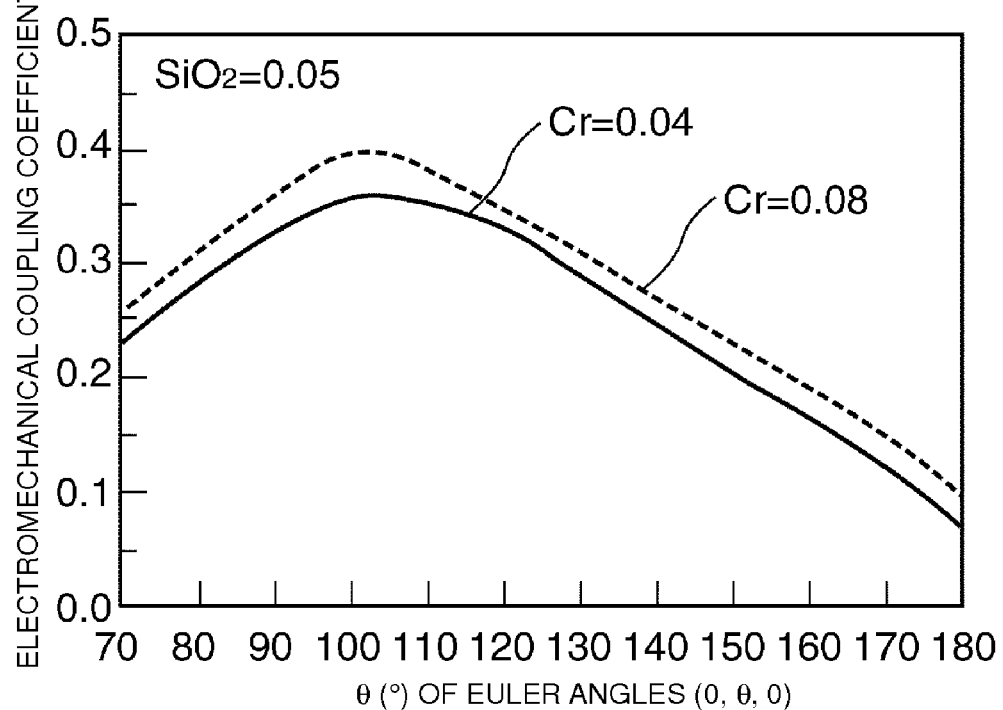
Figure 30A:
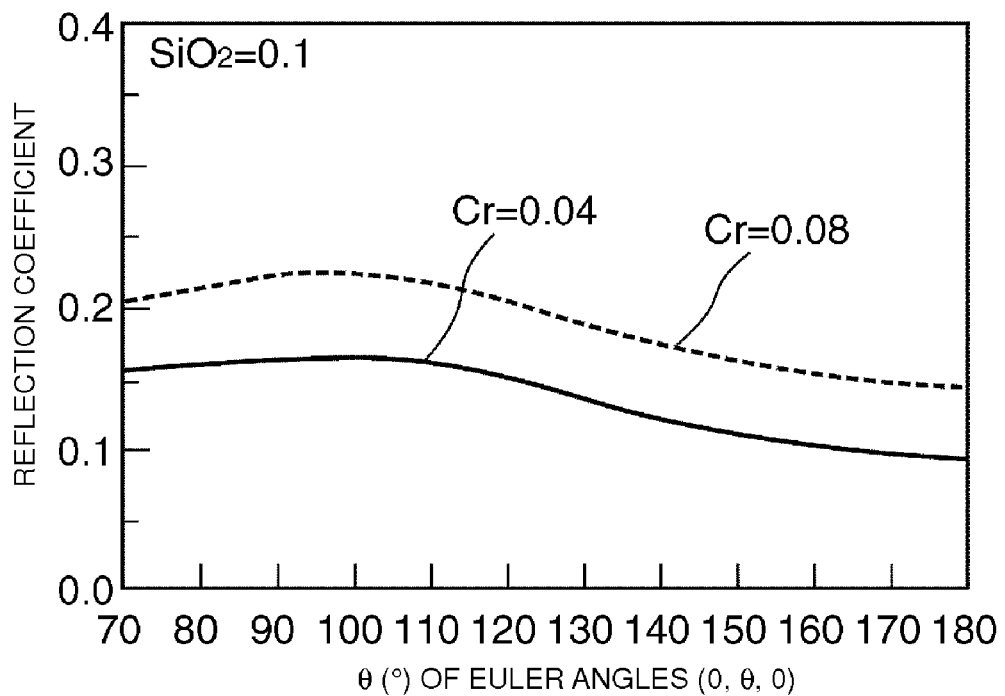
FIGS. 30A and 30B are views showing the relationship of the reflection coefficient with a normalized film thickness of a Cr film and the Euler angle θ and the relationship of the electromechanical coupling coefficient $K^2$ therewith, respectively, according to a preferred embodiment of the present invention, each of which is obtained when Cr is used as a metal material for an IDT and a normalized film thickness of an $SiO_2$ film is about 0.1.
Figure 30B:
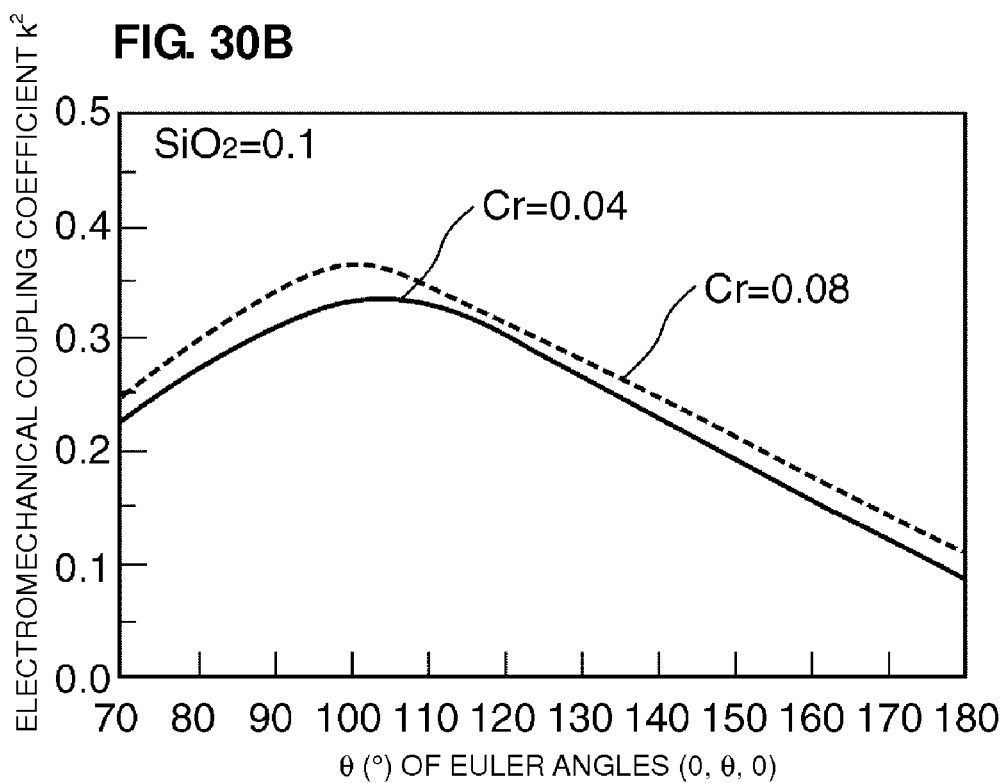
Figure 31A:
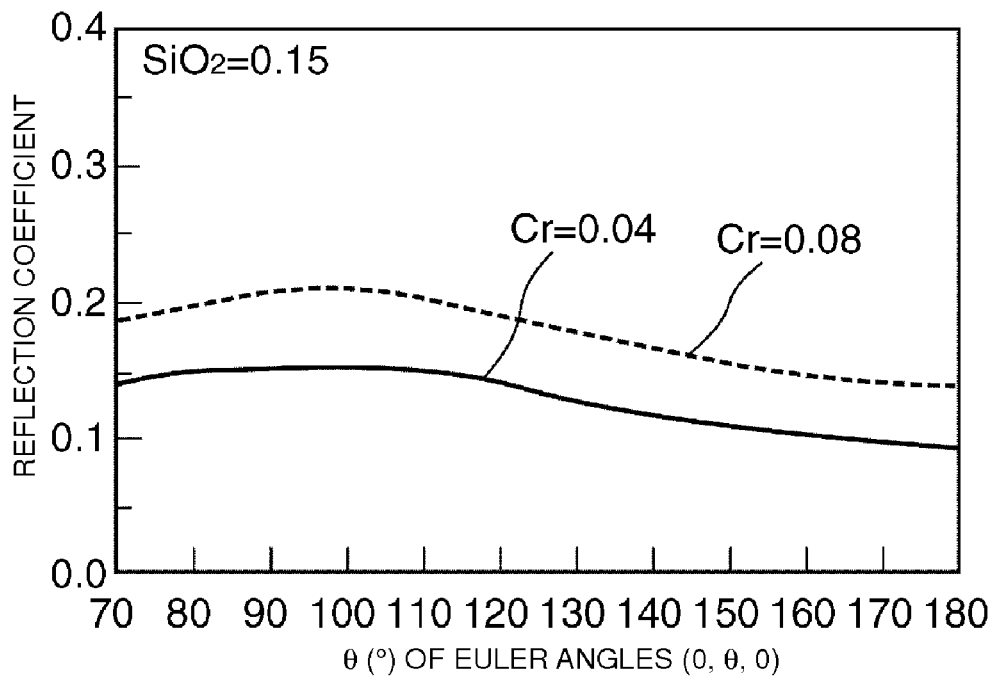
FIGS. 31A and 31B are views showing the relationship of the reflection coefficient with a normalized film thickness of a Cr film and the Euler angle θ and the relationship of the electromechanical coupling coefficient $K^2$ therewith, respectively, according to a preferred embodiment of the present invention, each of which is obtained when Cr is used as a metal material for an IDT and a normalized film thickness of an $SiO_2$ film is about 0.15.
Figure 31B:
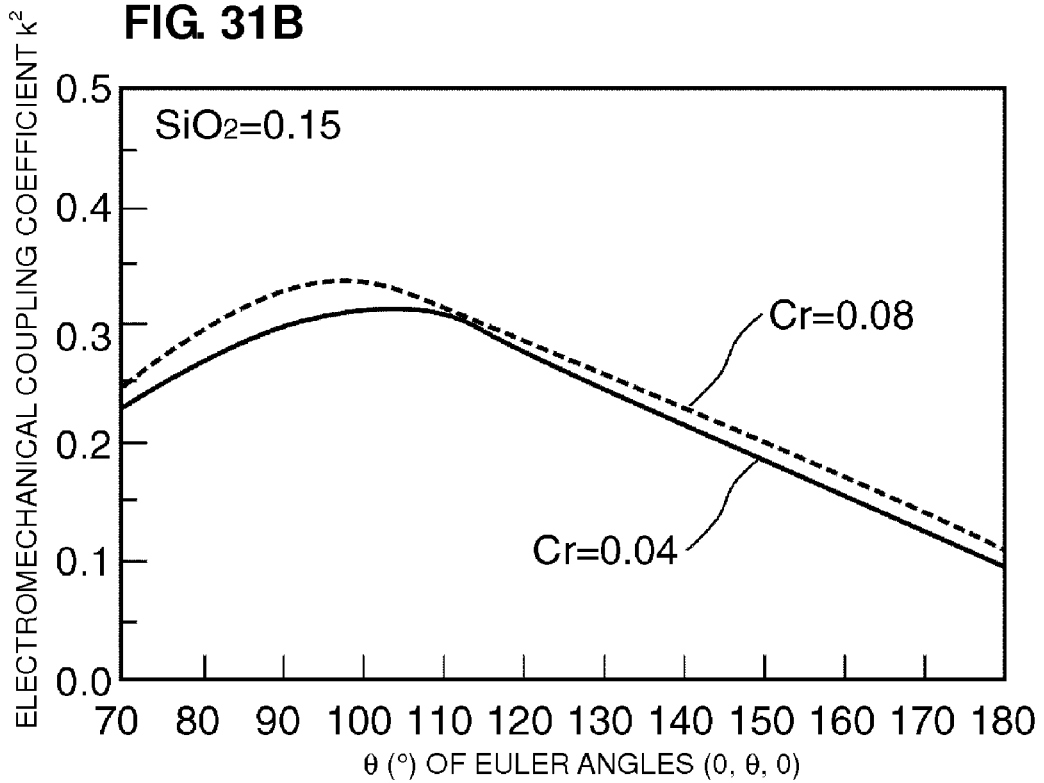
Figure 32A:
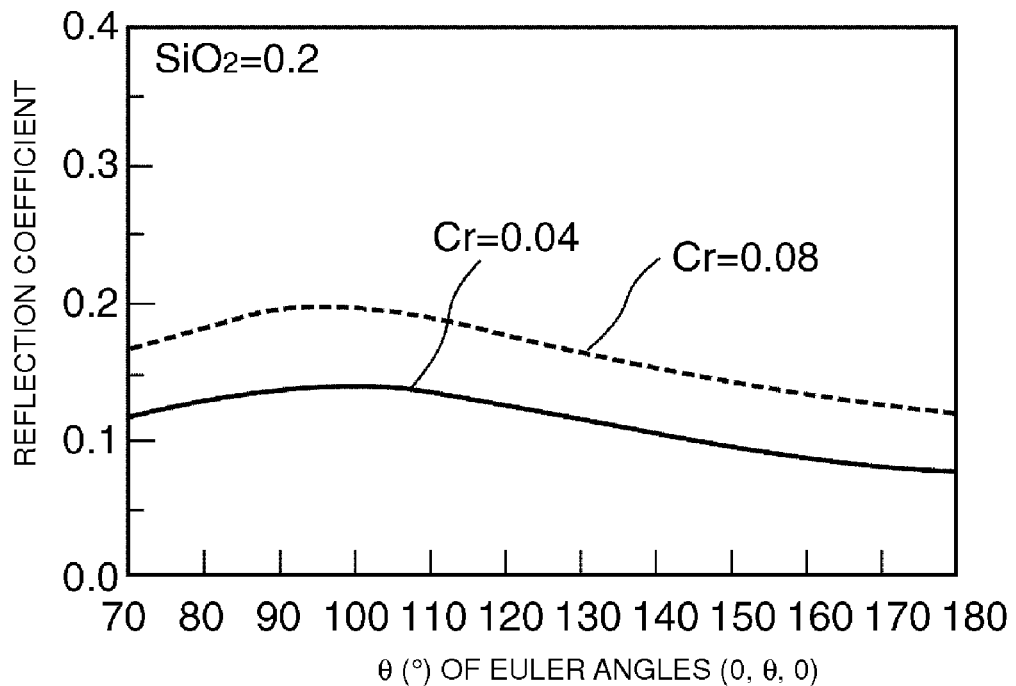
FIGS. 32A and 32B are views showing the relationship of the reflection coefficient with a normalized film thickness of a Cr film and the Euler angle θ and the relationship of the electromechanical coupling coefficient $K^2$ therewith, respectively, according to a preferred embodiment of the present invention, each of which is obtained when Cr is used as a metal material for an IDT and a normalized film thickness of an $SiO_2$ film is about 0.2.
Figure 32B:
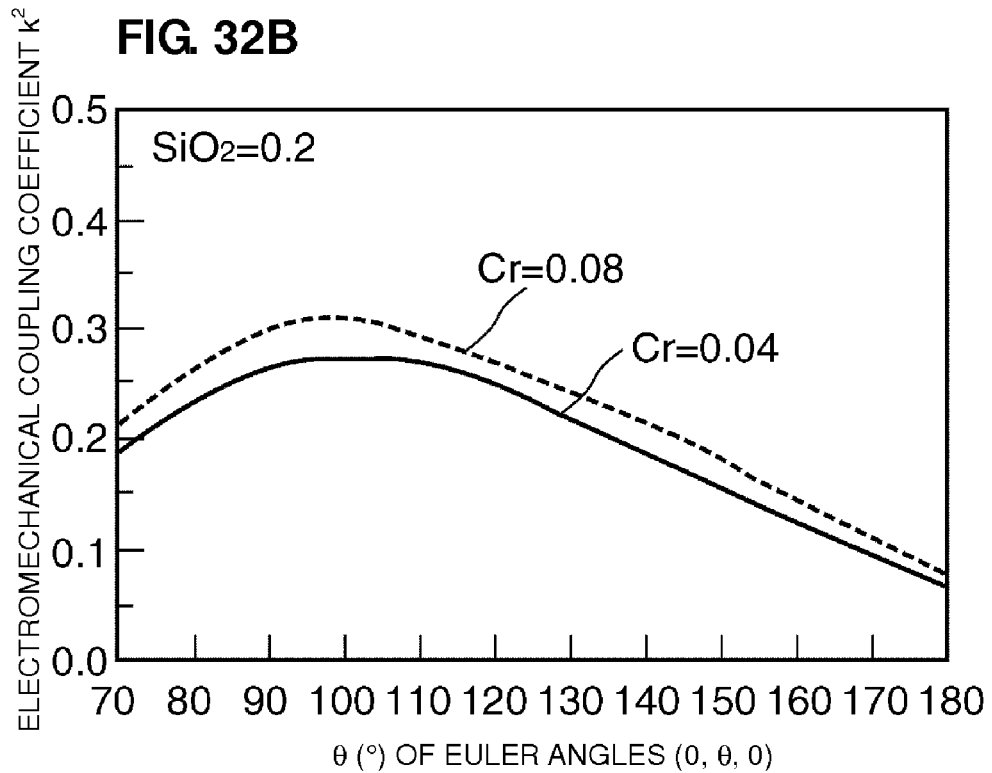
Figure 33A:
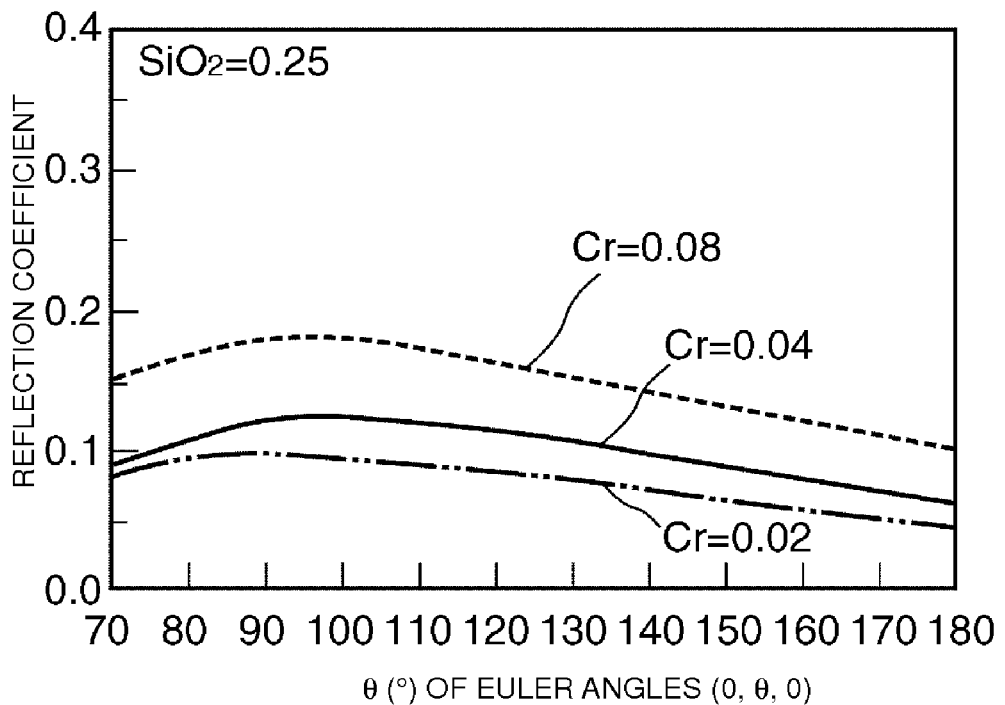
FIGS. 33A and 33B are views showing the relationship of the reflection coefficient with a normalized film thickness of a Cr film and the Euler angle θ and the relationship of the electromechanical coupling coefficient $K^2$ therewith, respectively, according to a preferred embodiment of the present invention, each of which is obtained when Cr is used as a metal material for an IDT and a normalized film thickness of an $SiO_2$ film is about 0.25.
Figure 33B:
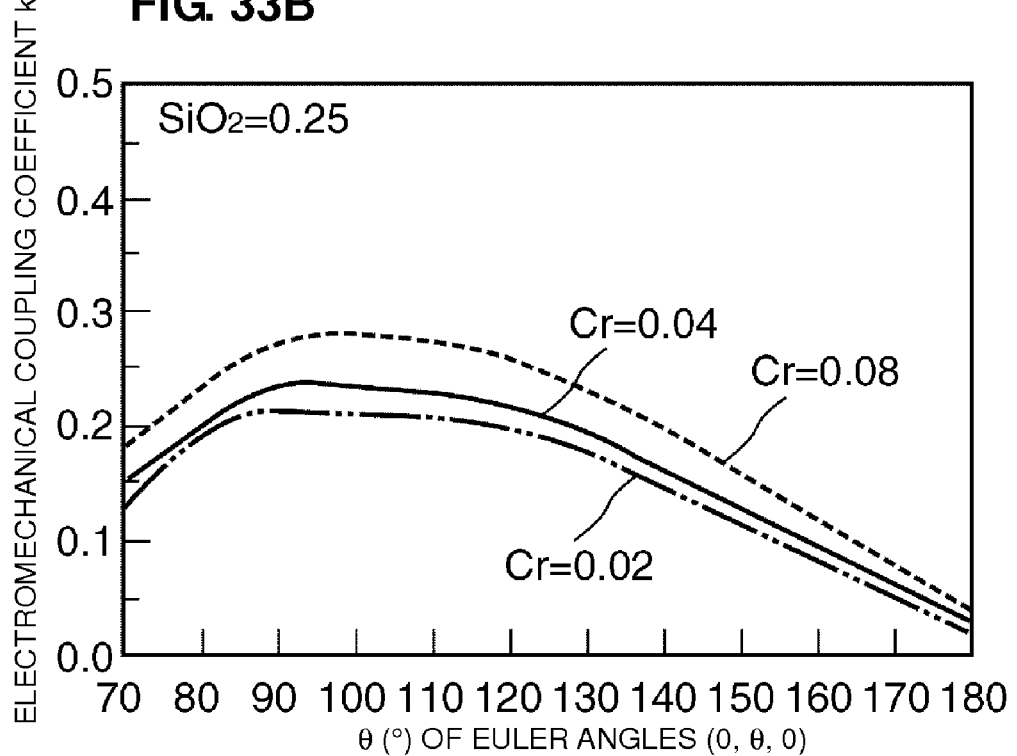
Figure 34A:
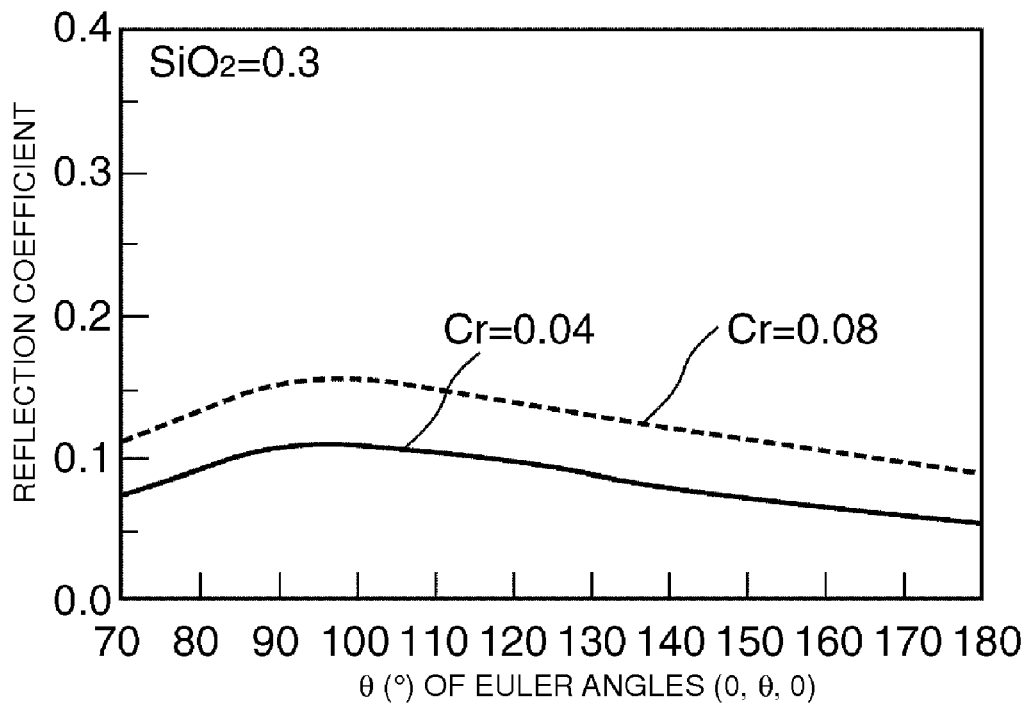
FIGS. 34A and 34B are views showing the relationship of the reflection coefficient with a normalized film thickness of a Cr film and the Euler angle θ and the relationship of the electromechanical coupling coefficient $K^2$ therewith, respectively, according to a preferred embodiment of the present invention, each of which is obtained when Cr is used as a metal material for an IDT and a normalized film thickness of an $SiO_2$ film is about 0.3.
Figure 34B:
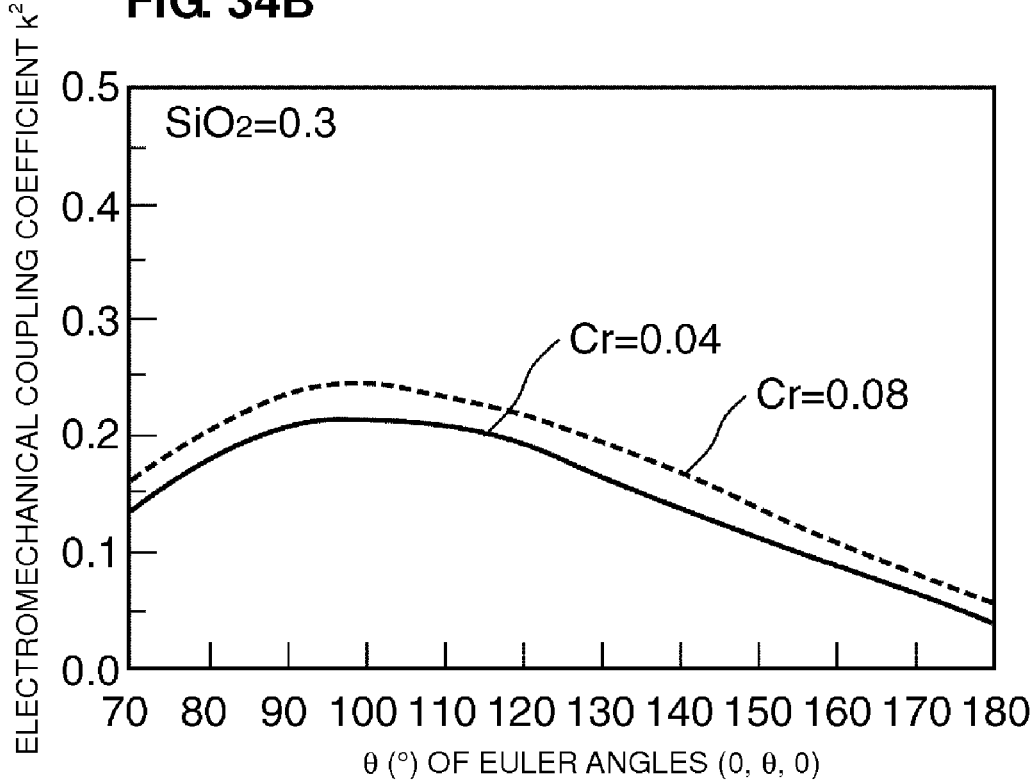
Figure 35A:
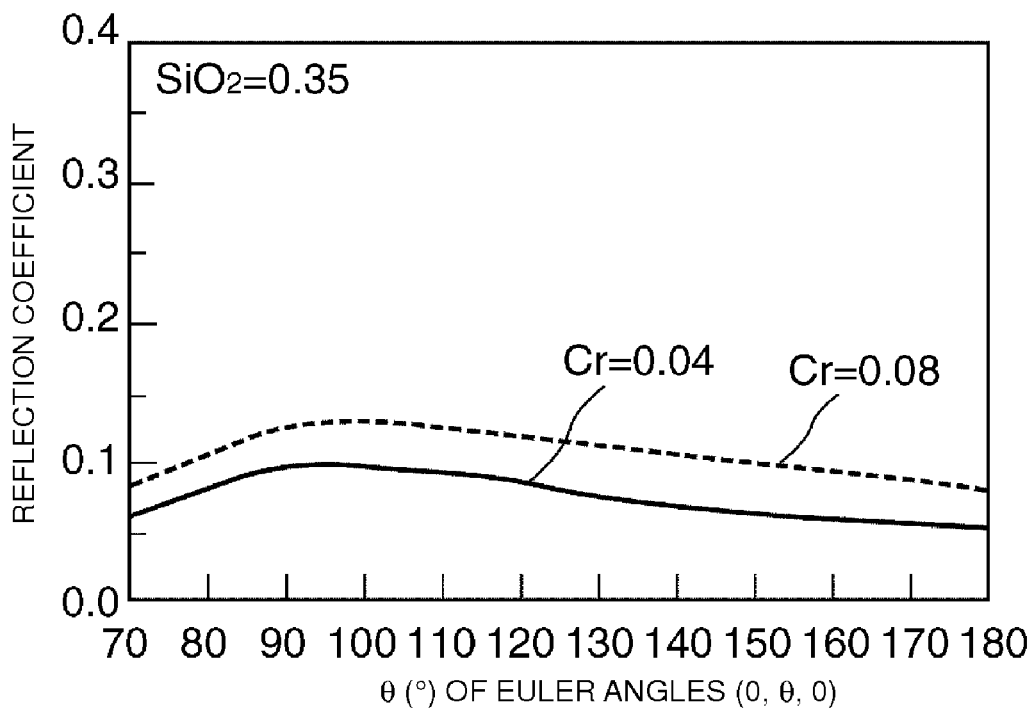
FIGS. 35A and 35B are views showing the relationship of the reflection coefficient with a normalized film thickness of a Cr film and the Euler angle θ and the relationship of the electromechanical coupling coefficient $K^2$ therewith, respectively, according to a preferred embodiment of the present invention, each of which is obtained when Cr is used as a metal material for an IDT and a normalized film thickness of an $SiO_2$ film is about 0.35.
Figure 35B:
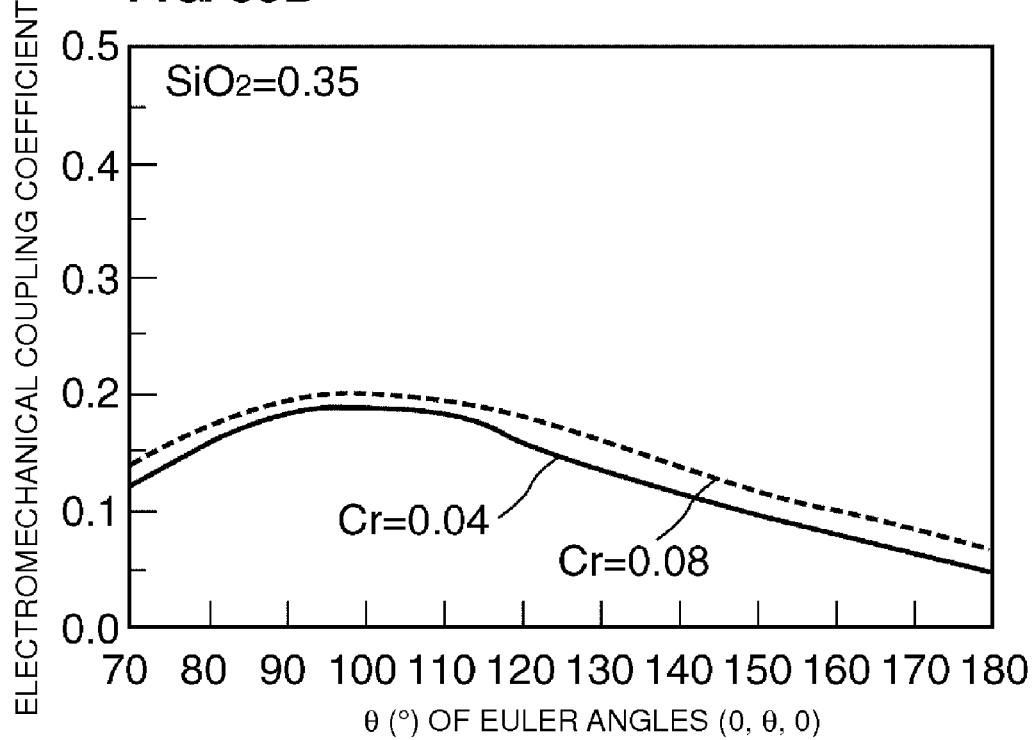
Figure 36:
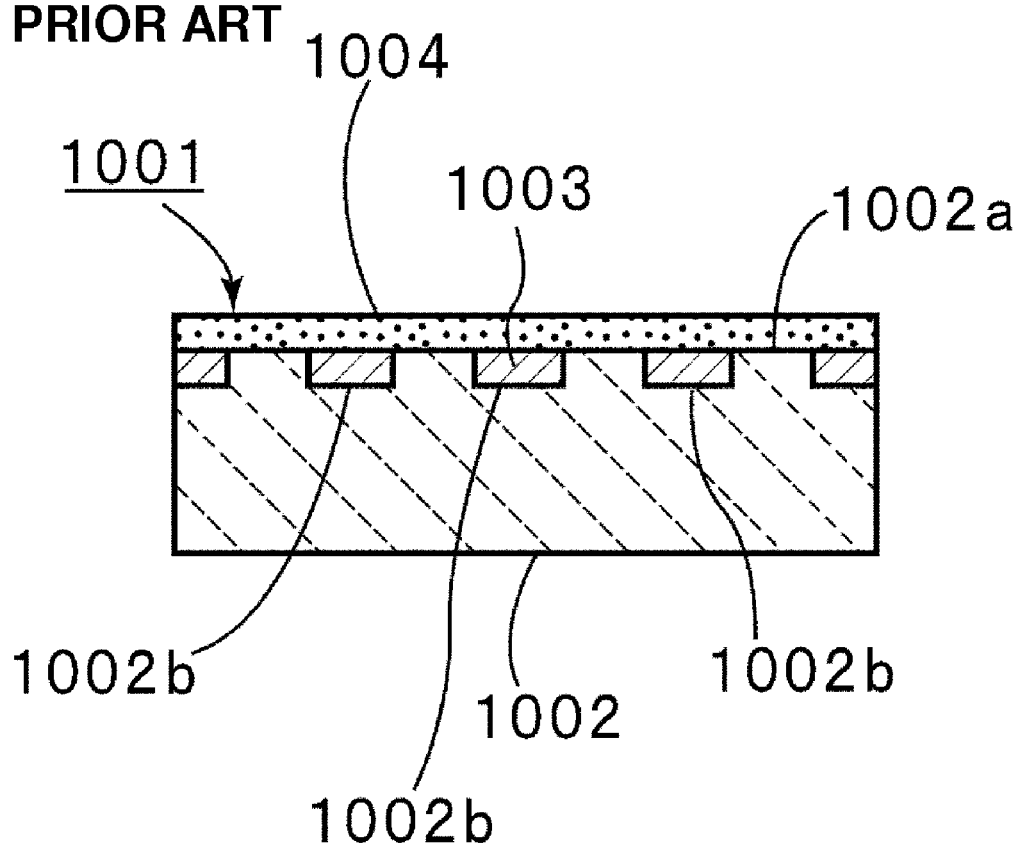
FIG. 36 is a schematic front cross-sectional view illustrating one example of a related surface acoustic wave device.
Figure 37:
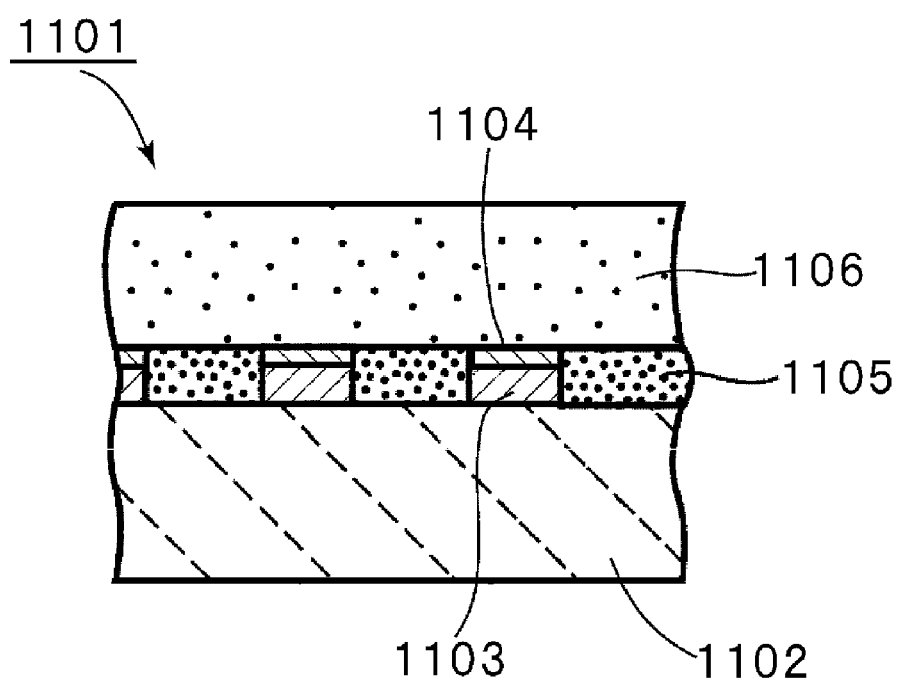
FIG. 37 is a partially cut-away front cross-sectional view illustrating another example of a related surface acoustic wave device.

In addition, FIGS. 28A and 28B show the results obtained when the normalized film thickness of the SiO₂ film is 0, that is, when no SiO₂ film is provided, and FIGS. 29A to 35B show the results obtained when the normalized film thickness of the SiO₂ film is about 0.05, about 0.1, about 0.15, about 0.2, about 0.25, about 0.3, or about 0.35, for example. In addition, the film of Cr used as the metal material for the IDT 3 and the reflectors 5 and 6 has various normalized film thicknesses as shown in FIGS. 28A to 35B. As shown in FIG. 6 described above, when Cr is used as the metal material, as compared to the case in which Al is used, a high reflection coefficient can be obtained regardless of the range of the Euler angle θ. In FIG. 28A to FIG. 35B, it was also discovered that even when the normalized film thickness of the Cr film is variously changed, a high reflection coefficient can be obtained regardless of the value of the Euler angle θ.

On the other hand, as shown in FIG. 28A to FIG. 35B, it was discovered that when the normalized film thickness of Cr is in the range of about 0.04 to about 0.08, if the range of the normalized film thickness of the $SiO_2$ film and the range of the Euler angle θ correspond to one of combinations shown in Table 18 below, the electromechanical coupling coefficient $K^2$ is about 0.2 or greater. In addition, in Table 18, the lower limit and the upper limit of the range of the Euler angle θ are shown. For example, FIG. 18 indicates that when the film thickness of the $SiO_2$ film is about 0.05 or less, the Euler angle θ may be set in the range of about 70° to about 150°.

In addition, when the film thickness of the Cr film is in the range of about 0.08 to about 0.12, the range of the film thickness of the $SiO_2$ film and the range of the Euler angle θ may correspond to one of combinations shown in Table 19 below, and when the normalized film thickness of the Cr film is in the range of about 0.12 to about 0.16, the range of the film thickness of the $SiO_2$ film and the range of the Euler angle θ may correspond to one of combinations shown in Table 20, so that the electromechanical coupling coefficient $K^2$ can be made 0.2 or more as in the case described above. Tables 18 to 20 are based on the results shown in FIGS. 28A to 35B described above.

TABLE 18

| | RANGE OF EULER ANGLE TO SATISFY $0.2 \geq K^2$ | |
|---|---|---|
| $4 \leq$ FILM THICKNESS OF Cr $\leq 8$ | LOWER LIMIT OF EULER ANGLE θ | UPPER LIMIT OF EULER ANGLE θ |
| $0 \leq$ FILM THICKNESS OF $SiO_2 \leq 5$ | 70 | 150 |
| $5 <$ FILM THICKNESS OF $SiO_2 \leq 10$ | 70 | 147 |
| $10 <$ FILM THICKNESS OF $SiO_2 \leq 15$ | 70 | 145 |
| $15 <$ FILM THICKNESS OF $SiO_2 \leq 20$ | 73 | 138 |
| $20 <$ FILM THICKNESS OF $SiO_2 \leq 25$ | 80 | 128 |
| $25 <$ FILM THICKNESS OF $SiO_2 \leq 30$ | 87 | 114 |
| $30 <$ FILM THICKNESS OF $SiO_2 \leq 35$ | — | — |

(The film thickness of Cr and the film thickness of $SiO_2$ in the table each indicate the value of the normalized film thickness × $10^2$.)

TABLE 19

| | RANGE OF EULER ANGLE TO SATISFY $0.2 \geq K^2$ | |
|---|---|---|
| $8 <$ FILM THICKNESS OF Cr $\leq 12$ | LOWER LIMIT OF EULER ANGLE θ | UPPER LIMIT OF EULER ANGLE θ |
| $0 \leq$ FILM THICKNESS OF $SiO_2 \leq 5$ | — | — |
| $5 <$ FILM THICKNESS OF $SiO_2 \leq 10$ | — | — |
| $10 <$ FILM THICKNESS OF $SiO_2 \leq 15$ | — | — |
| $15 <$ FILM THICKNESS OF $SiO_2 \leq 20$ | — | — |
| $20 <$ FILM THICKNESS OF $SiO_2 \leq 25$ | — | — |
| $25 <$ FILM THICKNESS OF $SiO_2 \leq 30$ | — | — |
| $30 <$ FILM THICKNESS OF $SiO_2 \leq 35$ | — | — |

(The film thickness of Cr and the film thickness of $SiO_2$ in the table each indicate the value of the normalized film thickness × $10^2$.)

TABLE 20

| | RANGE OF EULER ANGLE TO SATISFY $0.2 \geq K^2$ | |
|---|---|---|
| $12 <$ FILM THICKNESS OF Cr $\leq 16$ | LOWER LIMIT OF EULER ANGLE θ | UPPER LIMIT OF EULER ANGLE θ |
| $0 \leq$ FILM THICKNESS OF $SiO_2 \leq 5$ | — | — |
| $5 <$ FILM THICKNESS OF $SiO_2 \leq 10$ | — | — |
| $10 <$ FILM THICKNESS OF $SiO_2 \leq 15$ | — | — |
| $15 <$ FILM THICKNESS OF $SiO_2 \leq 20$ | — | — |
| $20 <$ FILM THICKNESS OF $SiO_2 \leq 25$ | — | — |
| $25 <$ FILM THICKNESS OF $SiO_2 \leq 30$ | — | — |
| $30 <$ FILM THICKNESS OF $SiO_2 \leq 35$ | — | — |

(The film thickness of Cr and the film thickness of $SiO_2$ in the table each indicate the value of the normalized film thickness × $10^2$.)

As described above, when the IDT electrode is formed, the metal material is filled in the grooves provided in the upper surface of the $LiNbO_3$ substrate. In this case, as the above metal material, instead of Ag, Ni, or Cr described above, an alloy primarily made of at least one of the above metals may also be used. As the alloy described above, for example, NiCr may be used. NiCr is an alloy primarily made of Ni or Cr.

In addition, in the experimental examples described above, although the $SiO_2$ film was provided, instead of the $SiO_2$ film, a dielectric film made of an inorganic material primarily including an $SiO_2$ film, for example, may also be used. Since each film has a positive temperature coefficient of frequency, when the dielectric films described above are used in combination with an $LiNbO_3$ substrate having a negative temperature coefficient of frequency, the absolute value of the temperature coefficient of frequency of the surface acoustic wave device can be decreased. That is, a surface acoustic wave device having superior temperature characteristics can be provided.

In addition, the electrode structure of the surface acoustic wave device according to preferred embodiments of the present invention is not limited to that shown in FIG. 1, and preferred embodiments of the present invention may be applied, for example, to surface acoustic wave resonators and surface acoustic wave filters which have various electrode structures.

In addition, according to preferred embodiments of the present invention, it has been shown that the Euler angles (φ, θ, ψ) of $LiNbO_3$ are not particularly limited. However, when a Rayleigh wave or an SH wave is utilized as a surface acoustic wave, the Euler angle φ is preferably in the range of about 0°±10°, the Euler angle θ is preferably in the range of about 70° to about 180°, and the Euler angle ψ is preferably in the range of about 0°±10°. That is, when the Euler angles are set in the range of (0°±10°, 70° to 180°, 0°±10°), the Rayleigh wave and the SH wave can preferably be utilized. More particularly, in the range of (0°±10°, 90° to 180°, 0°±10°), the SH wave can more preferably be utilized.

In addition, an LSAW wave may also be utilized, and in this case, the Euler angles may preferably be set in the range of (0°±10°, 110° to 160°, 0°±10°), for example. In addition, in the above-described preferred embodiments, although the electrode structure of a one-port type SAW resonator is preferably shown, the surface acoustic wave device according to various preferred embodiments of the present invention can be widely applied to other resonator structures or other resonator type surface acoustic wave filters.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave device comprising:
a piezoelectric substrate including a plurality of grooves provided in an upper surface thereof and which is made of an LiNbO$_3$ substrate; and
an IDT including a plurality of electrode fingers made of a metal material which is filled in the plurality of grooves in the upper surface of the piezoelectric substrate; wherein
the metal material is made of a metal selected from the group consisting of Ag, Ni, and Cr or an alloy primarily including at least one of Ag, Ni, and Cr; and
when a wavelength of a surface acoustic wave is represented by λ, an electrode thickness of the IDT and θ of Euler angles (0°±10°, θ, 0°±10°) of the LiNbO$_3$ substrate are one of combinations shown in Table 1:

TABLE 1

| ELECTRODE MATERIAL | ELECTRODE THICKNESS | EULER ANGLE θ |
|---|---|---|
| Ag | 0.02λ ≦ Ag ≦ 0.04λ | 70° ≦ θ ≦ 145° |
| Ag | 0.04λ < Ag ≦ 0.08λ | 70° ≦ θ ≦ 142° |
| Ni | 0.04λ ≦ Ni ≦ 0.08λ | 70° ≦ θ ≦ 153° |
| Cr | 0.02λ ≦ Cr ≦ 0.04λ | 70° ≦ θ ≦ 145° |
| Cr | 0.04λ < Cr ≦ 0.08λ | 70° ≦ θ ≦ 152° |

2. The surface acoustic wave device according to claim 1, further comprising a dielectric film which is made of SiO$_2$ or an inorganic material primarily including SiO$_2$ and which is arranged to cover the IDT and the piezoelectric substrate.

3. A surface acoustic wave device comprising:
a piezoelectric substrate including a plurality of grooves provided in an upper surface thereof and which is made of an LiNbO$_3$ substrate;
an IDT including a plurality of electrode fingers made of a metal material which is filled in the plurality of grooves in the upper surface of the piezoelectric substrate; and
a dielectric film which is made of SiO$_2$ or an inorganic material primarily including SiO$_2$ and which is arranged to cover the IDT and the piezoelectric substrate; wherein
the metal material is made of a metal selected from the group consisting of Ag, Ni, and Cr or an alloy primarily including at least one of Ag, Ni, and Cr; and
when a wavelength of a surface acoustic wave is represented by λ, a normalized film thickness of the IDT normalized by λ, a normalized film thickness of an SiO$_2$ film used as the dielectric film normalized by λ, and θ of Euler angles (0°±10°, θ, 0°±10°) of the LiNbO$_3$ substrate are one of combinations shown in Tables 2 to 10:

TABLE 2

| | RANGE OF EULER ANGLE TO SATISFY 0.2 ≧ K$^2$ | |
|---|---|---|
| 4 ≦ FILM THICKNESS OF Ag ≦ 8 | LOWER LIMIT OF EULER ANGLE θ | UPPER LIMIT OF EULER ANGLE θ |
| 0 ≦ FILM THICKNESS OF SiO$_2$ ≦ 5 | 72 | 139 |
| 5 < FILM THICKNESS OF SiO$_2$ ≦ 10 | 75 | 136 |
| 10 < FILM THICKNESS OF SiO$_2$ ≦ 15 | 78 | 128 |
| 15 < FILM THICKNESS OF SiO$_2$ ≦ 20 | 82 | 122 |

TABLE 2-continued

| | RANGE OF EULER ANGLE TO SATISFY 0.2 ≧ K$^2$ | |
|---|---|---|
| 4 ≦ FILM THICKNESS OF Ag ≦ 8 | LOWER LIMIT OF EULER ANGLE θ | UPPER LIMIT OF EULER ANGLE θ |
| 20 < FILM THICKNESS OF SiO$_2$ ≦ 25 | 91 | 115 |
| 25 < FILM THICKNESS OF SiO$_2$ ≦ 30 | 97 | 101 |
| 30 < FILM THICKNESS OF SiO$_2$ ≦ 35 | — | — |

(the film thickness of Ag and the film thickness of SiO$_2$ in the table each indicate the value of the normalized film thickness × 10$^2$)

TABLE 3

| | RANGE OF EULER ANGLE TO SATISFY 0.2 ≧ K$^2$ | |
|---|---|---|
| 8 < FILM THICKNESS OF Ag ≦ 12 | LOWER LIMIT OF EULER ANGLE θ | UPPER LIMIT OF EULER ANGLE θ |
| 0 ≦ FILM THICKNESS OF SiO$_2$ ≦ 5 | 72 | 139 |
| 5 < FILM THICKNESS OF SiO$_2$ ≦ 10 | 75 | 136 |
| 10 < FILM THICKNESS OF SiO$_2$ ≦ 15 | 78 | 126 |
| 15 < FILM THICKNESS OF SiO$_2$ ≦ 20 | 80 | 122 |
| 20 < FILM THICKNESS OF SiO$_2$ ≦ 25 | 81 | 122 |
| 25 < FILM THICKNESS OF SiO$_2$ ≦ 30 | 81 | 123 |
| 30 < FILM THICKNESS OF SiO$_2$ ≦ 35 | — | — |

(the film thickness of Ag and the film thickness of SiO$_2$ in the table each indicate the value of the normalized film thickness × 10$^2$)

TABLE 4

| | RANGE OF EULER ANGLE TO SATISFY 0.2 ≧ K$^2$ | |
|---|---|---|
| 12 < FILM THICKNESS OF Ag ≦ 16 | LOWER LIMIT OF EULER ANGLE θ | UPPER LIMIT OF EULER ANGLE θ |
| 0 ≦ FILM THICKNESS OF SiO$_2$ ≦ 5 | 70 | 140 |
| 5 < FILM THICKNESS OF SiO$_2$ ≦ 10 | 70 | 136 |
| 10 < FILM THICKNESS OF SiO$_2$ ≦ 15 | 70 | 126 |
| 15 < FILM THICKNESS OF SiO$_2$ ≦ 20 | 70 | 122 |
| 20 < FILM THICKNESS OF SiO$_2$ ≦ 25 | 73 | 122 |
| 25 < FILM THICKNESS OF SiO$_2$ ≦ 30 | 73 | 123 |
| 30 < FILM THICKNESS OF SiO$_2$ ≦ 35 | 73 | 122 |

(the film thickness of Ag and the film thickness of SiO$_2$ in the table each indicate the value of the normalized film thickness × 10$^2$)

TABLE 5

| | RANGE OF EULER ANGLE TO SATISFY 0.2 ≧ K$^2$ | |
|---|---|---|
| 4 ≦ FILM THICKNESS OF Ni ≦ 8 | LOWER LIMIT OF EULER ANGLE θ | UPPER LIMIT OF EULER ANGLE θ |
| 0 ≦ FILM THICKNESS OF SiO$_2$ ≦ 5 | 70 | 150 |
| 5 < FILM THICKNESS OF SiO$_2$ ≦ 10 | 70 | 147 |
| 10 < FILM THICKNESS OF SiO$_2$ ≦ 15 | 70 | 145 |
| 15 < FILM THICKNESS OF SiO$_2$ ≦ 20 | 70 | 138 |
| 20 < FILM THICKNESS OF SiO$_2$ ≦ 25 | 79 | 134 |
| 25 < FILM THICKNESS OF SiO$_2$ ≦ 30 | 93 | 117 |
| 30 < FILM THICKNESS OF SiO$_2$ ≦ 35 | — | — |

(the film thickness of Ni and the film thickness of SiO$_2$ in the table each indicate the value of the normalized film thickness × 10$^2$)

TABLE 6

| 8 < FILM THICKNESS OF Ni ≤ 12 | RANGE OF EULER ANGLE TO SATISFY $0.2 \geq K^2$ | |
|---|---|---|
| | LOWER LIMIT OF EULER ANGLE θ | UPPER LIMIT OF EULER ANGLE θ |
| 0 ≤ FILM THICKNESS OF $SiO_2$ ≤ 5 | 70 | 157 |
| 5 < FILM THICKNESS OF $SiO_2$ ≤ 10 | 70 | 148 |
| 10 < FILM THICKNESS OF $SiO_2$ ≤ 15 | 70 | 145 |
| 15 < FILM THICKNESS OF $SiO_2$ ≤ 20 | 72 | 138 |
| 20 < FILM THICKNESS OF $SiO_2$ ≤ 25 | 79 | 134 |
| 25 < FILM THICKNESS OF $SiO_2$ ≤ 30 | 87 | 129 |
| 30 < FILM THICKNESS OF $SiO_2$ ≤ 35 | — | — |

(the film thickness of Ni and the film thickness of $SiO_2$ in the table each indicate the value of the normalized film thickness × $10^2$)

TABLE 7

| 12 < FILM THICKNESS OF Ni ≤ 16 | RANGE OF EULER ANGLE TO SATISFY $0.2 \geq K^2$ | |
|---|---|---|
| | LOWER LIMIT OF EULER ANGLE θ | UPPER LIMIT OF EULER ANGLE θ |
| 0 ≤ FILM THICKNESS OF $SiO_2$ ≤ 5 | 73 | 151 |
| 5 < FILM THICKNESS OF $SiO_2$ ≤ 10 | 72 | 151 |
| 10 < FILM THICKNESS OF $SiO_2$ ≤ 15 | 70 | 146 |
| 15 < FILM THICKNESS OF $SiO_2$ ≤ 20 | 72 | 140 |
| 20 < FILM THICKNESS OF $SiO_2$ ≤ 25 | 76 | 134 |
| 25 < FILM THICKNESS OF $SiO_2$ ≤ 30 | 81 | 131 |
| 30 < FILM THICKNESS OF $SiO_2$ ≤ 35 | 83 | 129 |

(the film thickness of Ni and the film thickness of $SiO_2$ in the table each indicate the value of the normalized film thickness × $10^2$)

TABLE 8

| 4 ≤ FILM THICKNESS OF Cr ≤ 8 | RANGE OF EULER ANGLE TO SATISFY $0.2 \geq K^2$ | |
|---|---|---|
| | LOWER LIMIT OF EULER ANGLE θ | UPPER LIMIT OF EULER ANGLE θ |
| 0 ≤ FILM THICKNESS OF $SiO_2$ ≤ 5 | 70 | 150 |
| 5 < FILM THICKNESS OF $SiO_2$ ≤ 10 | 70 | 147 |
| 10 < FILM THICKNESS OF $SiO_2$ ≤ 15 | 70 | 145 |
| 15 < FILM THICKNESS OF $SiO_2$ ≤ 20 | 73 | 138 |
| 20 < FILM THICKNESS OF $SiO_2$ ≤ 25 | 80 | 128 |
| 25 < FILM THICKNESS OF $SiO_2$ ≤ 30 | 87 | 114 |
| 30 < FILM THICKNESS OF $SiO_2$ ≤ 35 | — | — |

(the film thickness of Cr and the film thickness of $SiO_2$ in the table each indicate the value of the normalized film thickness × $10^2$)

TABLE 9

| 8 < FILM THICKNESS OF Cr ≤ 12 | RANGE OF EULER ANGLE TO SATISFY $0.2 \geq K^2$ | |
|---|---|---|
| | LOWER LIMIT OF EULER ANGLE θ | UPPER LIMIT OF EULER ANGLE θ |
| 0 ≤ FILM THICKNESS OF $SiO_2$ ≤ 5 | — | — |
| 5 < FILM THICKNESS OF $SiO_2$ ≤ 10 | — | — |
| 10 < FILM THICKNESS OF $SiO_2$ ≤ 15 | — | — |
| 15 < FILM THICKNESS OF $SiO_2$ ≤ 20 | — | — |
| 20 < FILM THICKNESS OF $SiO_2$ ≤ 25 | — | — |
| 25 < FILM THICKNESS OF $SiO_2$ ≤ 30 | — | — |
| 30 < FILM THICKNESS OF $SiO_2$ ≤ 35 | — | — |

(the film thickness of Cr and the film thickness of $SiO_2$ in the table each indicate the value of the normalized film thickness × $10^2$)

TABLE 10

| 12 < FILM THICKNESS OF Cr ≤ 16 | RANGE OF EULER ANGLE TO SATISFY $0.2 \geq K^2$ | |
|---|---|---|
| | LOWER LIMIT OF EULER ANGLE θ | UPPER LIMIT OF EULER ANGLE θ |
| 0 ≤ FILM THICKNESS OF $SiO_2$ ≤ 5 | — | — |
| 5 < FILM THICKNESS OF $SiO_2$ ≤ 10 | — | — |
| 10 < FILM THICKNESS OF $SiO_2$ ≤ 15 | — | — |
| 15 < FILM THICKNESS OF $SiO_2$ ≤ 20 | — | — |
| 20 < FILM THICKNESS OF $SiO_2$ ≤ 25 | — | — |
| 25 < FILM THICKNESS OF $SiO_2$ ≤ 30 | — | — |
| 30 < FILM THICKNESS OF $SiO_2$ ≤ 35 | — | — |

(the film thickness of Cr and the film thickness of $SiO_2$ in the table each indicate the value of the normalized film thickness × $10^2$.)

* * * * *